US012812907B2

(12) United States Patent
Nam et al.

(10) Patent No.: US 12,812,907 B2
(45) Date of Patent: Nov. 24, 2026

(54) SEMICONDUCTOR DEVICE AND METHOD FOR FABRICATING THE SAME

(71) Applicant: SAMSUNG ELECTRONICS CO., LTD., Suwon-si (KR)

(72) Inventors: Seo Woo Nam, Suwon-si (KR); Heon Jong Shin, Suwon-si (KR); Jae Ran Jang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 254 days.

(21) Appl. No.: 18/584,688

(22) Filed: Feb. 22, 2024

(65) Prior Publication Data

US 2025/0056838 A1 Feb. 13, 2025

(30) Foreign Application Priority Data

Aug. 9, 2023 (KR) ........................ 10-2023-0104271

(51) Int. Cl.

| | |
|---|---|
| ***H01L 29/417*** | (2006.01) |
| ***H01L 23/522*** | (2006.01) |
| ***H01L 23/528*** | (2006.01) |
| ***H01L 29/06*** | (2006.01) |
| ***H01L 29/423*** | (2006.01) |
| ***H01L 29/775*** | (2006.01) |
| ***H01L 29/786*** | (2006.01) |
| ***H10D 30/43*** | (2025.01) |
| ***H10D 30/67*** | (2025.01) |

(Continued)

(52) U.S. Cl.

CPC ......... *H10D 30/6729* (2025.01); *H10D 30/43* (2025.01); *H10D 30/6735* (2025.01); *H10D 30/6757* (2025.01); *H10D 62/121* (2025.01); *H10W 20/42* (2026.01); *H10W 20/435* (2026.01)

(58) Field of Classification Search

CPC . H10W 20/23; H10W 20/427; H10W 20/435; H10W 20/481; H10D 30/6735; H10D 62/121; H10D 30/0198; H10D 30/501

See application file for complete search history.

(56) References Cited

U.S. PATENT DOCUMENTS 8,546,886 B2 10/2013 Chen et al.
11,222,892 B2 1/2022 Su et al.

(Continued)

*Primary Examiner* — John A Bodnar

(74) *Attorney, Agent, or Firm* — Fish & Richardson P.C.

(57) ABSTRACT

A semiconductor device comprises a back insulating pattern comprising a first region, and a second region and extending in a first direction, a plurality of sheet patterns disposed on the back insulating pattern, and extending in the first direction, a first source/drain pattern disposed on the first region of the back insulating pattern, and connected to the plurality of sheet patterns, a second source/drain pattern disposed on the second region of the back insulating pattern, and connected to the plurality of sheet patterns, a gate electrode extending in a second direction crossing the first direction, and surrounding the plurality of sheet patterns, a first back source/drain contact that extends into the first region of the back insulating pattern, and connected to the first source/drain pattern and a second back source/drain contact that extends into the second region of the back insulating pattern, and connected to the second source/drain pattern.

20 Claims, 39 Drawing Sheets

(51) Int. Cl.

| | |
|---|---|
| ***H10D 62/10*** | (2025.01) |
| ***H10W 20/41*** | (2026.01) |
| ***H10W 20/42*** | (2026.01) |

(56) References Cited

U.S. PATENT DOCUMENTS

| | | | | |
|---|---|---|---|---|
| 11,289,606 | B2 | 3/2022 | Ju et al. | |
| 11,342,413 | B2 | 5/2022 | Huang et al. | |
| 2021/0305381 | A1* | 9/2021 | Chiang ................ | H10D 30/014 |
| 2022/0384570 | A1 | 12/2022 | Liu et al. | |
| 2022/0384602 | A1 | 12/2022 | Su et al. | |

* cited by examiner

SEMICONDUCTOR DEVICE AND METHOD FOR FABRICATING THE SAME

CROSS-REFERENCE TO RELATED APPLICATION

This application claims priority from Korean Patent Application No. 10-2023-0104271, filed in the Korean Intellectual Property Office on Aug. 9, 2023, the disclosure of which is incorporated herein by reference in its entirety.

BACKGROUND

Scaling techniques for increasing the density of semiconductor devices have included a multi-gate transistor, in which a fin-shaped or nanowire-shaped multi-channel active pattern (or silicon body) is formed on a substrate and a gate is formed on the surface of the multi-channel active pattern. Since the multi-gate transistor uses a three-dimensional (3D) channel, scaling of the multi-gate transistor can be achieved. Additionally, current control capability can be improved without increasing the gate length of the multi-gate transistor. Furthermore, a short channel effect (SCE) in which the potential of a channel region is affected by a drain voltage can be effectively suppressed. However, as a pitch (size) of the semiconductor device decreases, there is a need to decrease capacitance and secure electrical stability between contacts in the semiconductor device.

SUMMARY

In general, in some aspects, the present disclosure is directed toward a semiconductor device having improved product reliability.

According to some aspects of the present disclosure, a semiconductor device includes a back insulating pattern comprising a first region, and a second region and extending in a first direction, a plurality of sheet patterns disposed on the back insulating pattern, and extending in the first direction, a first source/drain pattern disposed on the first region of the back insulating pattern, and connected to the plurality of sheet patterns, a second source/drain pattern disposed on the second region of the back insulating pattern, and connected to the plurality of sheet patterns, a gate electrode extending in a second direction crossing the first direction, and surrounding the plurality of sheet patterns, a first back source/drain contact penetrating (extending into) the first region of the back insulating pattern, and connected to the first source/drain pattern and a second back source/drain contact penetrating (extending into) the second region of the back insulating pattern, and connected to the second source/drain pattern, wherein the first source/drain pattern has N-type conductivity, the second source/drain pattern has P-type conductivity, the first region of the back insulating pattern contains oxide having a tensile stress higher than that of the second region, and the second region of the back insulating pattern contains oxide having a compressive stress higher than that of the first region.

According to some aspects of the present disclosure, a semiconductor device includes a first back insulating pattern extending in a first direction, a second back insulating pattern spaced apart from the first back insulating pattern in a second direction crossing the first direction, and extending in the first direction, a plurality of sheet patterns disposed on the first back insulating pattern and the second back insulating pattern, and extending in the first direction, a first source/drain pattern disposed on the first back insulating pattern, and connected to the plurality of sheet patterns, a second source/drain pattern disposed on the second back insulating pattern, and connected to the plurality of sheet patterns, a first front source/drain contact disposed on the first source/drain pattern, and connected to the first source/drain pattern, a second front source/drain contact disposed on the second source/drain pattern, and connected to the second source/drain pattern, a first back interlayer insulating layer disposed under the first back insulating pattern and the second back insulating pattern, a first buried conductive pattern penetrating the first back interlayer insulating layer, and connected to the first front source/drain contact, a second buried conductive pattern penetrating the first back interlayer insulating layer, and connected to the second front source/drain contact, a first contact connection via disposed between the first front source/drain contact and the first buried conductive pattern, and directly connected to the first front source/drain contact and a second contact connection via disposed between the second front source/drain contact and the second buried conductive pattern, and directly connected to the second front source/drain contact, wherein the first source/drain pattern has N-type conductivity, the second source/drain pattern has P-type conductivity, the first back insulating pattern contains nitride having a tensile stress higher than that of the second back insulating pattern, and the second back insulating pattern contains nitride having a compressive stress higher than that of the first back insulating pattern.

According to some aspects of the present disclosure, a semiconductor device includes a first back insulating pattern extending in a first direction, a plurality of sheet patterns disposed on the first back insulating pattern, and extending in the first direction, a first source/drain pattern disposed on the first back insulating pattern, and connected to the plurality of sheet patterns, a second back insulating pattern extending in the first direction, and spaced apart from the first back insulating pattern, a plurality of second sheet patterns disposed on the second back insulating pattern, and extending in the first direction, a second source/drain pattern disposed on the second back insulating pattern, and connected to the plurality of second sheet patterns, a plurality of gate electrodes extending in a second direction crossing the first direction, and surrounding the plurality of first sheet patterns and the plurality of second sheet patterns, a first power transmission pattern disposed under the first source/drain pattern, electrically connected to the first source/drain pattern, and increasing in width toward its bottom and a second power transmission pattern disposed under the second source/drain pattern, electrically connected to the second source/drain pattern, and increasing in width toward its bottom, wherein the first source/drain pattern has N-type conductivity, the second source/drain pattern has P-type conductivity, the first back insulating pattern and the second back insulating pattern contain any one of silicon oxide and silicon nitride, the first back insulating pattern contains oxide having a tensile stress higher than that of the second back insulating pattern, and the second back insulating pattern contains oxide having a compressive stress higher than that of the first back insulating pattern.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

Exemplary implementations will be more clearly understood from the following detailed description, taken in conjunction with the accompanying drawings.

DETAILED DESCRIPTION OF THE EMBODIMENTS

Figure 1:
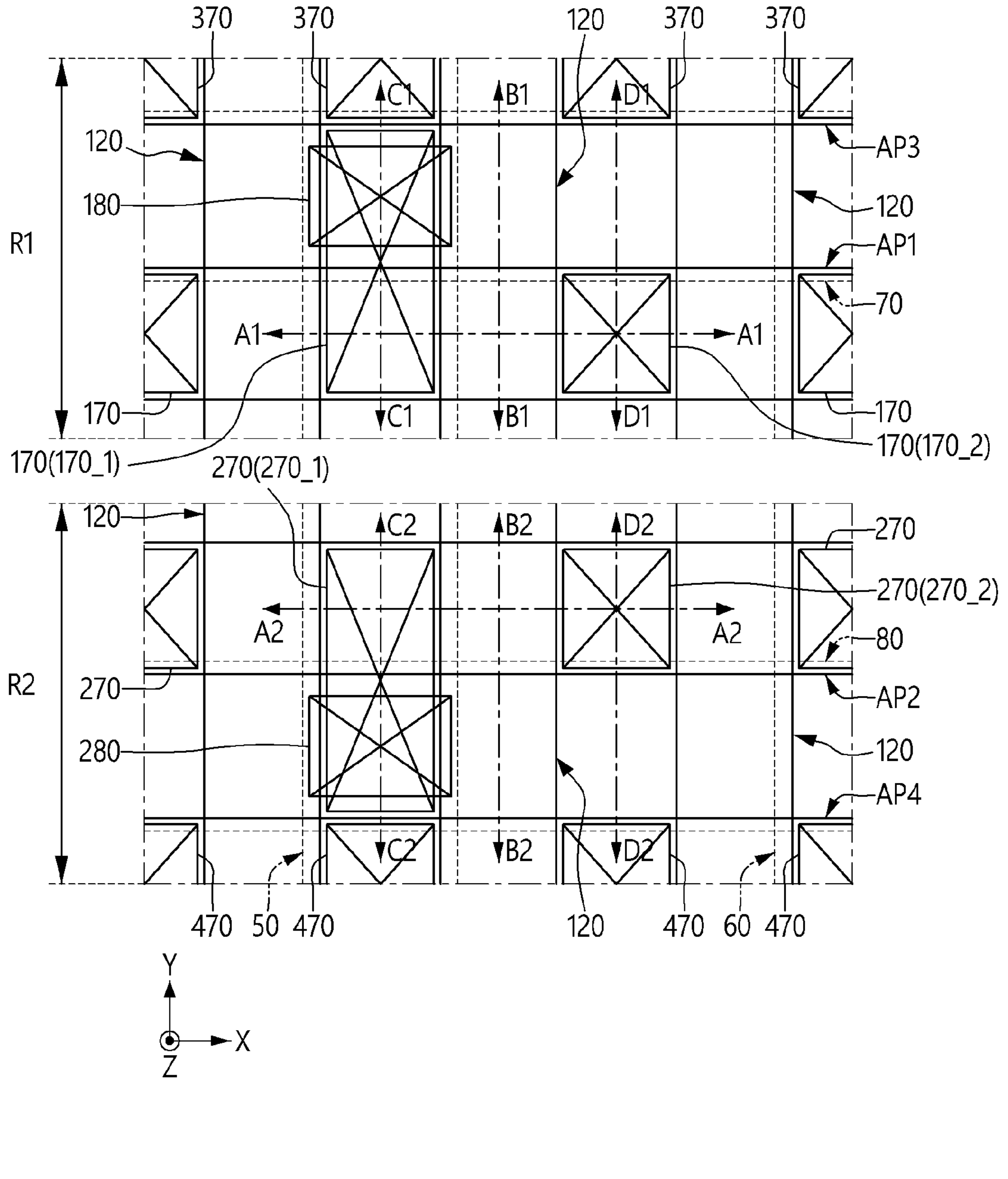
FIG. 1 is a layout diagram illustrating an exemplary semiconductor device according to some implementations.

Hereinafter, exemplary implementations will be described in detail with reference to the accompanying drawings.

Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the present disclosure.

In some implementations depicted in the drawings, a fin-shaped transistor (FinFET) including a channel region of a fin-shaped pattern, a transistor including a nanowire or a nanosheet, or a multi-bridge channel field effect transistor (MBCFET™) is illustrated, but is not limited thereto. In some implementations, the semiconductor device may include a tunneling transistor (tunneling FET), a three-dimensional (3D) transistor, or a vertical transistor (vertical FET). In some implementations, the semiconductor device may include a planar transistor. In some implementations, the transistors may be based on two-dimensional materials (2D material based FETs) and heterostructures thereof. In some implementations, the semiconductor device may include a bipolar junction transistor, a lateral double diffusion MOS (LDMOS) transistor, or the like.

Figure 2:
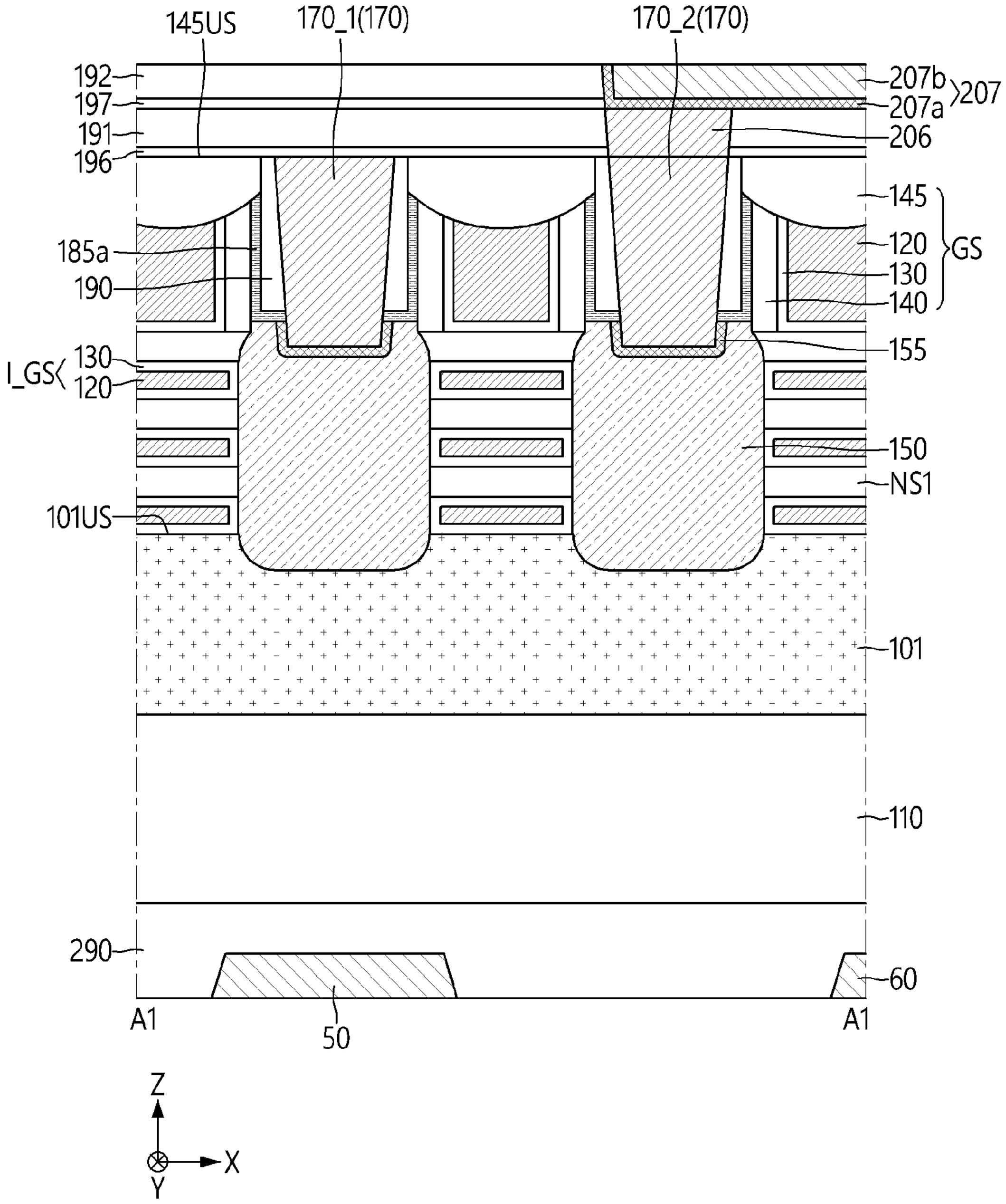
FIGS. 2 and 3 are cross-sectional views taken along lines A1-A1 and A2-A2 of FIG. 1, respectively, according to some implementations.
Figure 3:
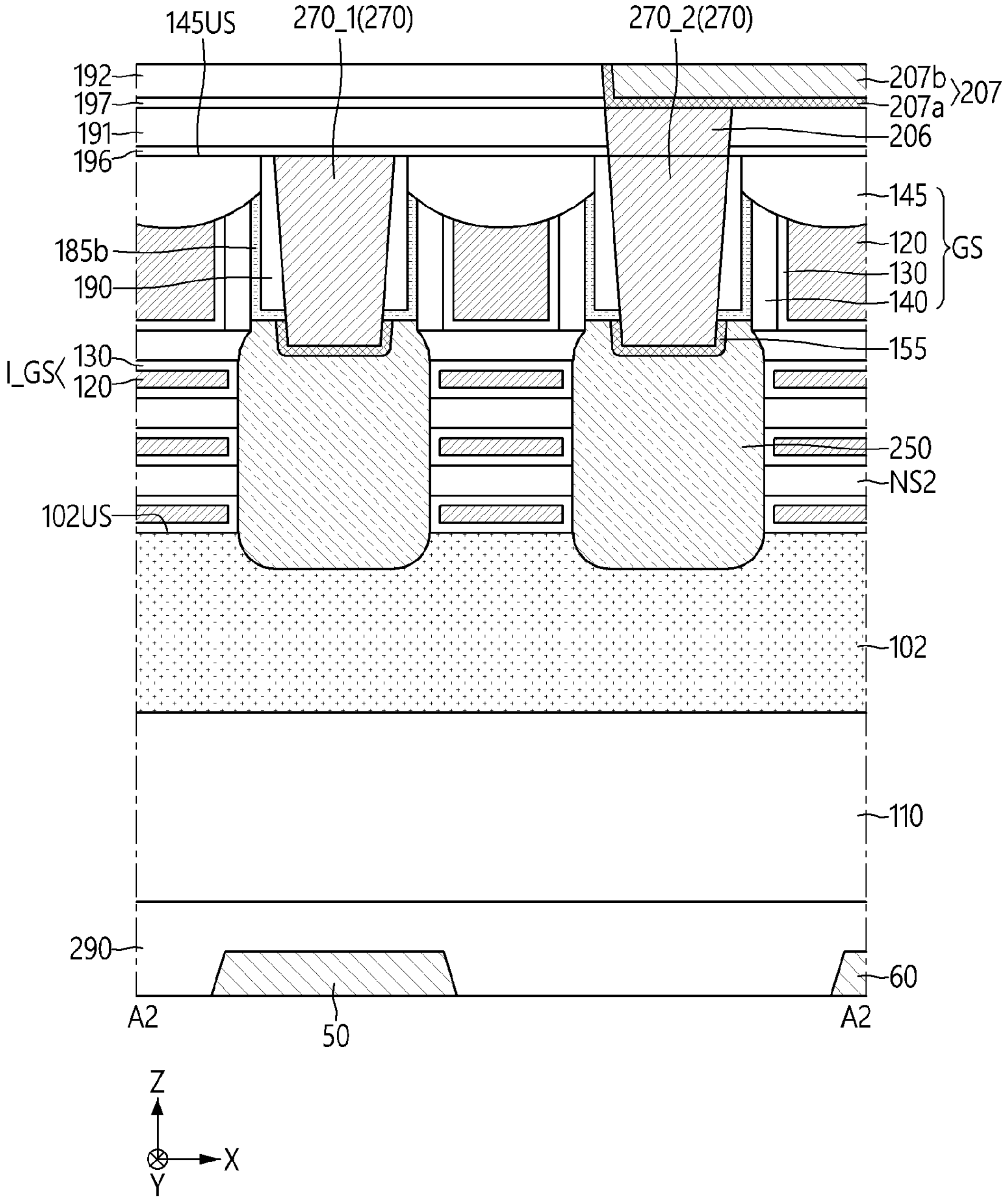
Figure 4:
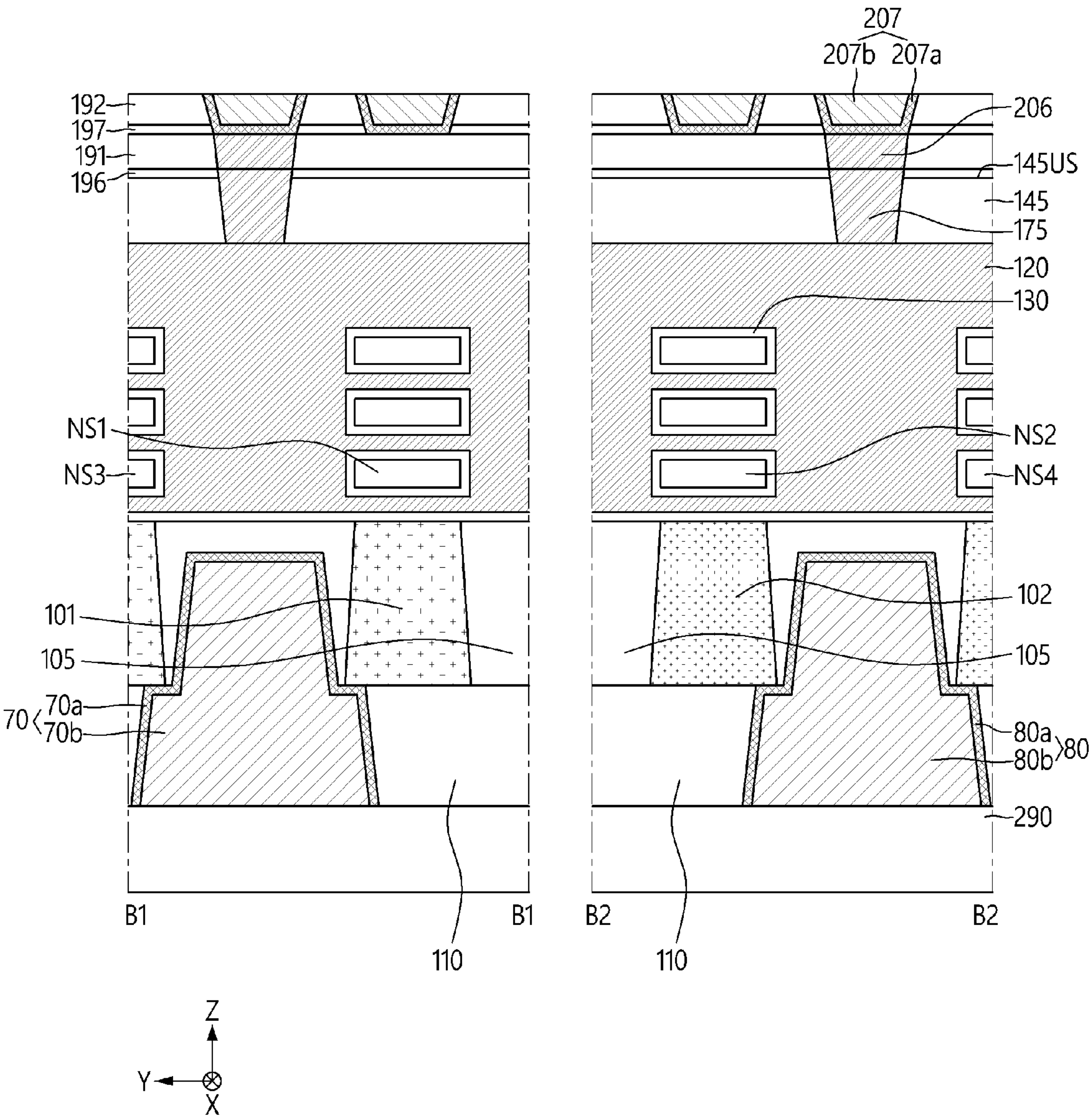
FIG. 4 is a cross-sectional view taken along lines B1-B1 and B2-B2 of FIG. 1, according to some implementations.
Figure 5:
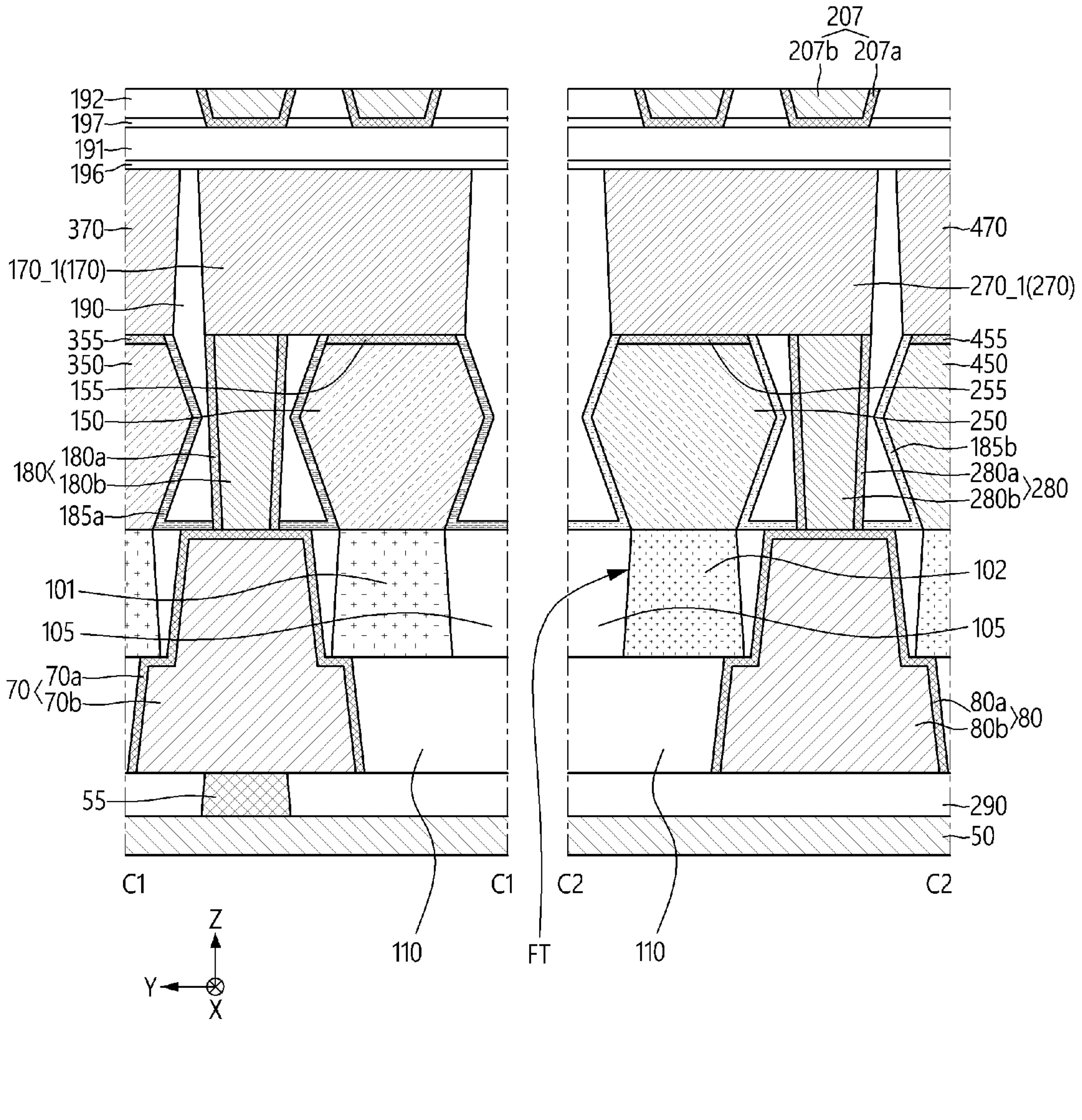
FIG. 5 is a cross-sectional view taken along lines C1-C1 and C2-C2 of FIG. 1, according to some implementations.
Figure 6:
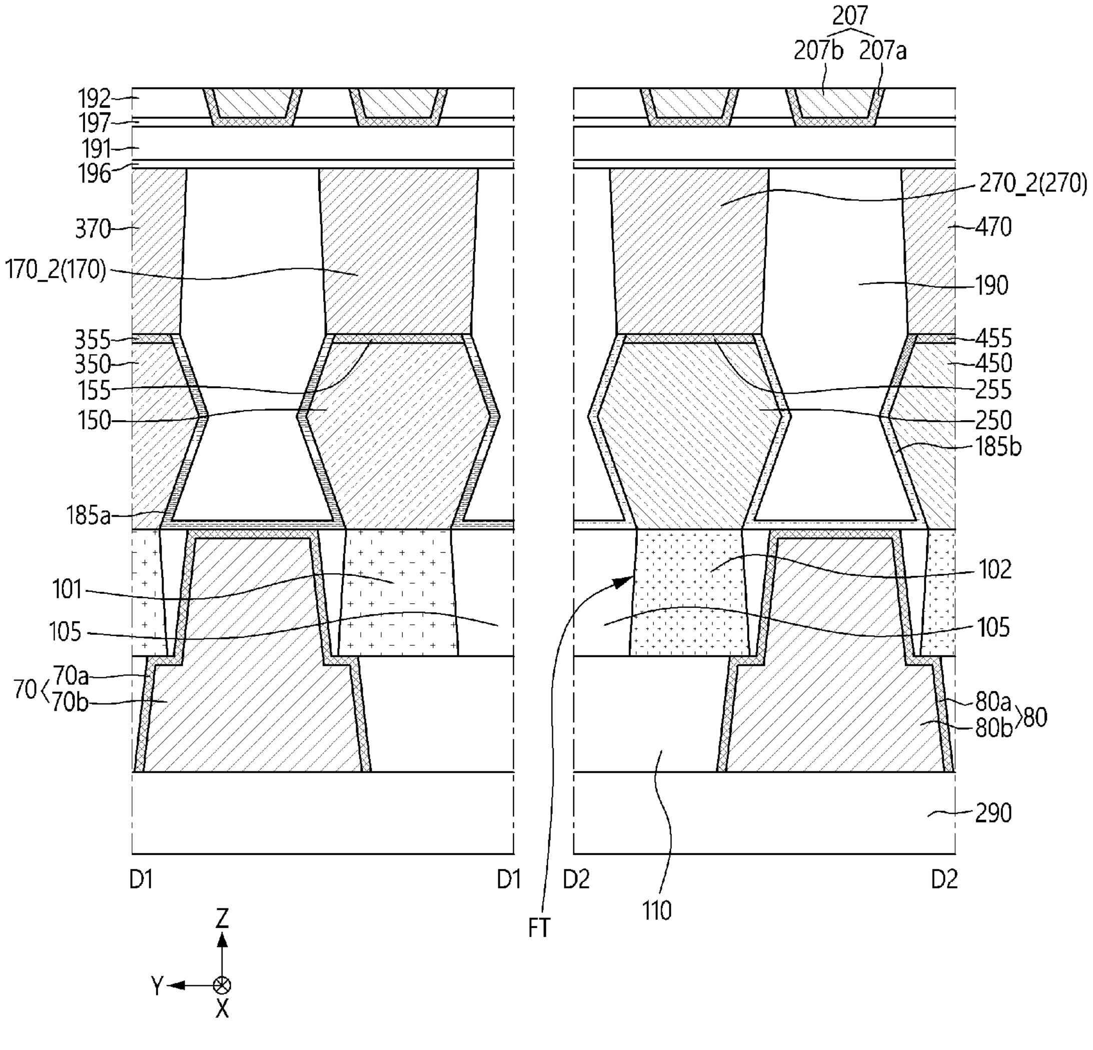
FIG. 6 is a cross-sectional view taken along lines D1-D1 and D2-D2 of FIG. 1, according to some implementations.
Figure 7:
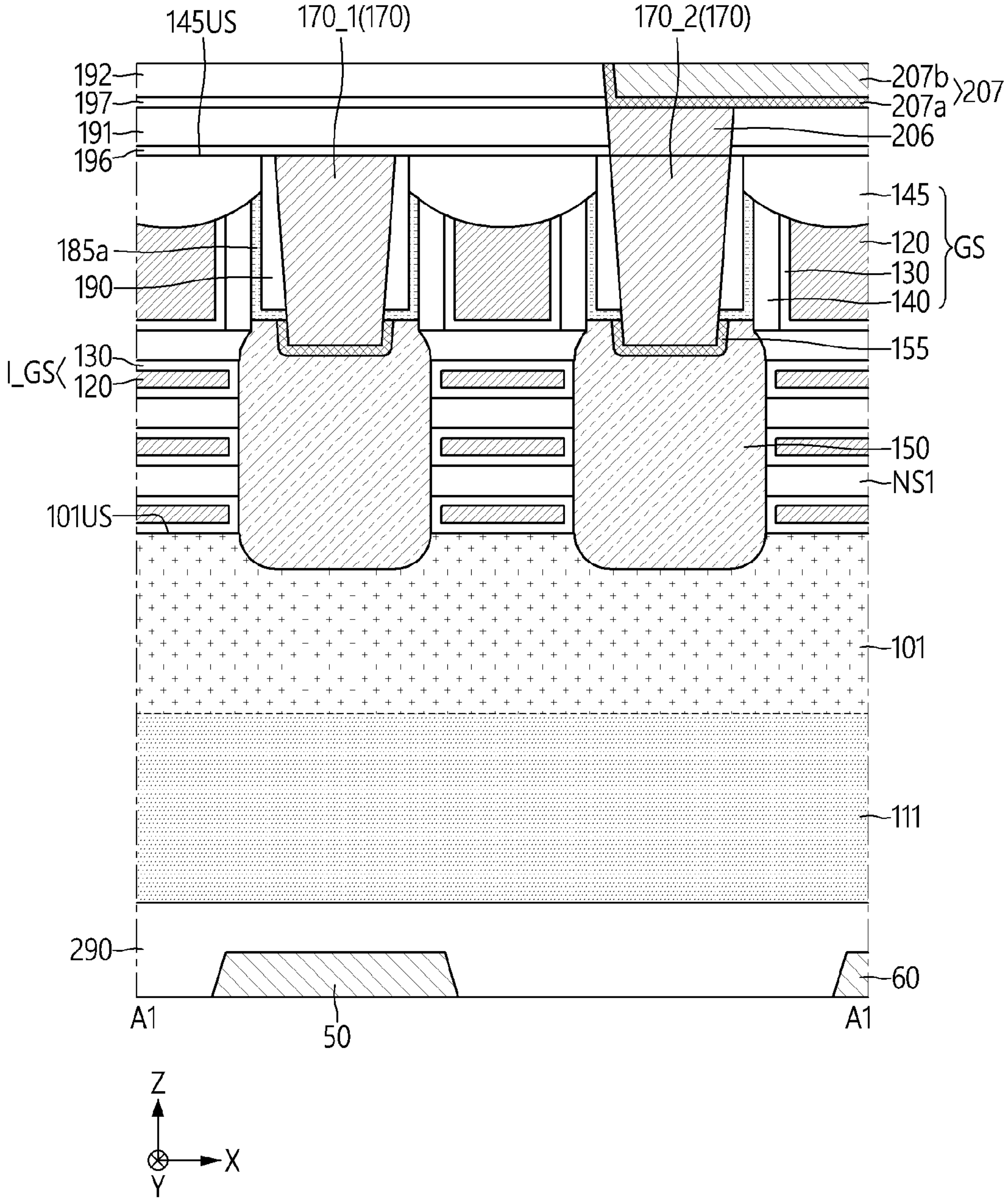
FIGS. 7 to 11 are diagrams illustrating an exemplary semiconductor device according to some implementations.
Figure 8:
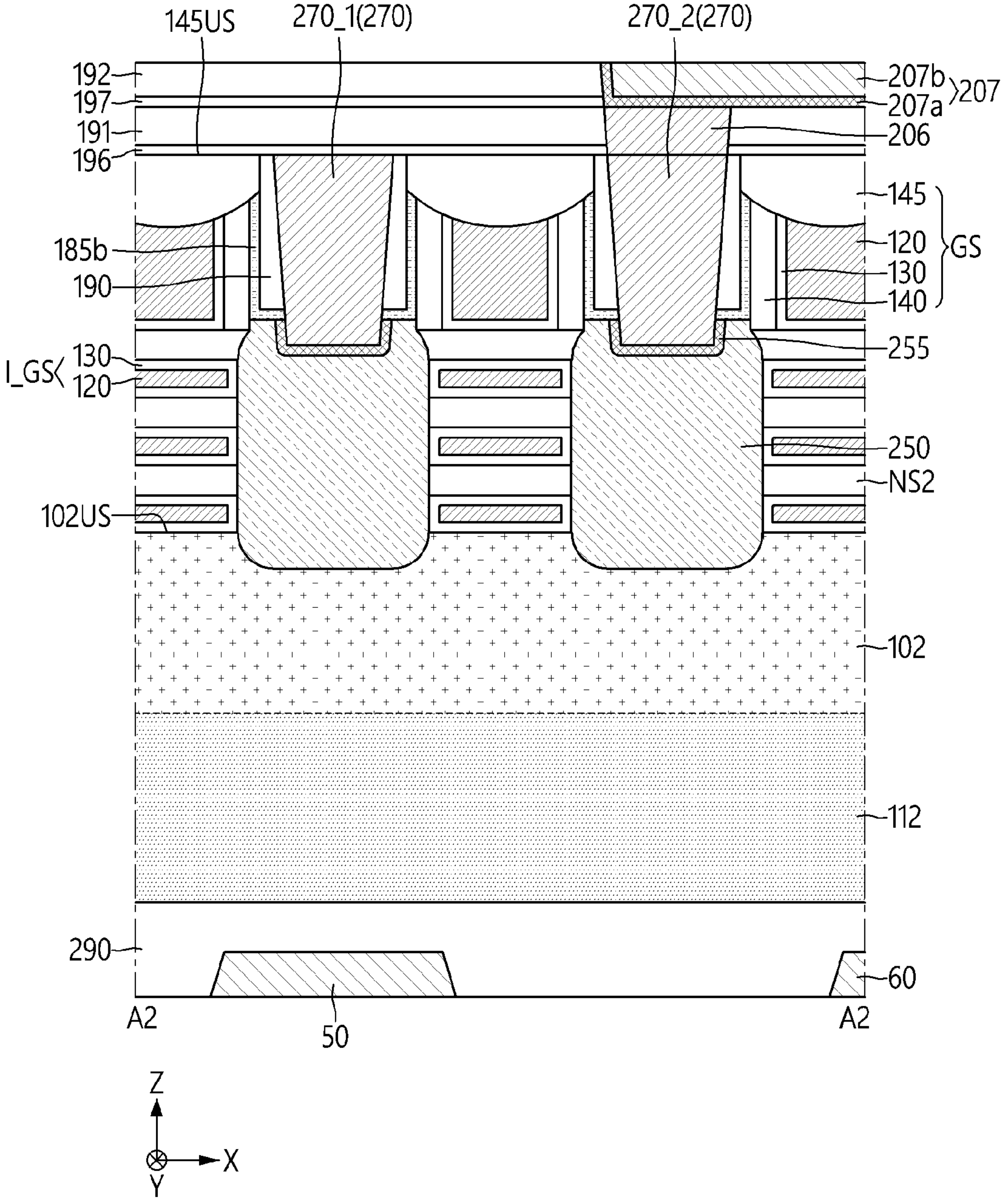
Figure 9:
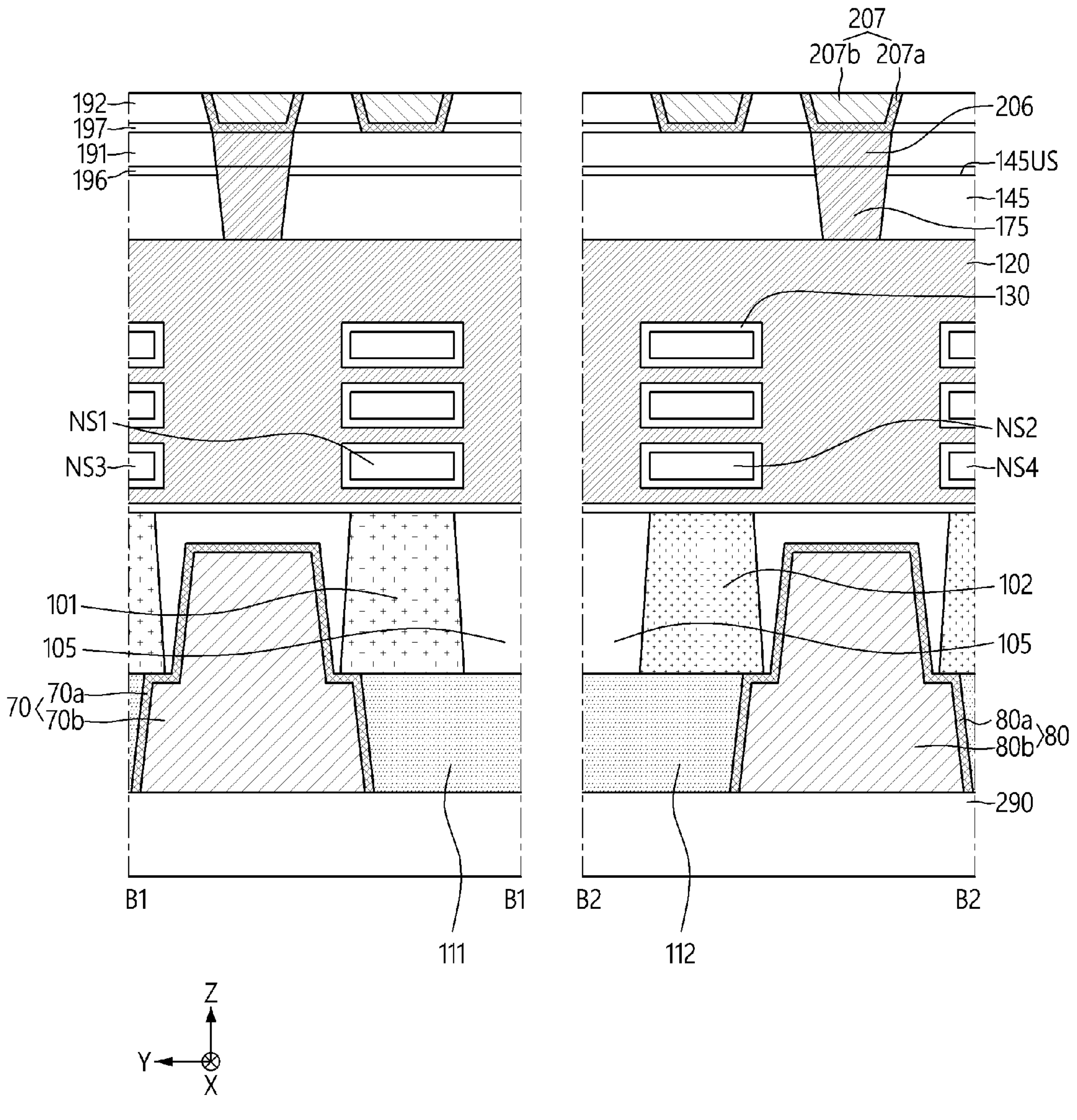
Figure 10:
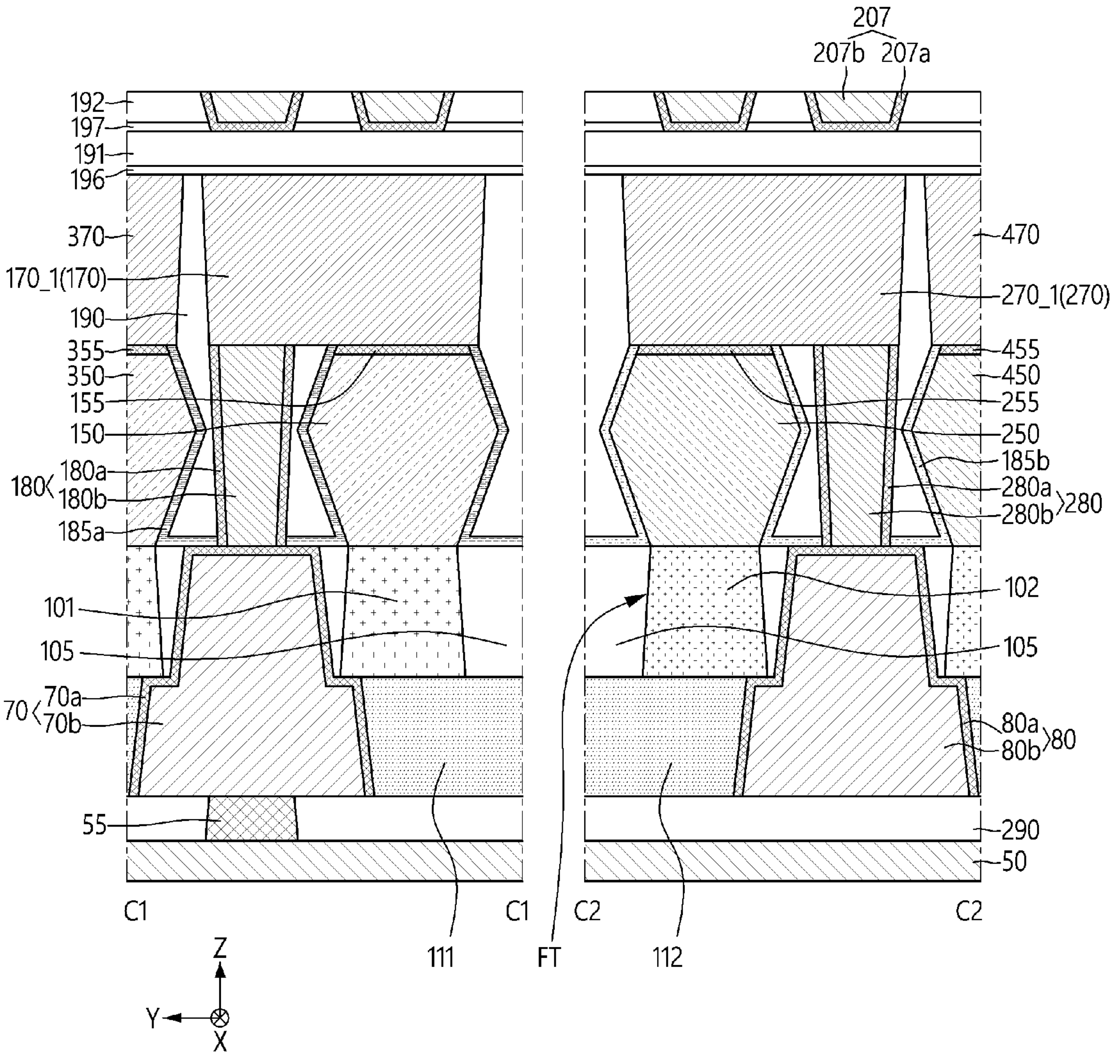
Figure 11:
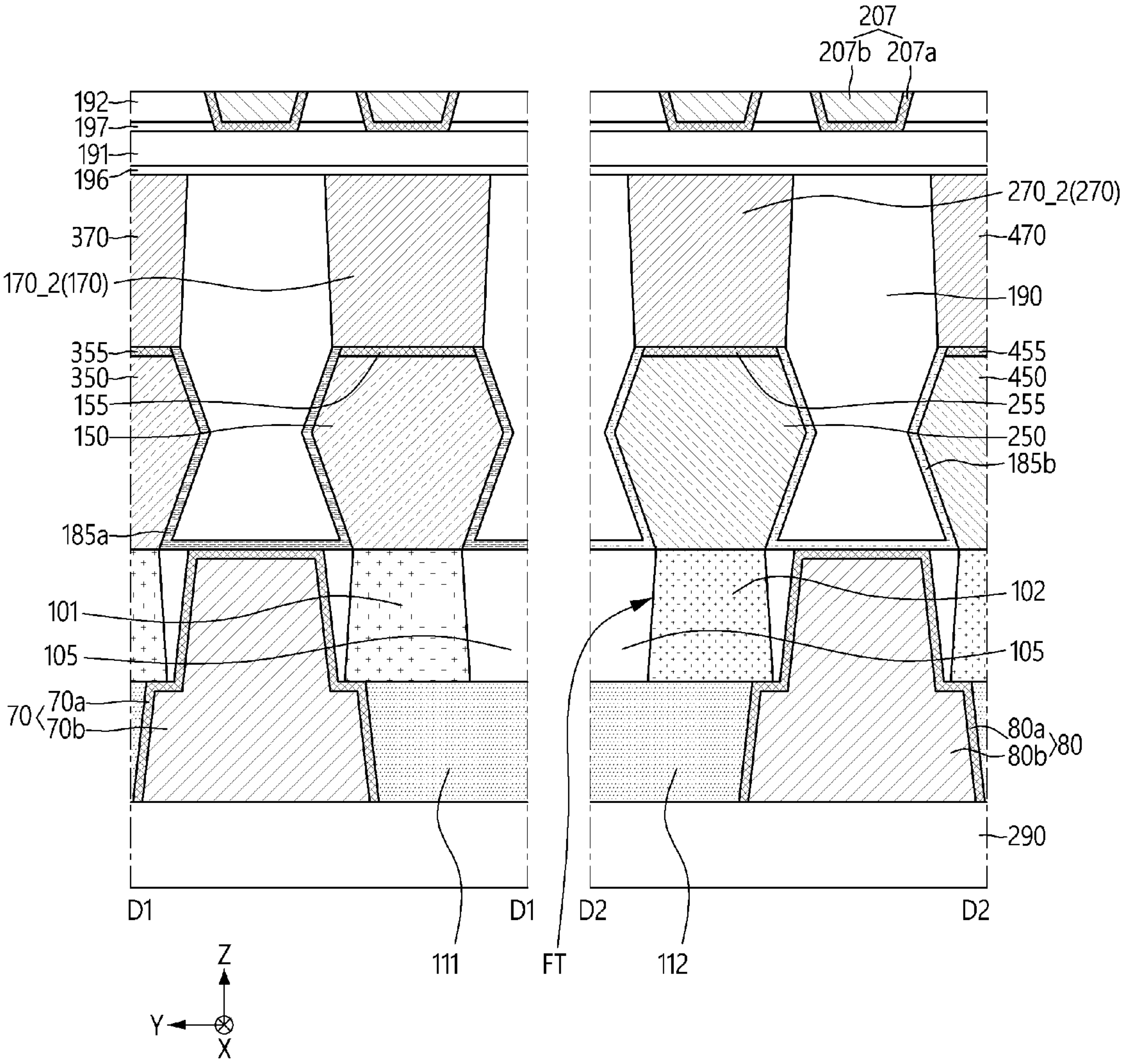

FIG. 1 is a layout diagram illustrating an exemplary semiconductor device according to some implementations. FIGS. 2 and 3 are cross-sectional views taken along lines A1-A1 and A2-A2 of FIG. 1, respectively, according to some implementations. FIG. 4 is a cross-sectional view taken along lines B1-B1 and B2-B2 of FIG. 1, according to some implementations. FIG. 5 is a cross-sectional view taken along lines C1-C1 and C2-C2 of FIG. 1, according to some implementations. FIG. 6 is a cross-sectional view taken along lines D1-D1 and D2-D2 of FIG. 1, according to some implementations. For simplicity of description, a front wiring line 207 and a front wiring via 206 are not shown in FIG. 1. Although not shown, the cross-sectional view taken in a first direction X along third and fourth active patterns AP3 and AP4 may be similar to FIGS. 2 and 3.

Referring to FIGS. 1 to 6, a semiconductor device may include a first active pattern AP1, a second active pattern AP2, the third active pattern AP3, and the fourth active pattern AP4. The semiconductor device may include a first back wiring line 50, a second back wiring line 60, a first buried conductive pattern 70, a second buried conductive pattern 80, a plurality of gate electrodes 120, a first source/drain pattern 150, a second source/drain pattern 250, a third source/drain pattern 350, and a fourth source/drain pattern 450. The semiconductor device may include a first front source/drain contact 170, a second front source/drain contact 270, a third front source/drain contact 370, a fourth front source/drain contact 470, a first contact connection via 180, and a second contact connection via 280. The semiconductor device may include a first source/drain etch stop layer 185*a*, a second source/drain etch stop layer 185*b*, and back insulating patterns 101 and 102.

The semiconductor device may include a first region R1 and a second region R2. The back insulating patterns 101 and 102 may include the first back insulating pattern 101 and the second back insulating pattern 102. The first back insulating pattern 101 may be disposed in the first region R1, and the second back insulating pattern 102 may be disposed in the second region R2.

In some implementations, the first region R1 and the second region R2 may be spaced apart from each other in a second direction Y. However, in some implementations, the first region R1 and the second region R2 may be spaced apart from each other in the first direction X.

In FIGS. 2 to 6, the back insulating patterns 101 and 102 may be disposed on a first back interlayer insulating layer 110. The back insulating patterns 101 and 102 may be disposed under the plurality of active patterns AP1, AP2, AP3, and AP4 (in FIG. 1). In some implementations, the back insulating patterns 101 and 102 may be disposed under a plurality of sheet patterns NS1, NS2, NS3, and NS4. For example, the first back insulating pattern 101 may be disposed between the first back interlayer insulating layer 110 and the first sheet pattern NS1, and the second back insulating pattern 102 may be disposed between the first back interlayer insulating layer 110 and the second sheet pattern NS2. In some implementations, the back insulating patterns 101 and 102 may be fin-shaped patterns.

The back insulating patterns 101 and 102 may elongate in the first direction X. The first back insulating pattern 101 may be spaced apart from the second back insulating pattern 102 in the second direction Y. However, in some implementations, the first back insulating pattern 101 may be spaced apart from the second back insulating pattern 102 in the first direction X.

In FIGS. 5 and 6, the plurality of back insulating patterns 101 and 102 may be separated by a fin trench FT extending in the first direction X. In some implementations, the lower surfaces of the back insulating patterns 101 and 102 may be disposed on the same plane as the lower surface of the fin trench FT. Each of the back insulating patterns 101 and 102 includes a sidewall extending in the first direction X. The sidewall of each of the back insulating patterns 101 and 102 may be defined by the fin trench FT. The first back insulating pattern 101 may be disposed under the first source/drain pattern 150. The first back insulating pattern 101 may be in direct contact with the first source/drain pattern 150. For example, the upper surface of the first back insulating pattern 101 may be in direct contact the lower surface of the first source/drain pattern 150. The second back insulating pattern 102 may be disposed under the second source/drain pattern 250. The second back insulating pattern 102 may be in direct contact with the second source/drain pattern 250. For example, the upper surface of the second back insulating pattern 102 may be in direct contact with the lower surface of the second source/drain pattern 250.

The first back insulating pattern 101 and the second back insulating pattern 102 may contain, e.g., at least one of silicon oxide, silicon nitride, silicon nitride, or a low dielectric constant material. In some implementations, the first back insulating pattern 101 may contain a material having a tensile stress higher than that of the second back insulating pattern 102. For example, the first back insulating pattern 101 may contain silicon oxide having a tensile stress higher than that of the second back insulating pattern 102.

In some implementations, the second back insulating pattern 102 may contain a material having a compressive stress higher than that of the first back insulating pattern 101. For example, the second back insulating pattern 102 may contain silicon oxide having a compressive stress higher than that of the first back insulating pattern 101.

In FIG. 1, each of the active patterns AP1, AP2, AP3, and AP4 may elongate in the first direction X. In some implementation, the first active pattern AP1 may extend in the first direction X, and the plurality of first sheet patterns NS1 may extend in the first direction X. In some implementations, the second active pattern AP2 may extend in the first direction X, and the plurality of second sheet patterns NS2 may extend in the first direction X.

The first active pattern AP1 and the third active pattern AP3 may be disposed in the first region R1. For example, the first active pattern AP1 and the third active pattern AP3 may extend in the first direction X in the first region R1, and the second active pattern AP2 and the fourth active pattern AP4 may be disposed in the second region R2. The second active pattern AP2 and the fourth active pattern AP4 may extend in the first direction X in the second region R2.

In some implementations, the first active pattern AP1 may be spaced apart from the second active pattern AP2 and the third active pattern AP3 in the second direction Y, and the second active pattern AP2 may be spaced apart from the fourth active pattern AP4 in the second direction Y. For example, the first active pattern AP1 and the second active pattern AP2 may be adjacent in the second direction Y.

In some implementations, one of the first active pattern AP1 and the second active pattern AP2 may be a region where a p-type transistor is formed, and the other of the first active pattern AP1 and the second active pattern AP2 may be a region where an n-type transistor is formed. For example, the first active pattern AP1 and the third active pattern AP3 may be regions where transistors of the same conductivity type are formed, and the second active pattern AP2 and the fourth active pattern AP4 may be regions where transistors of the same conductivity type are formed.

In some implementations, the first active pattern AP1 and the second active pattern AP2 may be regions where a p-type transistor is formed. For example, the third active pattern AP3 and the fourth active pattern AP4 may be regions where an n-type transistor is formed. In some implementations, the first active pattern AP1 and the second active pattern AP2 may be regions where an n-type transistor is formed, and the third active pattern AP3 and the fourth active pattern AP4 may be regions where a p-type transistor is formed.

The first region R1 including the first active pattern AP1 and the third active pattern AP3 may be a region where an N-type transistor is formed, and the second region R2 including the second active pattern AP2 and the fourth active pattern AP4 may be a region where a P-type transistor is formed.

In some implementations, each of the active patterns AP1, AP2, AP3, and AP4 may be a multi-channel active pattern. For example, the first active pattern AP1 may include the plurality of first sheet patterns NS1, the second active pattern AP2 may include the plurality of second sheet patterns NS2, the third active pattern AP3 may include a plurality of third sheet patterns NS3, and the fourth active pattern AP4 may include a plurality of fourth sheet patterns NS4. In some implementations, each of the active patterns AP1, AP2, AP3, and AP4 may be an active pattern including a nanosheet or a nanowire.

Each of the active patterns AP1, AP2, AP3, and AP4 may be disposed on the back insulating patterns 101 and 102. The first active pattern AP1 may be disposed on the first back insulating pattern 101, and the second active pattern AP2 may be disposed on the second back insulating pattern 102. The plurality of first sheet patterns NS1 may be disposed on the first back insulating pattern 101, and the plurality of second sheet patterns NS2 may be disposed on the second back insulating pattern 102. Additionally, the plurality of third sheet patterns NS3 may be disposed on the first back insulating pattern 101, and the plurality of fourth sheet patterns NS4 may be disposed on the second back insulating pattern 102.

The plurality of first sheet patterns NS1 may be spaced apart from the first back insulating pattern 101 in a third direction Z, and may be disposed on the upper surface of the first back insulating pattern 101. The plurality of second sheet patterns NS2 may be spaced apart from the second back insulating pattern 102 in the third direction Z, and may be disposed on the upper surface of the second back insulating pattern 102. The plurality of third sheet patterns NS3 may be spaced apart from the first back insulating pattern 101 in the third direction Z, and may be disposed on the upper surface of the first back insulating pattern 101. The plurality of fourth sheet patterns NS4 may be spaced apart from the second back insulating pattern 102 in the third direction Z, and may be disposed on the upper surface of the second back insulating pattern 102. Here, the first direction X may cross the second direction Y and the third direction Z, and the second direction Y may cross the third direction Z. The third direction Z may be the thickness direction of the back insulating patterns 101 and 102. Each of the sheet patterns NS1, NS2, NS3, and NS4 may include an upper surface and a lower surface opposite to each other in the third direction Z, in which each of the lower surfaces of the sheet patterns NS1, NS2, NS3, and NS4 may face the back insulating patterns 101 and 102. Although the number of sheet patterns NS1, NS2, NS3, and NS4 disposed in the third direction Z is depicted to be three, for simplicity of description, more or less than three of the sheet patterns NS1, NS2, NS3, and NS4 may be implemented.

In some implementations, each of the sheet patterns NS1, NS2, NS3, and NS4 may include an uppermost sheet pattern farthest from the back insulating patterns 101 and 102. For example, the upper surfaces of the active patterns AP1, AP2, AP3, and AP4 may be the upper surfaces of the uppermost sheet patterns of the sheet patterns NS1, NS2, NS3, and NS4.

In FIG. 4, the first sheet pattern NS1 has a width in the second direction Y that may increase or decrease in proportional to a width of the first back insulating pattern 101 in the second direction Y. Although FIG. 4 may depict that the widths of the first sheet patterns NS1 disposed on the first back insulating pattern 101 in the second direction Y are the same, the widths of the first sheet patterns NS1 disposed on the first back insulating pattern 101 in the second direction Y may not be the same.

In FIG. 6, a field insulating layer 105 may be disposed on the first back interlayer insulating layer 110. For example, the field insulating layer 105 may be disposed on the upper surface of the first back interlayer insulating layer 110. The field insulating layer 105 may fill at least a part of the fin trench FT separating the back insulating patterns 101 and 102. In some implementations, the field insulating layer 105 may be disposed on the first back interlayer insulating layer 110 between the back insulating patterns 101 and 102. For example, the field insulating layer 105 may completely cover the sidewalls of the back insulating patterns 101 and 102. In some implementations, the field insulating layer 105 may partially cover the sidewalls of the back insulating patterns 101 and 102. For example, the back insulating patterns 101 and 102 may partially protrude beyond the upper surface of the field insulating layer 105 in the third direction Z.

In FIGS. 4 to 6, the field insulating layer 105 does not cover the upper surface of the first back insulating pattern 101 and does not cover the upper surface of the second back insulating pattern 102. With respect to the first back interlayer insulating layer 110, each of the sheet patterns NS1, NS2, NS3, and NS4 is disposed higher than the upper surface of the field insulating layer 105.

The field insulating layer 105 may include, for example, an oxide layer, a nitride layer, an oxynitride layer, or a combination layer thereof. Although the field insulating layer 105 is illustrated as being a single layer, for simplicity of description, in some implementations, the field insulating layer 105 may include multiple layers.

The first back interlayer insulating layer 110 may be disposed under the first back insulating pattern 101, the second back insulating pattern 102, and the field insulating layer 105. The first back interlayer insulating layer 110 may include, for example, at least one of silicon oxide, silicon nitride, silicon carbonitride, silicon oxynitride, or a low-k material.

In FIGS. 2 and 3, a plurality of gate structures GS may be disposed on the back insulating patterns 101 and 102, and may extend in the second direction Y. The gate structures GS may be spaced apart from each other in the first direction X, and may be adjacent to each other in the first direction X.

In some implementations, the gate structure GS may be disposed on each of the active patterns AP1, AP2, AP3, and AP4. For example, the gate structure GS may intersect the first active pattern AP1 and the second active pattern AP2.

The gate structure GS may surround each of the first sheet patterns NS1, each of the second sheet patterns NS2, each of the third sheet patterns NS3, and each of the fourth sheet patterns NS4. Although the gate structure GS is shown to be disposed across the first to fourth active patterns AP1, AP2, AP3, and AP4, other implementations may be used.

The gate structure GS may include, for example, a gate electrode 120, a gate insulating layer 130, a gate spacer 140, and a gate capping layer 145. Additionally, the gate structure GS may include a plurality of inner gate structures I_GS disposed between the first sheet patterns NS1 adjacent in the third direction Z, and between the first back insulating pattern 101 and the first sheet pattern NS1. The inner gate structure I_GS may be disposed between the upper surface of the first back insulating pattern 101 and the lower surface of the first sheet pattern NS1, and between the upper surface of the first sheet pattern NS1 and the lower surface of the first sheet pattern NS1 facing each other in the third direction Z.

In some implementations, the number of the inner gate structures I_GS may be the same as the number of the first sheet patterns NS1. The inner gate structure I_GS is in contact with the upper surface of the first back insulating pattern 101, the upper surface of the first sheet pattern NS1, and the lower surface of the first sheet pattern NS1. As described below, the inner gate structure I_GS may be in contact with the source/drain pattern 150 which will be described later.

The inner gate structure I_GS includes the gate electrode 120 and the gate insulating layer 130 disposed between adjacent first sheet patterns NS1, and between the first back insulating pattern 101 and the first sheet pattern NS1. The inner gate structure I_GS may be disposed between the second sheet patterns NS2 adjacent in the third direction Z, and between the second back insulating pattern 102 and the second sheet pattern NS2. Although not shown, the inner gate structure I_GS may be disposed between the third sheet patterns NS3 adjacent in the third direction Z, and between the first back insulating pattern 101 and the third sheet pattern NS3. The inner gate structure I_GS may be disposed between the fourth sheet patterns NS4 adjacent in the third direction Z, and between the second back insulating pattern 102 and the fourth sheet pattern NS4.

For simplicity, the first active pattern AP1 and the gate structure GS, and the second active pattern AP2 and the gate structure GS will be mainly described. The gate electrode 120 may be disposed on the first back insulating pattern 101 and the second back insulating pattern 102, and may intersect the first back insulating pattern 101 and the second back insulating pattern 102. The gate electrode 120 may surround the first sheet pattern NS1 and the second sheet pattern NS2. In some implementations, the cross-sectional views of FIGS. 2 and 3 that the upper surface of the gate electrode 120 is a concave curved surface. However, other curved surfaces may be implemented. For example, the upper surface of the gate electrode 120 may be a flat surface.

The gate electrode 120 may include at least one of a metal, a metal alloy, a conductive metal nitride, a metal silicide, a doped semiconductor material, a conductive metal oxide, or a conductive metal oxynitride. The gate electrode 120 may include, for example, at least one selected from the group consisting of titanium nitride (TiN), tantalum carbide (TaC), tantalum nitride (TaN), titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlCN), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (NiPt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) and a combination thereof. In some implementations, the conductive metal oxide and the conductive metal oxynitride may include a form in which the above-mentioned material is oxidized. However, other materials may be implemented.

In FIG. 4, the gate insulating layer 130 may extend along the upper surface of the field insulating layer 105, the upper surface of the first back insulating pattern 101, and the upper surface of the second back insulating pattern 102. The gate insulating layer 130 may surround the plurality of first sheet patterns NS1, and the gate insulating layer 130 may surround the plurality of second sheet patterns NS2. The gate insulating layer 130 may be disposed along the circumference of the first sheet pattern NS1 and the circumference of the second sheet pattern NS2, and the gate electrode 120 is disposed on the gate insulating layer 130.

In FIG. 4, the lower surface of the gate insulating layer 130 may be in direct contact with the upper surface of the first back insulating pattern 101. The lower surface of the gate insulating layer 130 may be in direct contact with the upper surface of the second back insulating pattern 102. The gate insulating layer 130 is disposed between the gate electrode 120 and the first sheet pattern NS1, and between the gate electrode 120 and the second sheet pattern NS2. In FIGS. 2 and 3, the gate insulating layer 130 included in the inner gate structure I_GS may be in contact with the first source/drain pattern 150 and the second source/drain pattern 250 to be described later.

The gate insulating layer 130 may include silicon oxide, silicon oxynitride, silicon nitride, or a high-k material having a higher dielectric constant than silicon oxide. The high-k material may include, for example, at least one selected from the group consisting of boron nitride, hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Although the gate insulating layer 130 is depicted as a single layer, for simplicity of description, in some implementations, the gate insulating layer 130 may include multiple layers. For example, the gate insulating layer 130 may include a high-k insulating layer, and an interfacial layer disposed between the first active pattern AP1 and the gate electrode 120, and between the second active pattern AP2 and the gate electrode 120. In some implementations, the interfacial layer may not be formed along the profile of the upper surface of the field insulating layer 105.

In some implementations, the semiconductor device may include a negative capacitor (NC) FET using a negative capacitor (NC). For example, the gate insulating layer 130 may include a ferroelectric material layer having ferroelectric properties and a paraelectric material layer having paraelectric properties. In some implementations, the ferroelectric material layer may have a negative capacitance, and the paraelectric material layer may have a positive capacitance. For example, when two or more capacitors are connected in series and the capacitance of each capacitor has a positive value, the total capacitance becomes smaller than the capacitance of each capacitor. When at least one of the capacitances of two or more capacitors connected in series has a negative value, the total capacitance may have a positive value and may be greater than the absolute value of each capacitance. When a ferroelectric material layer having a negative capacitance and a paraelectric material layer having a positive capacitance are connected in series, the total capacitance value of the ferroelectric material layer and the paraelectric material layer connected in series may increase. By using the principle that the total capacitance value is increased, the transistor containing the ferroelectric material layer may have a subthreshold swing (SS) lower than or equal to a threshold voltage lower than 60 mV/decade at room temperature.

The ferroelectric material layer may have ferroelectric properties. The ferroelectric material layer may include, for example, at least one of hafnium oxide, hafnium zirconium oxide, barium strontium titanium oxide, barium titanium oxide, or lead zirconium titanium oxide. In some implementations, the hafnium zirconium oxide may be a material containing hafnium oxide doped with zirconium (Zr). In some implementations, the hafnium zirconium oxide may be a compound of hafnium (Hf), zirconium (Zr), and oxygen (O).

In some implementations, the ferroelectric material layer may further include a dopant doped therein. For example, the dopant may include at least one of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), or tin (Sn). The type of dopant included in the ferroelectric material layer may vary depending on which ferroelectric material is included in the ferroelectric material layer.

When the ferroelectric material layer includes hafnium oxide, the dopant included in the ferroelectric material layer may include, for example, at least one of gadolinium (Gd), silicon (Si), zirconium (Zr), aluminum (Al), or yttrium (Y). When the dopant is aluminum (Al), the ferroelectric material layer may include 3 to 8 atomic percent (at %) of aluminum, in which the ratio of the dopant may be a ratio of aluminum to the sum of hafnium and aluminum. When the dopant is silicon (Si), the ferroelectric material layer may include 2 to 10 at % of silicon. When the dopant is yttrium (Y), the ferroelectric material layer may include 2 to 10 at % of yttrium. When the dopant is gadolinium (Gd), the ferroelectric material layer may include 1 to 7 at % of gadolinium. When the dopant is zirconium (Zr), the ferroelectric material layer may include 50 to 80 at % of zirconium.

The paraelectric material layer may have paraelectric properties. The paraelectric material layer may include, for example, at least one of silicon oxide or metal oxide having a high dielectric constant. The metal oxide included in the paraelectric material layer may include, for example, at least one of hafnium oxide, zirconium oxide, or aluminum oxide, but is not limited thereto.

In some implementations, the ferroelectric material layer and the paraelectric material layer may include the same material. In some implementations, the ferroelectric material layer may have ferroelectric properties, but the paraelectric material layer may not have ferroelectric properties. For example, when the ferroelectric material layer and the paraelectric material layer include hafnium oxide, the crystal structure of the hafnium oxide included in the ferroelectric material layer is different from the crystal structure of the hafnium oxide included in the paraelectric material layer.

In some implementations, the ferroelectric material layer may have a thickness that exhibits ferroelectric properties. For example, the thickness of the ferroelectric material layer may be within a range of 0.5 nm to 10 nm. However, the thickness of the ferroelectric material layer may be more or less than this range. Since a critical thickness at which each ferroelectric material exhibits ferroelectric properties may be different, the thickness of the ferroelectric material layer may vary depending on the ferroelectric material.

In some implementations, the gate insulating layer 130 may include one ferroelectric material layer. In some implementations, the gate insulating layer 130 may include a plurality of ferroelectric material layers spaced apart from each other. In some implementations, the gate insulating layer 130 may have a laminated layer structure in which a plurality of ferroelectric material layers and a plurality of paraelectric material layers are alternately laminated.

In FIGS. 2 and 3, the gate spacer 140 may be disposed on the sidewall of the gate electrode 120. The gate spacer 140 may not be disposed between the first back insulating pattern 101 and the first sheet pattern NS1, and may not be disposed between the first sheet patterns NS1 adjacent in the third direction Z. The gate spacer 140 may include, for example, at least one of silicon nitride (SiN), silicon oxynitride (SiON), silicon oxide ($SiO_2$), silicon oxynitride (SiOCN), silicon boron nitride (SiBN), silicon oxyboron nitride (SiOBN), silicon oxycarbide (SiOC) or a combination thereof. Although the gate spacer 140 is illustrated as being a single layer, for simplicity of description, the gate spacer 140 may include multiple layers.

In FIGS. 2 to 4, the gate capping layer 145 may be disposed on the gate electrode 120. A upper surface 145US of the gate capping layer 145 may be the upper surface of the gate structure GS. In some implementations, the gate capping layer 145 may be disposed between the gate spacers 140. The gate capping layer 145 may include, for example, at least one of silicon nitride (SiN), silicon oxynitride (SiON), silicon carbonitride (SiCN), silicon oxycarbonitride (SiOCN), or a combination thereof.

In FIG. 2, the first source/drain pattern 150 may be disposed on the first back insulating pattern 101, and may be disposed between the gate electrodes 120 adjacent in the first direction X. The first source/drain pattern 150 may be in contact with the first active pattern AP1 and the first sheet pattern NS1. The lower surface of the first source/drain pattern 150 may be in direct contact with the upper surface of the first back insulating pattern 101.

In FIG. 3, the second source/drain pattern 250 may be disposed on the second back insulating pattern 102, and may be disposed between the gate electrodes 120 adjacent in the first direction X. The second source/drain pattern 250 may be in contact with the second active pattern AP2 and the second sheet pattern NS2. The lower surface of the second source/drain pattern 250 may be in direct contact with the upper surface of the second back insulating pattern 102.

In FIGS. 5 and 6, the third source/drain pattern 350 may be disposed on the first back insulating pattern 101. The lower surface of the third source/drain pattern 350 may be in direct contact with the upper surface of the first back insulating pattern 101. Although not shown, the third source/drain pattern 350 may be in contact with the third sheet pattern NS3. The fourth source/drain pattern 450 may be disposed on the second back insulating pattern 102. The lower surface of the fourth source/drain pattern 450 may be in direct contact with the upper surface of the second back insulating pattern 102. Although not shown, the fourth source/drain pattern 450 may be in contact with the fourth sheet pattern NS4.

The source/drain patterns 150, 250, 350, and 450 may include lower surfaces facing the back insulating patterns 101 and 102, and sidewalls extending from the lower surfaces of the source/drain patterns 150, 250, 350, and 450 in the third direction Z. In some implementations, the sidewalls of the source/drain patterns 150, 250, 350, and 450 may include facet intersections where inclined surfaces meet, but other geometric configurations may be used.

The first source/drain pattern 150 may be included in a source/drain of a transistor using the first sheet pattern NS1 as a channel region, and the second source/drain pattern 250 may be included in a source/drain of a transistor using the second sheet pattern NS2 as a channel region. The third source/drain pattern 350 may be included in a source/drain of a transistor using the third sheet pattern NS3 as a channel region, and. the fourth source/drain pattern 450 may be included in a source/drain of a transistor using the fourth sheet pattern NS4 as a channel region.

Each of the source/drain patterns 150, 250, 350, and 450 may include an epitaxial pattern, and may include a semiconductor material. In some implementations, the first source/drain pattern 150 and the second source/drain pattern 250 may have different conductivity types. For example, the first source/drain pattern 150 may have N-type conductivity, and the second source/drain pattern 250 may have P-type conductivity. The first source/drain pattern 150 may include an N-type dopant. The n-type dopant may include at least one of phosphorus (P), arsenic (As), antimony (Sb), or bismuth (Bi), but the present disclosure is not limited thereto. The second source/drain pattern 250 may include a P-type dopant. The p-type dopant may include at least one of boron (B) or gallium (Ga), but the present disclosure is not limited thereto.

In FIGS. 5 and 6, the first source/drain etch stop layer **185*a* may extend along the outer wall of the gate spacer 140, the sidewall of the first source/drain pattern 150, and the sidewall of the third source/drain pattern 350. The first source/drain etch stop layer 185*a* may extend along the upper surface of the field insulating layer 105. The second source/drain etch stop layer 185*b* may extend along the outer wall of the gate spacer 140, the sidewall of the second source/drain pattern 250, and the sidewall of the fourth source/drain pattern 450. The second source/drain etch stop layer 185*b* may extend along the upper surface of the field insulating layer 105**.

In some implementations, the first source/drain etch stop layer **185*a* and the second source/drain etch stop layer 185*b* may not extend along the sidewall of the gate capping layer 145. Unlike the illustrated implementation, the first source/drain etch stop layer 185*a* and the second source/drain etch stop layer 185*b* may extend along the sidewall of the gate capping layer 145**.

The first source/drain etch stop layer **185*a* and the second source/drain etch stop layer 185*b* may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), or a combination thereof. In some implementations, the first source/drain etch stop layer 185*a* may contain a material having a tensile stress higher than that of the second source/drain etch stop layer 185*b*. For example, the first source/drain etch stop layer 185*a* may contain silicon nitride having a tensile stress higher than that of the second source/drain etch stop layer 185*b***.

In some implementations, the second source/drain etch stop layer **185*b* may contain a material having a compressive stress higher than that of the first source/drain etch stop layer 185*a*. For example, the second source/drain etch stop layer 185***b* may contain silicon nitride having a compressive stress higher than that of the first source/drain etch stop layer 185*a*.

In FIGS. 5 and 6, a first upper interlayer insulating layer 190 is disposed on the back insulating patterns 101 and 102. The first upper interlayer insulating layer 190 may be disposed on the source/drain patterns 150, 250, 350, and 450. The first upper interlayer insulating layer 190 may not cover the upper surface of the gate capping layer 145. The first upper interlayer insulating layer 190 may include, for example, at least one of silicon oxide, silicon nitride, silicon oxynitride, or a low-k material. The dielectric constant of the low dielectric constant material may have a value smaller than 3.9 that is the dielectric constant of silicon oxide.

The first front source/drain contact 170 may extend in the third direction Z on the upper surface of the first back insulating pattern 101. The first front source/drain contact 170 may be disposed on the first source/drain pattern 150 to be electrically connected to the first source/drain pattern 150.

The first front source/drain contact 170 may include a first back connection contact 170_1 and a first front connection contact 170_2. The first back connection contact 170_1 may be connected to the first buried conductive pattern 70 through the first contact connection via 180. However, the first front connection contact 170_2 may not be in contact with the first contact connection via 180, and may not be connected to the first contact connection via 180.

The second front source/drain contact 270 may extend in the third direction Z on the upper surface of the second back insulating pattern 102. The second front source/drain contact 270 may be disposed on the second source/drain pattern 250 to be electrically connected to the second source/drain pattern 250.

The second front source/drain contact 270 may include a second back connection contact 270_1 and a second front connection contact 270_2. The second back connection contact 270_1 may be connected to the second buried conductive pattern 80 through the second contact connection via 280. However, the second front connection contact 270_2 may not be in contact with the second contact connection via 280, and may not be connected to the second contact connection via 280.

The third front source/drain contact 370 may extend in the third direction Z on the upper surface of the first back insulating pattern 101 and may be disposed on the third source/drain pattern 350. The third front source/drain contact 370 is electrically connected to the third source/drain pattern 350.

The fourth front source/drain contact 470 may extend in the third direction Z on the upper surface of the second back insulating pattern 102. The fourth front source/drain contact 470 may be disposed on the fourth source/drain pattern 450. The fourth front source/drain contact 470 is electrically connected to the fourth source/drain pattern 450. Although not shown, the third and fourth source/drain contacts 370 and 470 may include a back connection contact and a front connection contact.

In FIG. 5, the first back connection contact 170_1 and the second back connection contact 270_1 may be arranged in the second direction Y. For example, the first back connection contact 170_1 may be directly adjacent to the second back connection contact 270_1 in the second direction Y. In FIG. 6, the first front connection contact 170_2 may be directly adjacent to the second front connection contact 270_2 in the second direction Y.

With respect to the upper surface of the field insulating layer 105, the height of the upper surface of the first front source/drain contact 170 may be the same as the height of the upper surface of the second front source/drain contact 270. With respect to the upper surface of the field insulating layer 105, the height of the upper surface of the first front source/drain contact 170 may be the same as the height of the upper surface of the third front source/drain contact 370 and the height of the upper surface of the fourth front source/drain contact 470.

With respect to FIGS. 5 and 6, the description of the first front source/drain contact 170 and the second front source/drain contact 270 (in FIGS. 2 and 3) may be applied to the third front source/drain contact 370 and the fourth front source/drain contact 470 (in FIGS. 5 and 6). In FIGS. 2 and 3, the first front contact silicide layer 155 may be disposed between the first front source/drain contact 170 and the first source/drain pattern 150, and the second front contact silicide layer 255 may be disposed between the second front source/drain contact 270 and the second source/drain pattern 250. In FIGS. 5 and 6, the third front contact silicide layer 355 may be disposed between the third front source/drain contact 370 and the third source/drain pattern 350, and the fourth front contact silicide layer 455 may be disposed between the fourth front source/drain contact 470 and the fourth source/drain pattern 450.

In FIG. 4, a gate contact 175 may be disposed on and connected to the gate electrode 120. The gate contact 175 may connect the front wiring via 206 and the gate contact 175, and may penetrate through (extend into) the gate capping layer 145.

The front wiring via 206 may be disposed on the gate contact 175 and the front source/drain contacts 170, 270, 370, and 470, and may be directly connected to the gate contact 175 and the front source/drain contacts 170, 270, 370, and 470. The front wiring via 206 may be disposed between the front source/drain contacts 170, 270, 370, and 470, and the front wiring line 207, and may be disposed between the gate contact 175 and the front wiring line 207. The front wiring via 206 may connect the front source/drain contacts 170, 270, 370, and 470, and the front wiring line 207, and may connect the gate contact 175 and the front wiring line 207.

The first front connection contact 170_2 and the second front connection contact 270_2 (in FIG. 6) may be connected to the front wiring line 207 through the front wiring via 206 (in FIG. 4). In some implementations, the first back connection contact 170_1 and the second back connection contact 270_1 may not be connected to the front wiring line 207, and the front wiring via 206 may not be disposed on the first back connection contact 170_1 and the second back connection contact 270_1.

In FIGS. 2 and 3, the height from the upper surface of the first back insulating pattern 101 to the upper surface of the first front source/drain contact 170 may be the same as the height from the upper surface of the first back insulating pattern 101 to the upper surface 145US of the gate capping layer. However, in some implementations, such a configuration may differ. Additionally, the upper surface of the first front source/drain contact 170 may be located at the boundary between the front wiring via 206 and the first front source/drain contact 170.

In some implementations, the front source/drain contacts 170, 270, 370, and 470, and the front wiring via 206 may have a single layer structure. For example, the front source/drain contacts 170, 270, 370, and 470, and the front wiring via 206 may be formed of a single conductive material. The front source/drain contacts 170, 270, 370, and 470, and the front wiring via 206 may have a single conductive layer structure. Additionally, the front source/drain contacts 170, 270, 370, and 470, and the front wiring via 206 may contain impurities introduced unintentionally in a process of forming the front source/drain contacts 170, 270, 370, and 470, and the front wiring via 206. Furthermore, the gate contact 175 may have a single layer structure.

In some implementations, the front source/drain contacts 170, 270, 370, and 470, the front wiring via 206, and the gate contact 175 may include at least one of a metal or a metal alloy. For example, the front source/drain contacts 170, 270, 370, and 470, the front wiring via 206, and the gate contact 175 may include at least one of tungsten (W), molybdenum (Mo), ruthenium (Ru), or ruthenium-aluminum (RuAl). In some implementations, other materials may be used. Additionally, the front contact silicide layers 155, 255, 355, and 455 may include a metal silicide material, for example.

In FIGS. 5 and 6, the first buried conductive pattern 70 may be disposed between the first active pattern AP1 and the third active pattern AP3 (in FIG. 1), and may overlap the field insulating layer 105 disposed between the first back insulating patterns 101 in the third direction Z, and may penetrate (extend into) the field insulating layer 105 disposed between the first back insulating patterns 101. The first buried conductive pattern 70 may include a first portion that penetrates (extends into) the field insulating layer 105 disposed between the first back insulating patterns 101 to be in contact with the first contact connection via 180. Further, the first buried conductive pattern 70 may include a second portion disposed under the first portion to have a stepped portion with the first portion and penetrating (extend into) the first back interlayer insulating layer 110.

The upper surface of the first buried conductive pattern 70 may be disposed on the same plane as the upper surface of the first back insulating pattern 101, and the upper surface of the first buried conductive pattern 70 and the lower surface of the first source/drain pattern 150 may be disposed on the same plane. The second buried conductive pattern 80 may be disposed between the second active pattern AP2 and the fourth active pattern AP4, and may overlap the field insulating layer 105 disposed between the second back insulating patterns 102 in the third direction Z. The second buried conductive pattern 80 may penetrate the field insulating layer 105 disposed between the second back insulating patterns 102.

The second buried conductive pattern 80 may include a first portion that penetrates the field insulating layer 105 disposed between the second back insulating patterns 102 to be in contact with the second contact connection via 280. Further, the second buried conductive pattern 80 may include a second portion disposed under the first portion to have a stepped portion with the first portion and penetrating the first back interlayer insulating layer 110. The upper surface of the second buried conductive pattern 80 may be disposed on the same plane as the upper surface of the second back insulating pattern 102, and the upper surface of the second buried conductive pattern 80 and the lower surface of the second source/drain pattern 250 may be disposed on the same plane.

In FIG. 5, each of the first buried conductive pattern 70 and the second buried conductive pattern 80 may elongate in the first direction X. In plan view, at least a part of the gate electrode 120 may intersect the first buried conductive pattern 70 and the second buried conductive pattern 80. In some implementations, each of the first buried conductive pattern 70 and the second buried conductive pattern 80 may be formed in a line shape.

In some implementations, the widths of the first buried conductive pattern 70 and the second buried conductive pattern 80 increase toward the bottom. For example, the widths of the first buried conductive pattern 70 and the second buried conductive pattern 80 may increase from the upper surface of the field insulating layer 105 toward a second back interlayer insulating layer 290.

The first buried conductive pattern 70 may be connected to the first back connection contact 170_1 through the first contact connection via 180. The first buried conductive pattern 70 may be connected to the first back wiring line 50 via a first back wiring via 55. The second buried conductive pattern 80 may be connected to the second back connection contact 270_1 through the second contact connection via 280. Although not shown, the second buried conductive pattern 80 may be connected to the second back wiring line 60 (in FIG. 3) via a back wiring.

The first buried conductive pattern 70 and the second buried conductive pattern 80 may penetrate through the first back interlayer insulating layer 110. The first buried conductive pattern 70 and the second buried conductive pattern 80 may extend from the lower surface of the first back interlayer insulating layer 110 to the upper surface of the field insulating layer 105 (in FIG. 5). For example, in FIG. 4, the first buried conductive pattern 70 and the second buried conductive pattern 80 may not protrude beyond the upper surface of the field insulating layer 105 in the third direction Z. In some implementations, although not shown, a part of the first buried conductive pattern 70 and a part of the second buried conductive pattern 80 may protrude beyond the upper surface of the field insulating layer 105 in the third direction Z to be disposed in the upper interlayer insulating layer 190.

In FIGS. 4 to 6, the first buried conductive pattern 70 may include a first buried conductive barrier layer 70*a* and a first buried conductive plug 70*b*, and the second buried conductive pattern 80 may include a second buried conductive barrier layer 80*a* and a second buried conductive plug 80*b*. Each of the first buried conductive barrier layer 70*a* and the first buried conductive plug 70*b* may include, for example, at least one of a metal, a conductive metal nitride, a conductive metal carbide, a conductive metal oxide, a conductive metal carbonitride, or a two-dimensional material. The first buried conductive plug 70*b* and the second buried conductive plug 80*b* may include at least one of a metal or a metal alloy. In some implementations, the first buried conductive pattern 70 and the second buried conductive pattern 80 may have a single conductive layer structure.

In some implementations, the exemplary semiconductor device illustrated in FIGS. 1-6 may be formed from 2D materials that include a 2D allotrope or a 2D compound, and may include, for example, at least one of graphene, boron nitride (BN), molybdenum sulfide, molybdenum selenide, tungsten sulfide, tungsten selenide, or tantalum sulfide, but the present disclosure is not limited thereto. However, the examples of the 2D materials may include additional or other materials.

In FIG. 5, the first contact connection via 180 may be disposed between the first front source/drain contact 170 and the first buried conductive pattern 70 to connect the first back connection contact 170_1 and the first buried conductive pattern 70. In some implementations, the first contact connection via 180 may be directly connected to the first back connection contact 170_1. For example, the first contact connection via 180 may be connected to the first buried conductive pattern 70 while penetrating through the first source/drain etch stop layer 185*a* and the field insulating layer 105.

The second contact connection via 280 may be disposed between the second front source/drain contact 270 and the second buried conductive pattern 80 to connect the second back connection contact 270_1 and the second buried conductive pattern 80. In some implementations, the second contact connection via 280 may be directly connected to the second back connection contact 270_1. For example, the second contact connection via 280 may be connected to the second buried conductive pattern 80 while penetrating through the second source/drain etch stop layer 185*b* and the field insulating layer 105.

The width of the first contact connection via 180 in the second direction Y may increase as the distance from the lower surface of the first back interlayer insulating layer 110 increases. The width of the second contact connection via 280 in the second direction Y may increase as the distance from the lower surface of the first back interlayer insulating layer 110 increases.

The first contact connection via 180 and the second contact connection via 280 may have a multi-layer structure. In some implementations, the first contact connection via 180 and the second contact connection via 280 may have a multi-conductive layer structure. For example, the first contact connection via 180 may include a first contact connection barrier layer 180*a* and a first contact connection plug 180*b*, and the second contact connection via 280 may include a second contact connection barrier layer 280*a* and a second contact connection plug 280*b*.

The first contact connection barrier layer 180*a* extends along the sidewall of the first contact connection plug 180*b*, and the second contact connection barrier layer 280*a* extends along the sidewall of the second contact connection plug 280*b*.

The first contact connection plug 180*b* may be directly connected to the first back connection contact 170_1, and may include the upper surface facing the first back connection contact 170_1, such that the upper surface of the first contact connection plug 180*b* is in contact with the first back connection contact 170_1. The second contact connection plug 280*b* may be directly connected to the second back connection contact 270_1, and may include the upper surface facing the second back connection contact 270_1, such that the upper surface of the second contact connection plug 280*b* is in contact with the second back connection contact 270_1.

Each of the first contact connection barrier layer 180*a* and the second contact connection barrier layer 280*a* may include, for example, at least one of a metal, a conductive metal nitride, a conductive metal carbide, a conductive metal oxide, a conductive metal carbonitride, or a two-dimensional material. The first contact connection plug 180*b* and the second contact connection plug 280*b* may include at least one of a metal or a metal alloy.

In some implementations, the first contact connection plug 180*b* may contain the same material as that of the first back connection contact 170_1, and in some implementations, the second contact connection plug 280*b* may contain the same material as that of the second back connection contact 270_1. Accordingly, the boundary between the contact connection plugs 180*b* and 280*b* and the back connection contacts 170_1 and 270_1 may not be distinguished.

In some implementations, the first contact connection plug 180*b* may contain a material different from that of the first back connection contact 170_1, and in some implementations, the second contact connection plug 280*b* may contain a material different from that of the second back connection contact 270_1.

In some implementations, the first contact connection via 180 and the second contact connection via 280 may have a single conductive layer structure.

In FIGS. 2 and 3, the first back wiring line 50 and the second back wiring line 60 may be disposed under the second back interlayer insulating layer 290. For example, each of the first back wiring line 50 and the second back wiring line 60 may extend in the second direction Y, but the present disclosure is not limited thereto.

In FIG. 5, The first back wiring line 50 may be connected to the first back connection contact 170_1 through the first buried conductive pattern 70. The first back connection contact 170_1 connects the first back wiring line 50 and the first source/drain pattern 150. In FIG. 6, the first front connection contact 170_2 is not connected to the first back wiring line 50.

Although not shown, the second back wiring line 60 (in FIGS. 2 and 3) may be connected to the second buried conductive pattern 80. Like FIG. 5, the second back wiring line 60 may be connected to the second back connection contact 270_1 through the second buried conductive pattern 80. The second back connection contact 270_1 connects the second back wiring line 60 and the second source/drain pattern 250. Like FIG. 6, the second front connection contact 270_2 is not connected to the second back wiring line 60.

In some implementations, the first back wiring line 50 and the second back wiring line 60 may be power lines for supplying a power to the semiconductor device. In some implementations, the first back wiring line 50 and the second back wiring line 60 may be signal lines for supplying the operation signal of the semiconductor device. In some implementations, one of the first back wiring line 50 and the second back wiring line 60 may be a power line, and the other of the first back wiring line 50 and the second back wiring line 60 may be a signal line.

In some implementations, the first buried conductive pattern 70 and the second buried conductive pattern 80 may be power transmission patterns for transmitting a power to the semiconductor device. In some implementations, the first buried conductive pattern 70 and the second buried conductive pattern 80 may be signal transmission patterns for transmitting the operation signal of the semiconductor device.

In FIG. 5, the first back wiring via 55 may be disposed between the first back wiring line 50 and the first buried conductive pattern 70 to connect the first back wiring line 50 and the first buried conductive pattern 70. Although not shown, a second back wiring via may be disposed between the second back wiring line 60 and the second buried conductive pattern 80 to connect the second back wiring line 60 and the second buried conductive pattern 80.

Although FIGS. 2, 3, and 5 may illustrate that the first back wiring line 50 and the second back wiring line 60 have a single conductive layer structure, one or both of the first back wiring line 50 and the second back wiring line 60 may have a multi-conductive layer structure including a back wiring barrier layer and a back wiring plug layer, similarly to the front wiring line 207. Although the first back wiring via 55 is illustrated having a single conductive layer structure, the first back wiring via 55 may have a multi-conductive layer structure.

The first back wiring line 50, the second back wiring line 60, and the first back wiring via 55 may include, for example, at least one of a metal, a metal alloy, a conductive metal nitride, a conductive metal carbide, a conductive metal oxide, a conductive metal carbonitride, or a two-dimensional material. Although FIG. 5 may illustrate that the boundary between the first back wiring line 50 and the first back wiring via 55 is distinguished, the first back wiring line 50 and the first back wiring via 55 may have an integral structure without a boundary surface.

In FIG. 5, the second back interlayer insulating layer 290 may be disposed on the lower surface of the first back interlayer insulating layer 110. In FIGS. 3 and 5, the first back wiring line 50, the first back wiring via 55, and the second back wiring line 60 may be disposed in the second back interlayer insulating layer 290. In some implementations, the second back interlayer insulating layer 290 may include, e.g., at least one of silicon oxide, silicon nitride, silicon carbonitride, silicon oxynitride, or a low-k material.

In FIGS. 2 to 6, the first etch stop layer 196 and the second upper insulating interlayer 191 may be disposed on the first upper insulating interlayer 190, and the second upper interlayer insulating layer 191 may cover the sidewall of the front wiring via 206. Additionally, a second etch stop layer 197 and a third upper interlayer insulating layer 192 may be sequentially disposed on the second upper interlayer insulating layer 191. The second etch stop layer 197 may be disposed between the second upper interlayer insulating layer 191 and the third upper interlayer insulating layer 192.

The first etch stop layer 196 and the second etch stop layer 197 may include, for example, at least one of silicon nitride (SiN), silicon oxynitride (SiON), silicon oxycarbonitride (SiOCN), silicon boron nitride (SiBN), silicon oxyboron nitride (SiOBN), silicon oxycarbide (SiOC), aluminum oxide (AlO), aluminum nitride (AlN) and aluminum oxycarbide (AlOC), or a combination thereof. The third upper interlayer insulating layer 192 may include, e.g., at least one of silicon oxide, silicon nitride, silicon carbonitride, silicon oxynitride, or a low-k material.

The front wiring line 207 may be disposed in the third upper interlayer insulating layer 192 and on the first upper interlayer insulating layer 190. In some implementations, the front wiring line 207 may be connected to the front source/drain contacts 170, 270, 370, and 470 and the gate contact 175. For example, the front wiring line 207 may be connected to the front source/drain contacts 170, 270, 370, and 470 through the front wiring via 206, and the front wiring line 207 may be connected to the gate contact 175 through the front wiring via 206.

In some implementations, the front wiring line 207 may include a front wiring barrier layer **207*a* and a front wiring plug 207*b*. For example, the front wiring barrier layer 207*a* may include at least one of a metal, a conductive metal nitride, a conductive metal carbide, a conductive metal oxide, a conductive metal carbonitride, or a two-dimensional material. The front wiring plug 207*b* may include, for example, at least one of a metal or a metal alloy. Although it is illustrated that the front wiring line 207 has a multi-conductive layer structure, the front wiring line 207 may have a single conductive layer structure, similarly to the back wiring lines 50 and 60**.

FIGS. 7 to 11 are diagrams illustrating an exemplary semiconductor device according to some implementations. For simplicity of description, the following description will focus on differences from the description with reference to FIGS. 1 to 6.

In FIGS. 7 to 11, the exemplary semiconductor device may include a first region back interlayer insulating layer 111 and a second region back interlayer insulating layer 112. The first region back interlayer insulating layer 111 may be disposed under the first back insulating pattern 101 to be in direct contact with the lower surface of the first back insulating pattern 101. The first region back interlayer insulating layer 111 may surround the side surface of the first buried conductive pattern 70.

The second region back interlayer insulating layer 112 may be disposed under the second back insulating pattern 102 to be in direct contact with the lower surface of the second back insulating pattern 102. The second region back interlayer insulating layer 112 may surround the side surface of the second buried conductive pattern 80.

In some implementations, the first region back interlayer insulating layer 111 and the second region back interlayer insulating layer 112 may contain materials having different magnitudes of tensile stress and compressive stress. For example, the first region back interlayer insulating layer 111 may have a tensile stress higher than that of the second region back interlayer insulating layer 112. The first region back interlayer insulating layer 111 may contain silicon oxide having a tensile stress higher than that of the second region back interlayer insulating layer 112. The second region back interlayer insulating layer 112 may have a compressive stress higher than that of the first region back interlayer insulating layer 111. The second region back interlayer insulating layer 112 may contain silicon oxide having a compressive stress higher than that of the first region back interlayer insulating layer 111.

Figure 12:
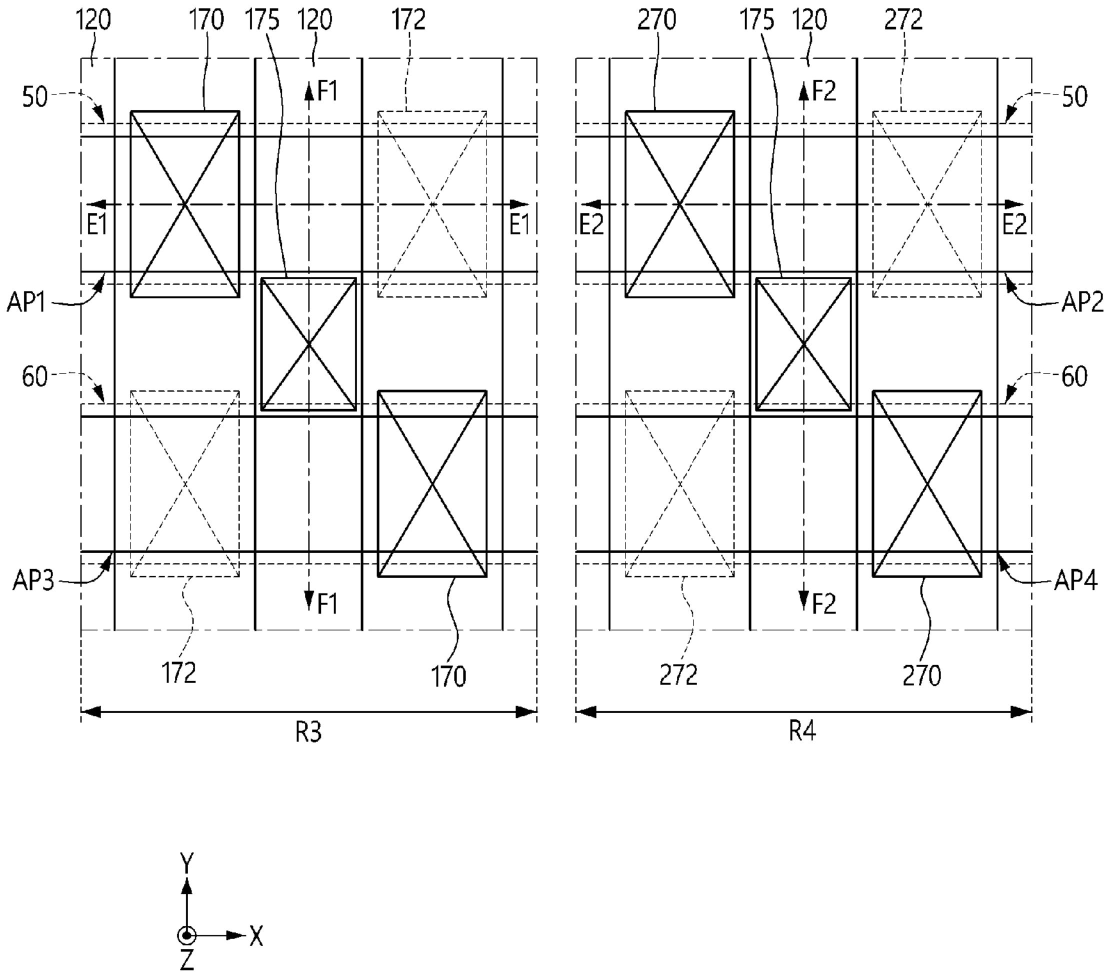
FIG. 12 is a layout diagram illustrating an exemplary semiconductor device according to some implementations.
Figure 13:
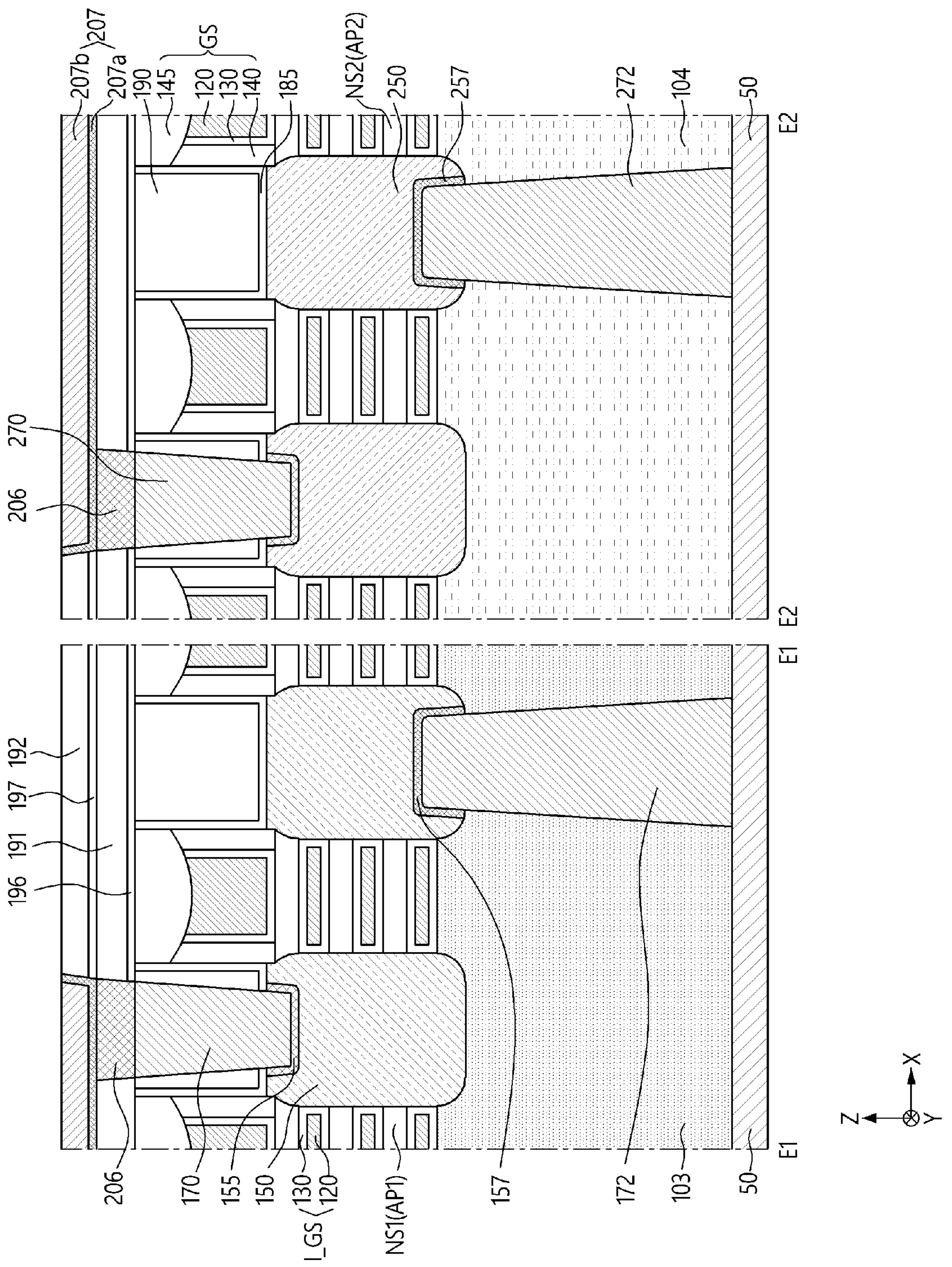
FIG. 13 is a cross-sectional view taken along lines E1-E1 and E2-E2 of FIG. 12, according to some implementations.
Figure 14:
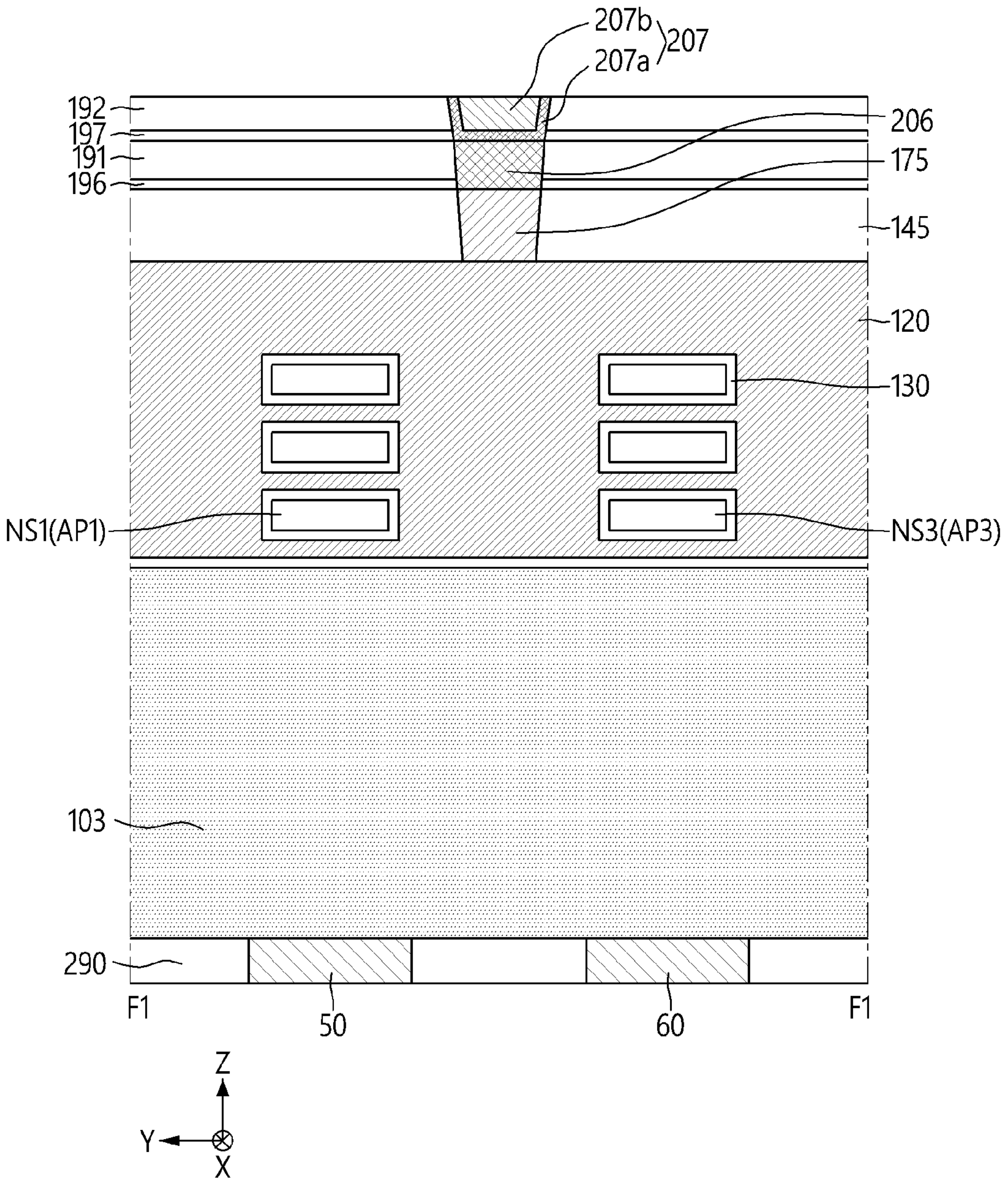
FIG. 14 is a cross-sectional view taken along line F1-F1 of FIG. 12, according to some implementations.
Figure 15:
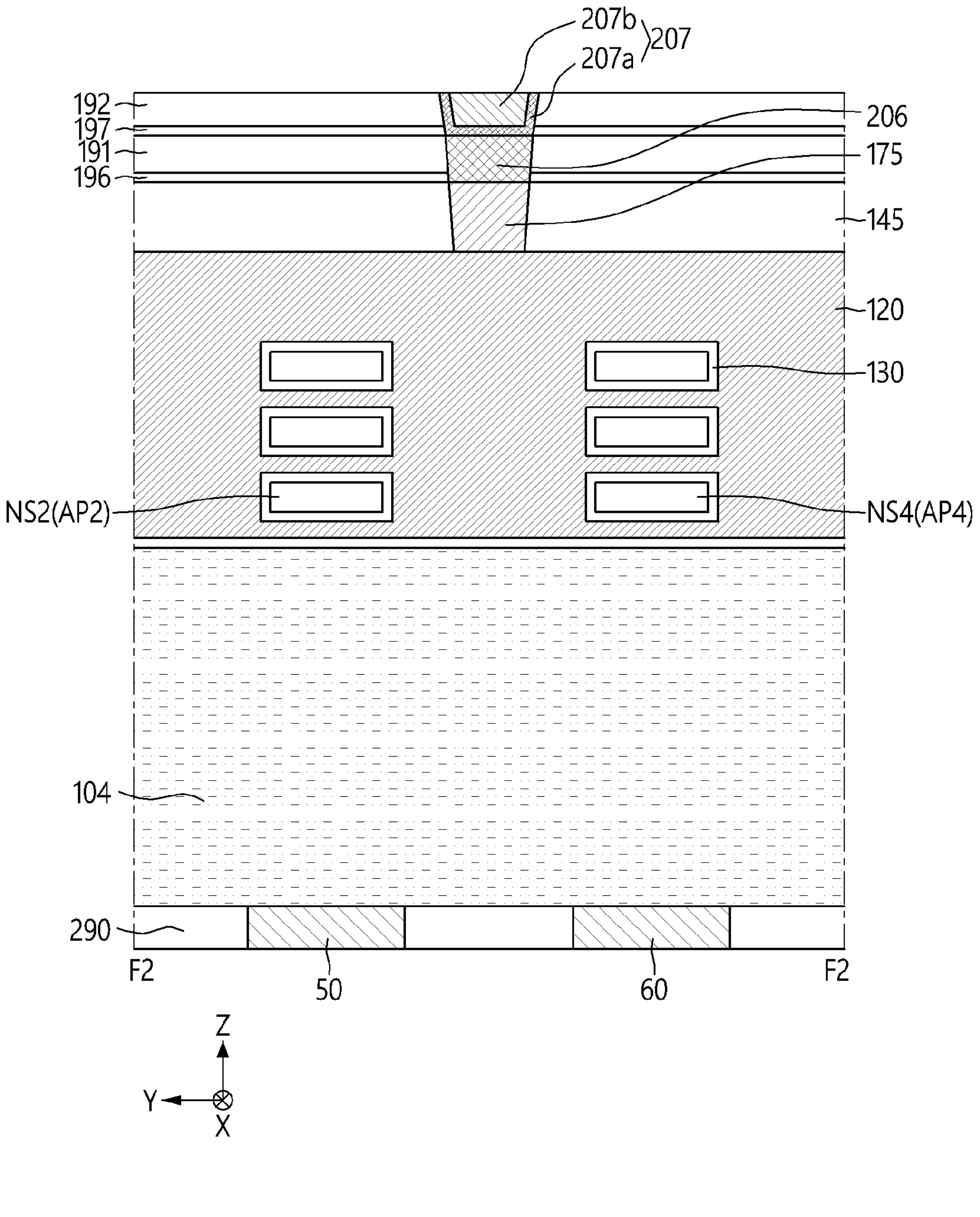
FIG. 15 is a cross-sectional view taken along line F2-F2 of FIG. 12, according to some implementations.

FIG. 12 is a layout diagram illustrating an exemplary semiconductor device according to some implementations. FIG. 13 is a cross-sectional view taken along lines E1-E1 and E2-E2 of FIG. 12 according to some implementations. FIG. 14 is a cross-sectional view taken along line F1-F1 of FIG. 12 according to some implementations. FIG. 15 is a cross-sectional view taken along line F2-F2 of FIG. 12 according to some implementations. For simplicity of description, the following description will focus on differences from the description with reference to FIGS. 1 to 6.

Referring to FIGS. 12 to 15, the exemplary semiconductor device according to some implementations may include a first back source/drain contact 172 and a second back source/drain contact 272. The exemplary semiconductor device may include a third region R3 and a fourth region R4. The back insulating patterns 103 and 104 may include the third back insulating pattern 103 and the fourth back insulating pattern 104, in which the third back insulating pattern 103 may be disposed in the third region R3, and the second back insulating pattern 102 may be disposed in the second region R2.

In some implementations, the third region R3 and the fourth region R4 may be spaced apart from each other in the first direction X. However, in some implementations, the third region R3 and the fourth region R4 may be spaced apart from each other in the second direction Y.

Although FIG. 12 illustrates that the first active pattern AP1 and the second active pattern AP2 are spaced apart from each other in the first direction X, the first active pattern AP1 and the second active pattern AP2 may each extend in the first direction X, and may be spaced apart from each other in the second direction Y.

In FIGS. 12-14, the third back insulating pattern 103 and the fourth back insulating pattern 104 may be disposed under the plurality of active patterns AP1, AP2, AP3, and AP4. The third back insulating pattern 103 and the fourth back insulating pattern 104 may be disposed under the plurality of sheet patterns NS1, NS2, NS3, and NS4. The third back insulating pattern 103 and the fourth back insulating pattern 104 may contain, e.g., at least one of silicon oxide, silicon nitride, silicon nitride, or a low dielectric constant material.

In some implementations, the third back insulating pattern 103 may contain a material having a tensile stress higher than that of the fourth back insulating pattern 104. For example, the third back insulating pattern 103 may contain silicon oxide having a tensile stress higher than that of the fourth back insulating pattern 104.

In some implementations, the fourth back insulating pattern 104 may contain a material having a compressive stress higher than that of the third back insulating pattern 103. For example, the fourth back insulating pattern 104 may contain silicon oxide having a compressive stress higher than that of the third back insulating pattern 103.

The first source/drain pattern 150 may be disposed on the third back insulating pattern 103 and may be in contact with the first sheet pattern NS1. The lower surface of the first source/drain pattern 150 may be in direct contact with the upper surface of the third back insulating pattern 103.

The second source/drain pattern 250 may be disposed on the fourth back insulating pattern 104 and may be in contact with the second sheet pattern NS2. The lower surface of the second source/drain pattern 250 may be in direct contact with the upper surface of the fourth back insulating pattern 104.

In some implementations, the first source/drain pattern 150 and the second source/drain pattern 250 may have different conductivity types. For example, the first source/drain pattern 150 may have N-type conductivity, and the second source/drain pattern 250 may have P-type conductivity. The first source/drain pattern 150 may include an N-type dopant, which may include at least one of phosphorus (P), arsenic (As), antimony (Sb), or bismuth (Bi), but is not limited thereto. The second source/drain pattern 250 may include a P-type dopant, which may include at least one of boron (B) or gallium (Ga), but is not limited thereto.

The lower surface of the gate insulating layer 130 may extend along the upper surfaces of the third back insulating pattern 103 and the fourth back insulating pattern 104, and may be in direct contact with the upper surfaces of the third back insulating pattern 103 and the fourth back insulating pattern 104.

In FIG. 13, the first back source/drain contact 172 may elongate in the third direction Z. The first back source/drain contact 172 may be electrically connected to the first source/drain pattern 150. The first back source/drain contact 172 may penetrate through the third back insulating pattern 103. The first back source/drain contact 172 may extend from the lower surface of the third back insulating pattern 103 to the first source/drain pattern 150. The side surface of the first back source/drain contact 172 may be surrounded by the third back insulating pattern 103. The second back source/drain contact 272 may penetrate through the fourth back insulating pattern 104. The second back source/drain contact 272 may extend from the lower surface of the fourth back insulating pattern 1044 to the second source/drain pattern 250. The side surface of the second back source/drain contact 272 may be surrounded by the fourth back insulating pattern 104. The first back contact silicide layer 157 may be disposed between the first back source/drain contact 172 and the first source/drain pattern 150, and the second back contact silicide layer 257 may be disposed between the second back source/drain contact 272 and the second source/drain pattern 250.

The first back wiring line 50 may be connected to the first back source/drain contact 172 or the second back source/drain contact 272. The first back source/drain contact 172 may connect the first back wiring line 50 and the first source/drain pattern 150, and the second back source/drain contact 272 may connect the first back wiring line 50 and the second source/drain pattern 250. Each of the first back source/drain contact 172 and the second back source/drain contact 272 may be connected to the first back wiring line 50 that is not electrically connected. In some implementations, the first back wiring line 50 may be a power line for supplying a power. In some implementations, the first back source/drain contact 172 and the second back source/drain contact 272 may be power transmission patterns for transmitting a power to the semiconductor device. The widths of the first back source/drain contact 172 and the second back source/drain contact 272 increase from the first source/drain pattern 150 and the second source/drain pattern 250 toward the bottom, respectively.

Figure 16:
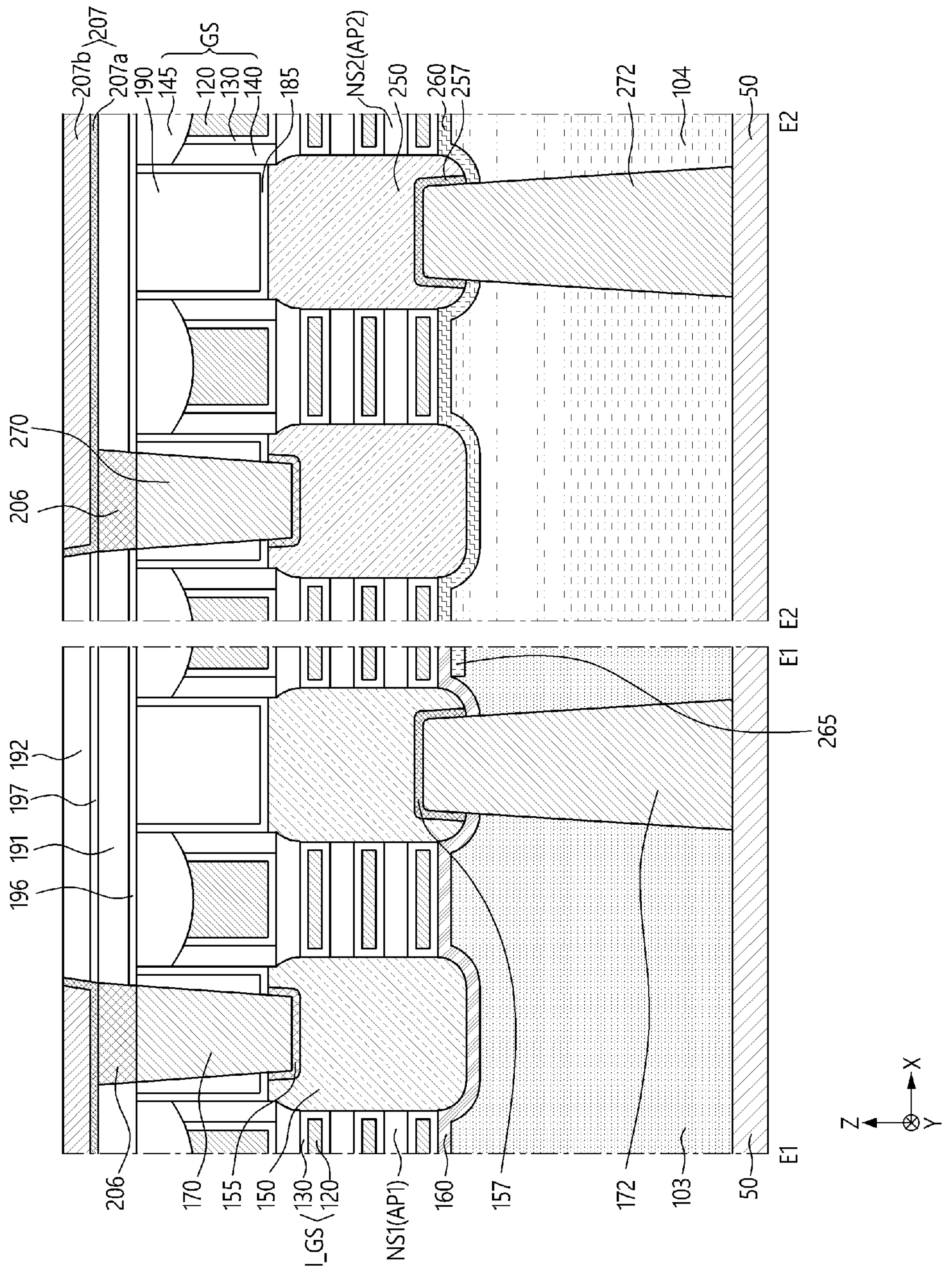
FIGS. 16 to 18 are diagrams illustrating an exemplary semiconductor device according to some implementations.
Figure 17:
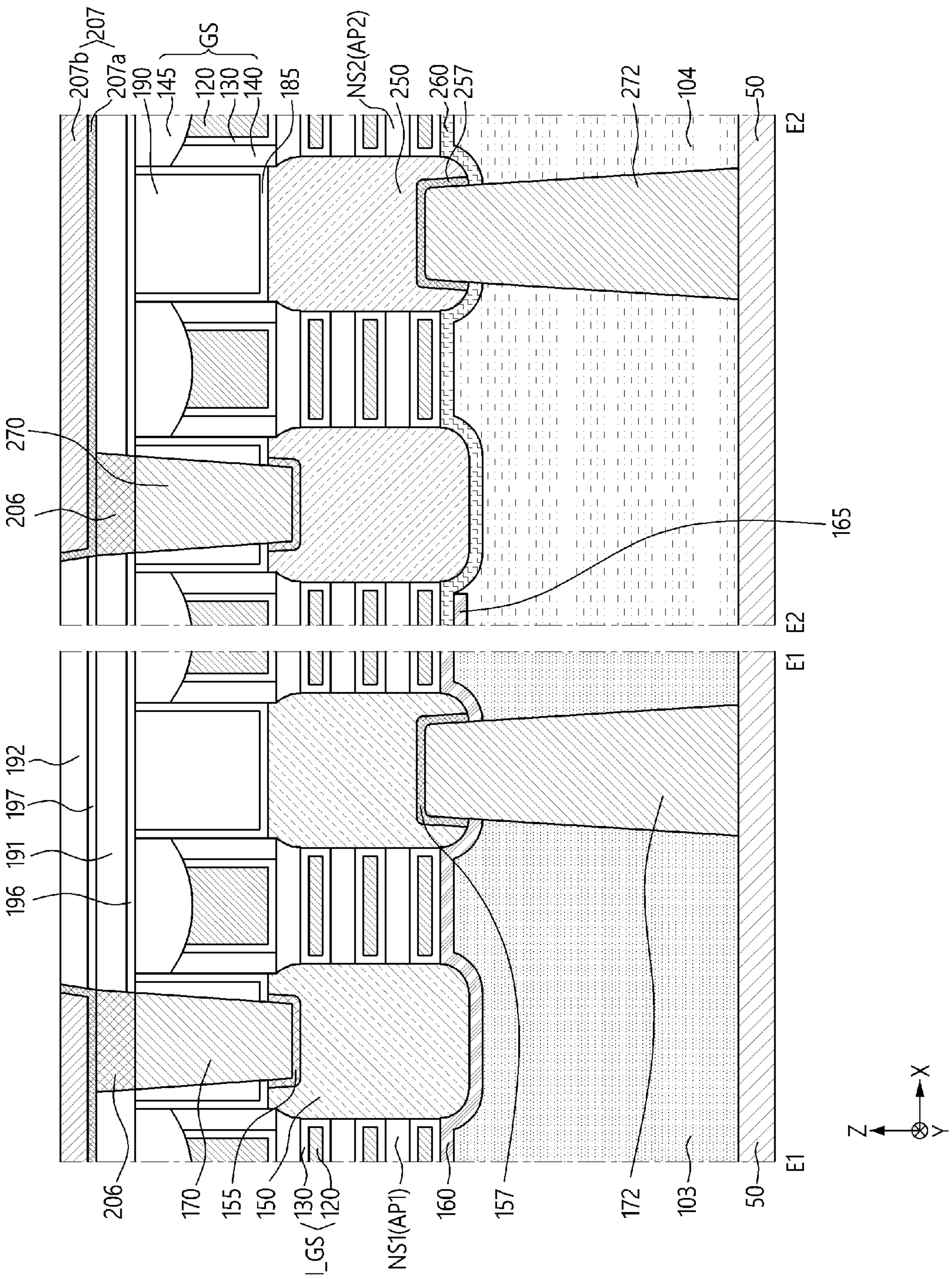
Figure 18:
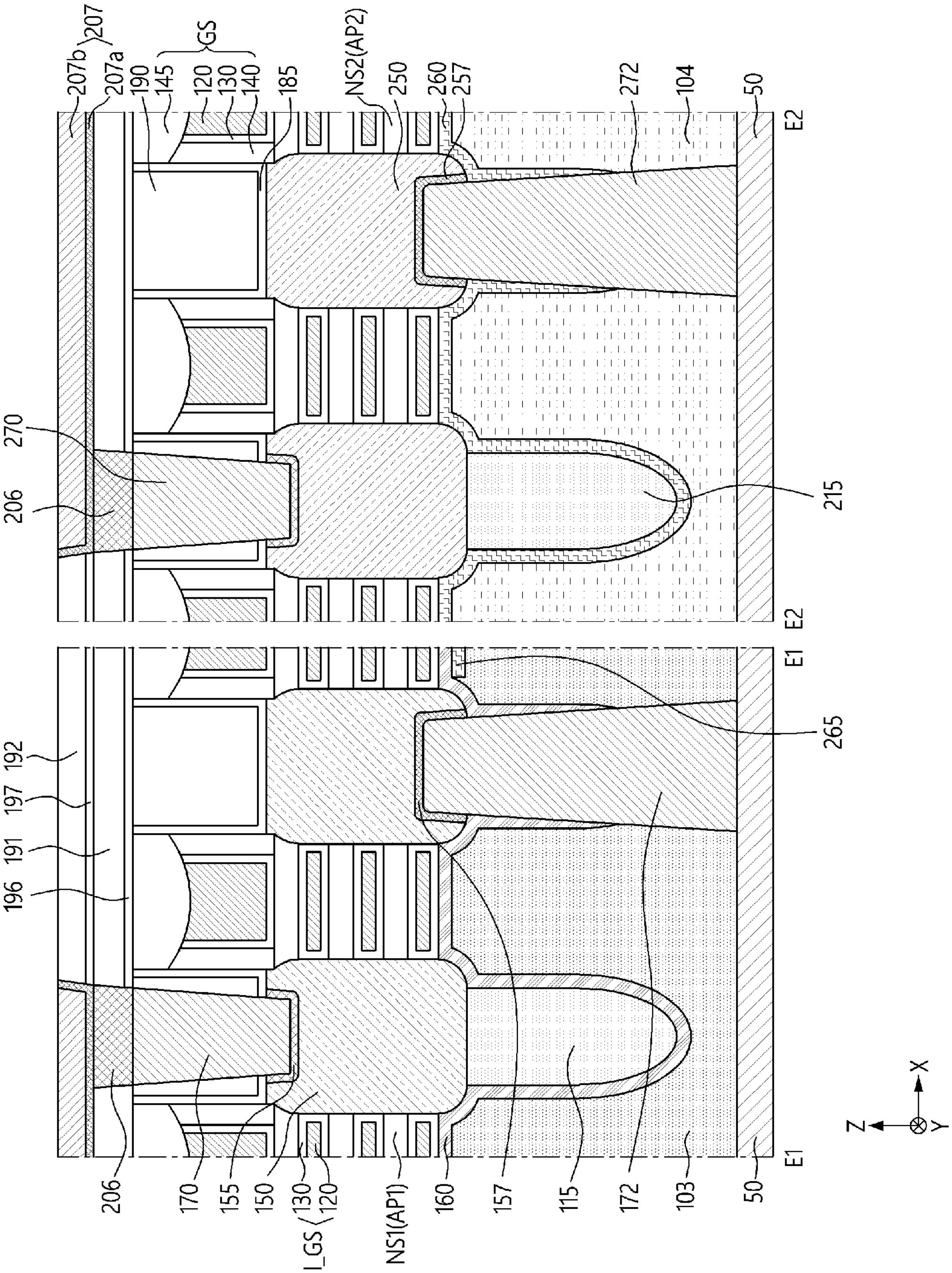

FIGS. 16 to 18 are diagrams illustrating an exemplary semiconductor device according to some implementations. For simplicity of description, the following description will focus on differences from the descriptions above with reference to FIGS. 12 to 15. In FIG. 16, the semiconductor device according to some implementations may include a first liner 160 and a second liner 260. The first liner 160 may extend along the upper surface of the third back insulating pattern 103 and may extend along the lower surface of the first source/drain pattern 150. The second liner 260 may extend along the upper surface of the fourth back insulating pattern 104 and may extend along the lower surface of the second source/drain pattern 250.

A first overlapping portion 265 may be disposed between the third back insulating pattern 103 and the first liner 160 and may overlap the terminal end of the first liner 160 on the third back insulating pattern 103. The first overlapping portion 265 may cover the lower surface of the terminal end of the first liner 160. In some implementations, the first overlapping portion 265 may contain the same material as that of the second liner 260.

In some implementations, the first liner 160 and the second liner 260 may contain materials having different magnitudes of the tensile stress and the compressive stress. For example, the first liner 160 may have a tensile stress higher than that the second liner 260. The first liner 160 may contain silicon nitride having a tensile stress higher than that of the second liner 260. The second liner 260 may have a compressive stress higher than that of the first liner 160. The second liner 260 may contain silicon nitride having a compressive stress higher than that of the first liner 160. Additionally, the first back source/drain contact 172 may penetrate the first liner 160, and the second back source/drain contact 272 may penetrate the second liner 260.

In FIG. 17, the semiconductor device according to some implementations may include a second overlapping portion 165. The second overlapping portion 165 may be disposed between the fourth back insulating pattern 104 and the second liner 260, and may overlap the terminal end of the second liner 260 on the fourth back insulating pattern 104. The second overlapping portion 165 may cover the lower surface of the terminal end of the second liner 260. In some implementations, the second overlapping portion 165 may contain the same material as that of the first liner 160.

In FIG. 18, a semiconductor device according to some implementations may include a first supporter 115 and a second supporter 215. The first supporter 115 may be disposed in the third back insulating pattern 103, and may be disposed under the first source/drain pattern 150 to which the first back source/drain contact 172 is not connected on the third back insulating pattern 103. The first supporter 115 may be in contact with the lower surface of the first source/drain pattern 150 and may be surrounded by the first liner 160.

The second supporter 215 may be disposed in the fourth back insulating pattern 104, and may be disposed under the second source/drain pattern 250 to which the second back source/drain contact 272 is not connected on the fourth back insulating pattern 104. The second supporter 215 may be in contact with the lower surface of the second source/drain pattern 250 and may be surrounded by the first liner 260. In some implementations, the first supporter 115 and the second supporter 215 may contain, for example, silicon germanium. The first liner 160 may extend along the side surface of the first supporter 115, and the second liner 260 may extend along the side surface of the second supporter 215.

FIGS. 19 to 25 are views illustrating of an exemplary method for fabricating a semiconductor device according to some implementations. For reference, FIGS. 19 to 25 are diagrams illustrating an exemplary method for fabricating the semiconductor device shown in FIG. 5.

Figure 19:
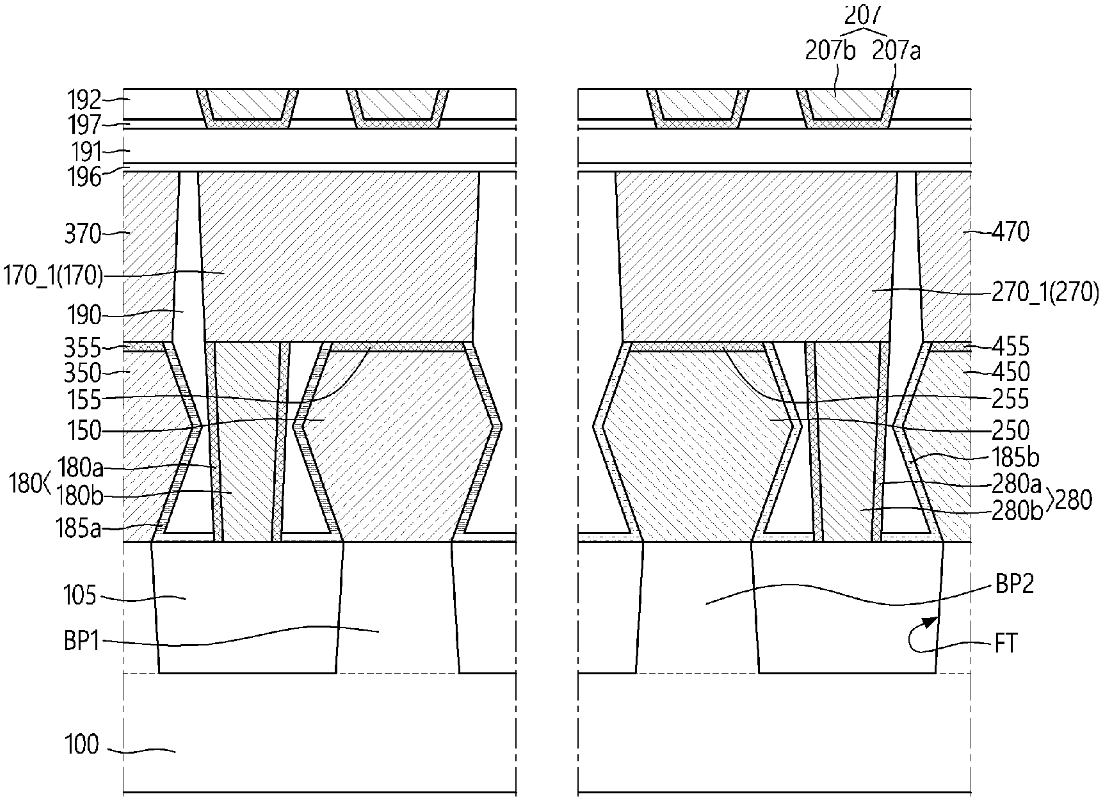
FIGS. 19 to 25 are views illustrating steps of an exemplary method for fabricating a semiconductor device according to some implementations.

In FIG. 19, lower patterns BP1 and BP2 are formed on a substrate 100. Next, the source/drain patterns 150, 250, 350, and 450 are formed on the lower patterns BP1 and BP2.

In some implementations, the substrate 100 may be made of a semiconductor material or may include a semiconductor material. For example, the substrate 100 may be a silicon substrate or silicon-on-insulator (SOI) substrate. Alternatively, the substrate 100 may include, for example, silicon germanium, silicon germanium on insulator (SGOI), indium antimonide, a lead tellurium compound, indium arsenide, indium phosphide, gallium arsenide, or gallium antimonide. However, the substrate 100 is not limited to these materials.

Each of the lower patterns BP1 and BP2 may be formed by etching a part of the substrate 100, or may include an epitaxial layer grown from the substrate 100. Each of the lower patterns BP1 and BP2 may include silicon or germanium, each of which is an elemental semiconductor material. In addition, each of the lower patterns BP1 and BP2 may include a compound semiconductor, for example, a group IV-IV compound semiconductor or a group III-V compound semiconductor.

In some implementations, the group IV-IV compound semiconductor may be a binary compound or a ternary compound including at least two elements selected from the group consisting of carbon (C), silicon (Si), germanium (Ge) and tin (Sn), or the above-mentioned compound doped with a group IV element. In some implementations, the group III-V compound semiconductor may be, for example, a binary compound, a ternary compound or a quaternary compound formed by combining at least one of aluminum (Al), gallium (Ga) and indium (In) which are group III elements with one of phosphorus (P), arsenic (As) and antimonium (Sb) which are group V elements.

Before the source/drain patterns 150, 250, 350, and 450 are formed, a gate spacer 140 (see FIGS. 2 and 3) may be formed on the first lower pattern BP1. The field insulating layer 105 is formed between the lower patterns BP1 and BP2 and is spaced apart from each other in the second direction Y.

The first source/drain pattern 150 may have N-type conductivity, in which the first source/drain pattern 150 may include an N-type dopant. The second source/drain pattern 250 may have P-type conductivity, in which the second source/drain pattern 250 may include a P-type dopant.

The first source/drain etch stop layer **185*a* is formed on the first source/drain pattern 150 and the third source/drain pattern 350 and may extend along the upper surface of the field insulating layer 105 and the upper surfaces of the first source/drain pattern 150 and the third source/drain pattern 350. The second source/drain etch stop layer 185*b* is formed on the second source/drain pattern 250 and the fourth source/drain pattern 450 and may extend along the upper surface of the field insulating layer 105 and the upper surfaces of the second source/drain pattern 250 and the fourth source/drain pattern 450**.

In some implementations, the first source/drain etch stop layer **185*a* may contain a material having a tensile stress higher than that of the second source/drain etch stop layer 185*b*. For example, the first source/drain etch stop layer 185*a* may contain silicon nitride having a tensile stress higher than that of the second source/drain etch stop layer 185*b*. In some implementations, the second source/drain etch stop layer 185*b* may contain a material having a compressive stress higher than that of the first source/drain etch stop layer 185*a*. For example, the second source/drain etch stop layer 185*b* may contain silicon nitride having a compressive stress higher than that of the first source/drain etch stop layer 185*a***.

In some implementations, the environments in which the first source/drain etch stop layer **185*a* and the second source/drain etch stop layer 185*b* are formed may be different from each other. For example, the level of the low frequency (LF) power at which the first source/drain etch stop layer 185*a* is formed and the level of the LF power at which the second source/drain etch stop layer 185*b* is formed may be different from each other. The LF power level may be higher when the second source/drain etch stop layer 185*b* is formed than when the first source/drain etch stop layer 185*a* is formed. For another example, the concentration of a processing gas provided when the first source/drain etch stop layer 185*a* is formed and the concentration of the processing gas provided when the second source/drain etch stop layer 185*b* is formed may be different from each other. The concentration of the processing gas containing hydrogen may be higher when the second source/drain etch stop layer 185*b* is formed than when the first source/drain etch stop layer 185*a*** is formed.

Although not shown, when the first source/drain etch stop layer **185*a* is formed on the first source/drain pattern 150 and the third source/drain pattern 350, a mask may be formed on the second source/drain pattern 250 and the fourth source/drain pattern 450. Accordingly, the first source/drain etch stop layer 185*a* may not be formed on the second source/drain pattern 250 and the fourth source/drain pattern 450. Similarly, when the second source/drain etch stop layer 185*b* is formed on the second source/drain pattern 250 and the fourth source/drain pattern 450, a mask may be formed on the first source/drain pattern 150 and the third source/drain pattern 350. Accordingly, the second source/drain etch stop layer 185*b* may not be formed on the first source/drain pattern 150 and the third source/drain pattern 350**.

Next, the second upper interlayer insulating layer 191 is formed on the source/drain patterns 150, 250, 350, and 450. Then, the first sheet pattern NS1 (see FIGS. 2 and 3) is formed on the first lower pattern BP1. Accordingly, the first active pattern AP1 is formed on the upper surface of the substrate 100.

In some implementations, each of the sheet patterns NS1, NS2, NS3, and NS4 (see FIGS. 2 and 3) may include any one of silicon or germanium as an elemental semiconductor material, a group IV-IV compound semiconductor, and a group III-V compound semiconductor. For example, for the first sheet pattern NS1 (see FIG. 2), the width of the first sheet pattern NS1 (see FIG. 2) in the second direction Y may increase or decrease in proportion to the width of the first lower pattern BP1 in the second direction Y. Although it is illustrated that the widths in the second direction Y of the first sheet patterns NS1 (see FIG. 2) disposed on the first lower pattern BP1 are the same, such arrangement is not limited thereto.

Next, the gate electrode 120 (see FIGS. 2 and 3) and the gate insulating layer 130 (see FIGS. 2 and 3) surrounding the first sheet pattern NS1 (see FIGS. 2 and 3) may be formed on the first lower pattern BP1. The gate capping layer 145 (see FIGS. 2 and 3) may be formed on the gate electrode 120 (see FIGS. 2 and 3). Accordingly, the gate structure GS (see FIGS. 2 and 3) may be formed on the first active pattern AP1. The height from the upper surface of the first active pattern AP1 to the upper surface 145US (see FIGS. 2 and 3) of the gate capping layer may be the same as the height from the upper surface of the first active pattern AP1 to the upper surface of the first upper interlayer insulating layer 190.

Next, the first contact connection via 180 and the second contact connection via 280 penetrating the first upper interlayer insulating layer 190 are formed. The first contact connection via 180 may penetrate the first upper interlayer insulating layer 190 between the first source/drain pattern 150 and the third source/drain pattern 350. The first contact connection via 180 may extend to the upper surface of the field insulating layer 105 while penetrating the first upper interlayer insulating layer 190 and the first source/drain etch stop layer 185*a*. The second contact connection via 280 may penetrate the first upper interlayer insulating layer 190 between the second source/drain pattern 250 and the fourth source/drain pattern 450. The second contact connection via 280 may extend to the upper surface of the field insulating layer 105 while penetrating the first upper interlayer insulating layer 190 and the second source/drain etch stop layer 185*b*.

Next, the front source/drain contacts 170, 270, 370, and 470 are formed on the source/drain patterns 150, 250, 350, and 450, respectively. The first front source/drain contact 170 may be formed on the first contact connection via 180 and the first source/drain pattern 150. The second front source/drain contact 270 may be formed on the second contact connection via 280 and the second source/drain pattern 250.

Next, the first etch stop layer 196, the second upper interlayer insulating layer 191, the second etch stop layer 197, and the third upper interlayer insulating layer 192 are sequentially formed. The front wiring via 206 (see FIGS. 2 and 3) may be formed in the first etch stop layer 196 and the second upper interlayer insulating layer 191. The front wiring line 207 may be formed in the second etch stop layer 197 and the third upper interlayer insulating layer 192.

Figure 20:
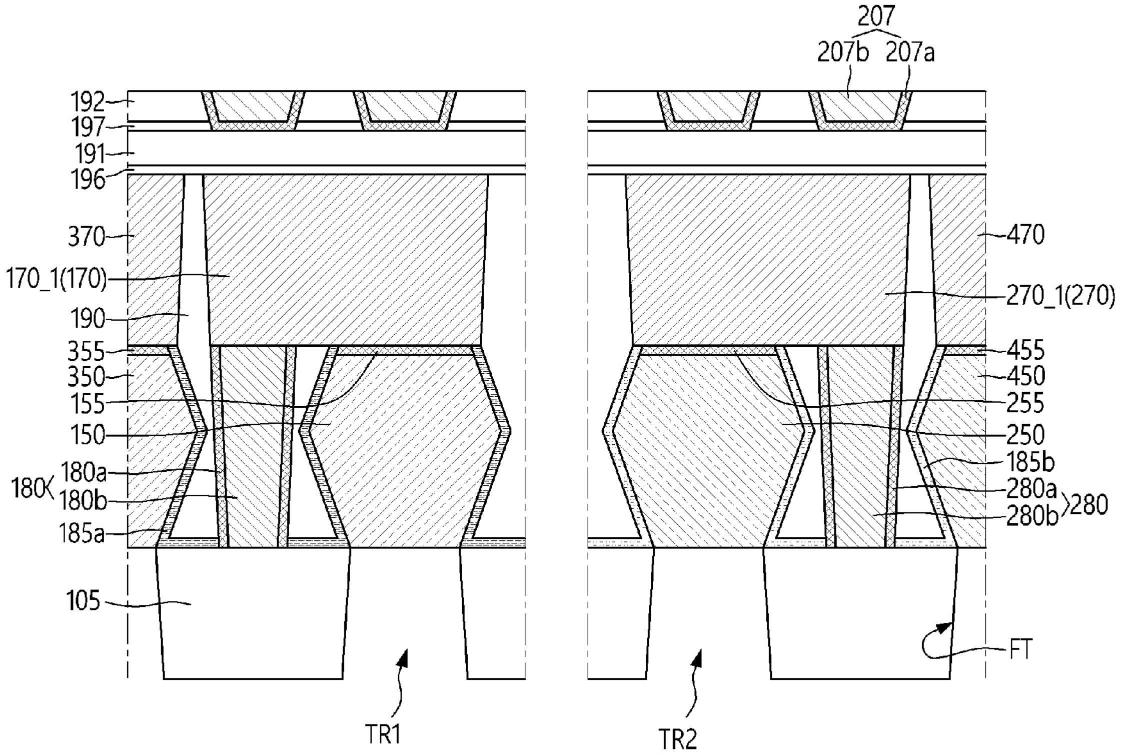

In FIG. 20, the substrate 100 and the lower patterns BP1 and BP2 are removed. The lower surface and the side surface of the field insulating layer 105 may be exposed by the removal of the substrate 100 and the lower patterns BP1 and BP2. A first trench TR1 and a second trench TR2 are formed by the removal of the lower patterns BP1 and BP2. The lower surfaces of the source/drain patterns 150, 250, 350, and 450 may be exposed through the first trench TR1 and the second trench TR2.

Figure 21:
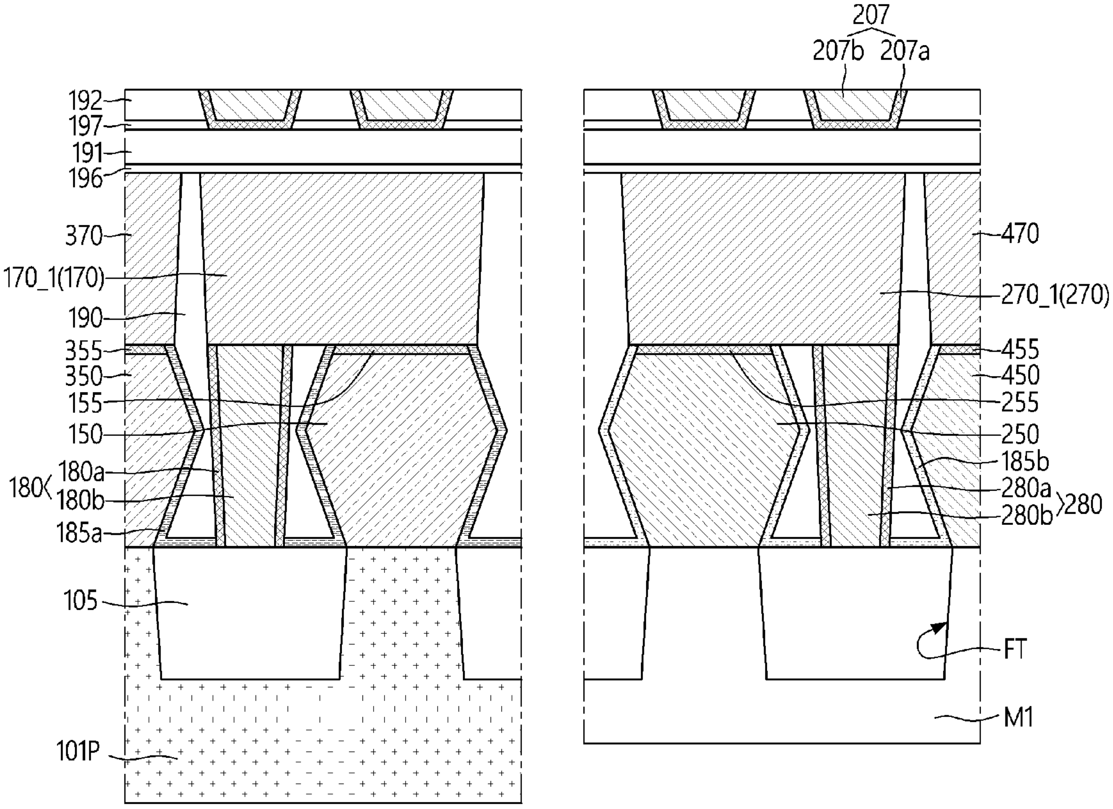

In FIG. 21, a first pre-back insulating pattern 101P is formed on the first source/drain pattern 150 and the third source/drain pattern 350. The first pre-back insulating pattern 101P may fill the first trench TR1 (see FIG. 20). A first mask M1 may be formed on the second source/drain pattern 250 and the fourth source/drain pattern 450. The first mask M1 may fill the second trench TR2 (see FIG. 20). The first pre-back insulating pattern 101P may not be formed on the second source/drain pattern 250 and the fourth source/drain pattern 450 by the first mask M1.

Figure 22:
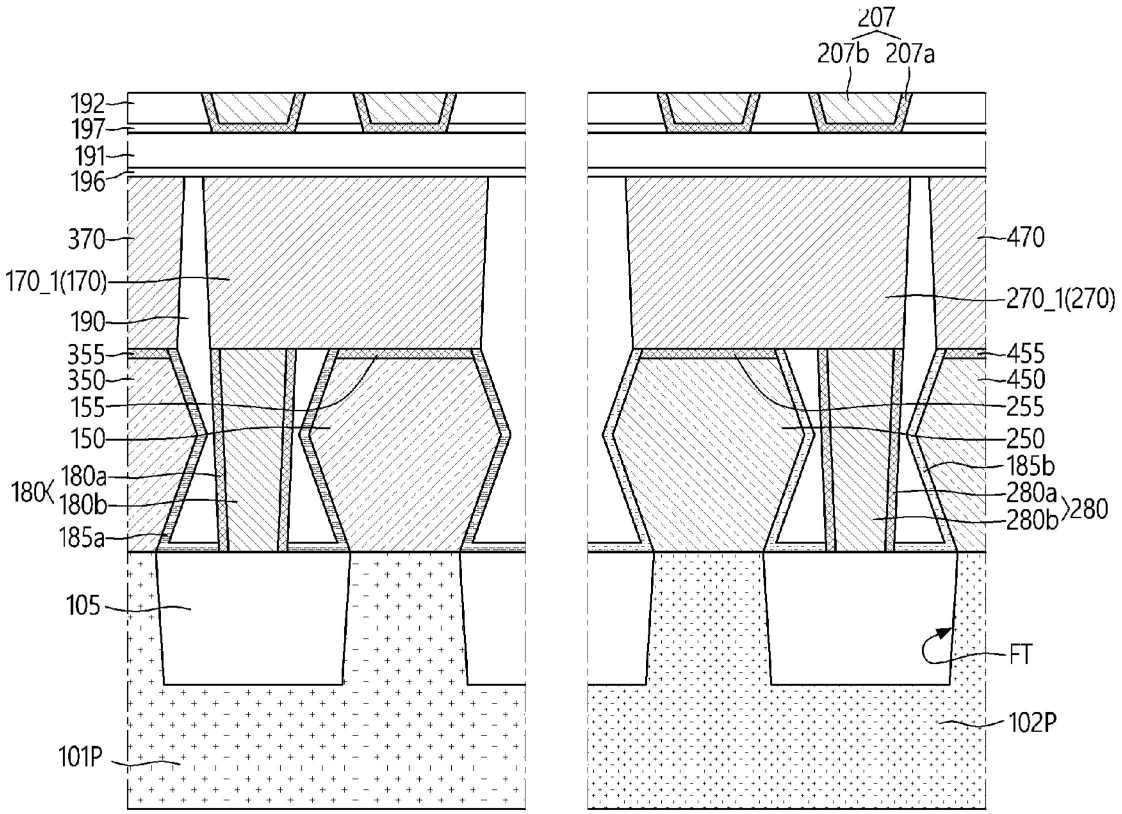

In FIG. 22, the first mask M1 (see FIG. 21) is removed, and a second pre-back insulating pattern 102P is formed on the second source/drain pattern 250 and the fourth source/drain pattern 450. The second pre-back insulating pattern 102P may fill the second trench TR2 (see FIG. 20).

For example, the first pre-back insulating pattern 101P may contain silicon oxide having a tensile stress higher than that of the second pre-back insulating pattern 102P. The second pre-back insulating pattern 102P may contain silicon oxide having a compressive stress higher than that of the first pre-back insulating pattern 101P.

In some implementations, the environments in which the first pre-back insulating pattern 101P and the second pre-back insulating pattern 102P are formed may be different from each other. For example, the LF power level at which the first pre-back insulating pattern 101P is formed and the LF power level at which the second pre-back insulating pattern 102P is formed may be different from each other. The LF power level may be higher when the second pre-back insulating pattern 102P is formed than when the first pre-back insulating pattern 101P is formed. For another example, the concentration of the processing gas provided when the first pre-back insulating pattern 101P is formed and the concentration of the processing gas provided when the second pre-back insulating pattern 102P is formed may be different from each other. The concentration of the processing gas containing hydrogen may be higher when the second pre-back insulating pattern 102P is formed than when the first pre-back insulating pattern 101P is formed.

Figure 23:
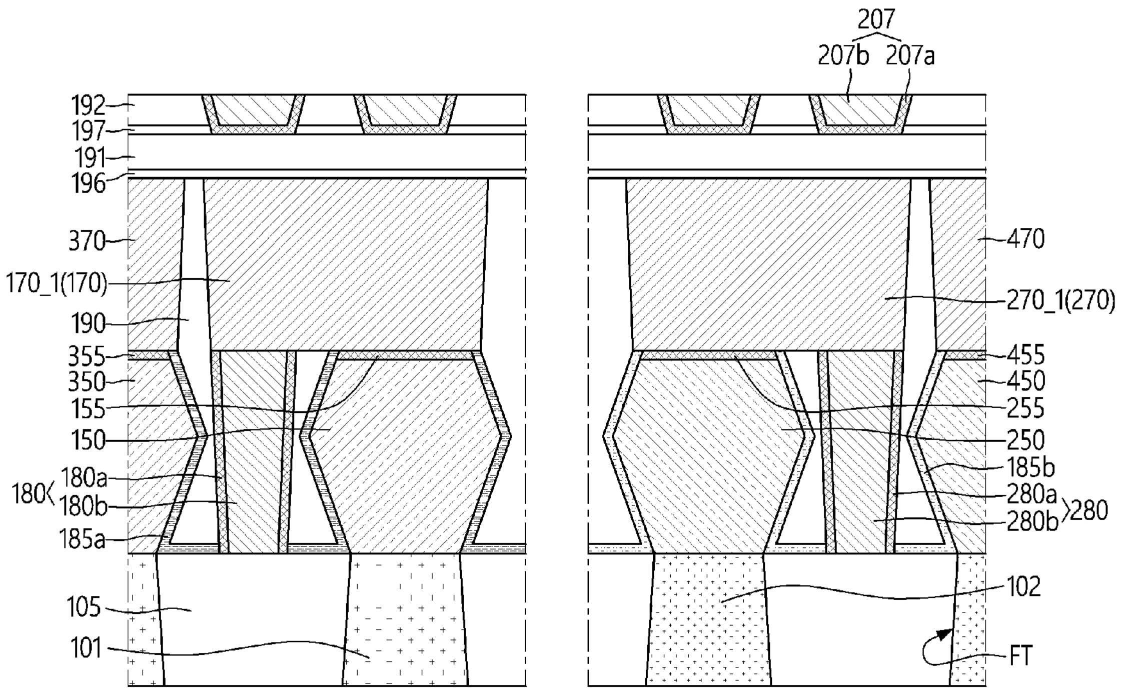

In FIG. 23, the first back insulating pattern 101 and the second back insulating pattern 102 may be formed by removing a part of the first pre-back insulating pattern 101P and a part of the second pre-back insulating pattern 102P. The first pre-back insulating pattern 101P and the second pre-back insulating pattern 102P may be removed from the lower surfaces of the first pre-back insulating pattern 101P and the second pre-back insulating pattern 102P until the lower surface of the field insulating layer 105 is exposed. The first back insulating pattern 101 and the second back insulating pattern 102 may be in contact with the source/drain patterns 150, 250, 350, and 450. The side surfaces of the first back insulating pattern 101 and the second back insulating pattern 102 may be surrounded by the field insulating layer 105.

Figure 24:
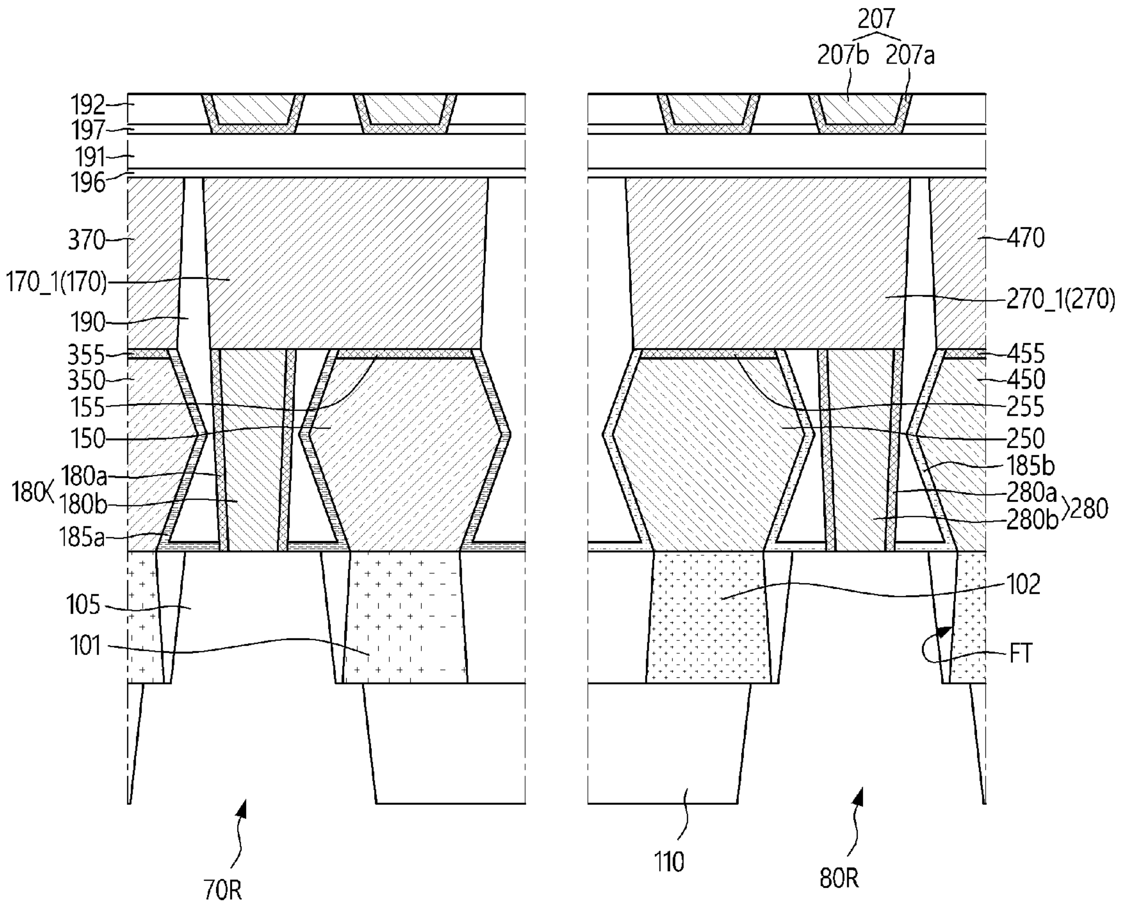

In FIG. 24, a first buried conductive pattern recess 70R and a second buried conductive pattern recess 80R are formed. The first buried conductive pattern recess 70R may be formed between the first back insulating patterns 101 and may expose the lower surface of the first contact connection via 180. The first buried conductive pattern recess 70R may penetrate the field insulating layer 105 and the first back interlayer insulating layer 110.

The second buried conductive pattern recess 80R may be formed between the second back insulating patterns 102 and may expose the lower surface of the second contact connection via 280. The second buried conductive pattern recess 80R may penetrate the field insulating layer 105 and the first back interlayer insulating layer 110.

Figure 25:
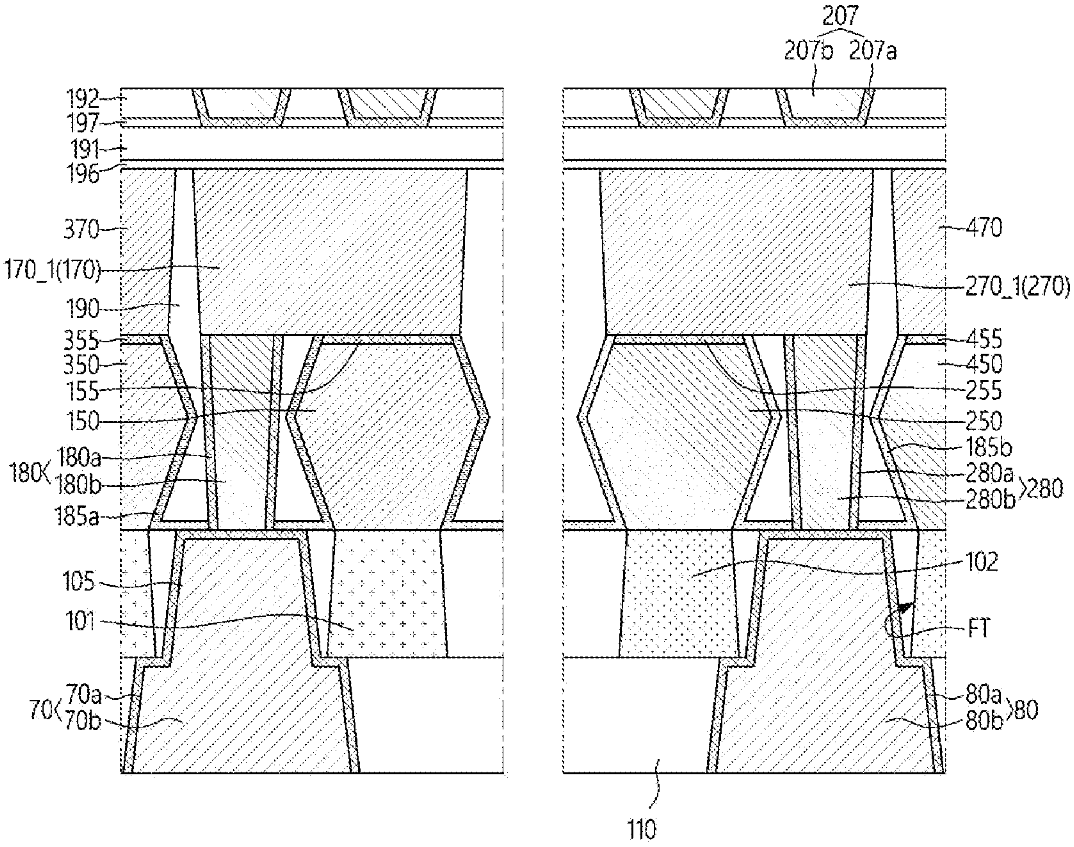

In FIG. 25, the first buried conductive pattern 70 and the second buried conductive pattern 80 are formed. The first buried conductive pattern 70 may be formed in the first buried conductive pattern recess 70R (see FIG. 24) and may be connected to the first contact connection via 180. The second buried conductive pattern 80 may be formed in the second buried conductive pattern recess 80R (FIG. 24) and may be connected to the second contact connection via 280.

Next, referring to FIG. 5, the second back interlayer insulating layer 290 and the first back wiring line 50 are formed on the first buried conductive pattern 70 and the second buried conductive pattern 80.

Figure 26:
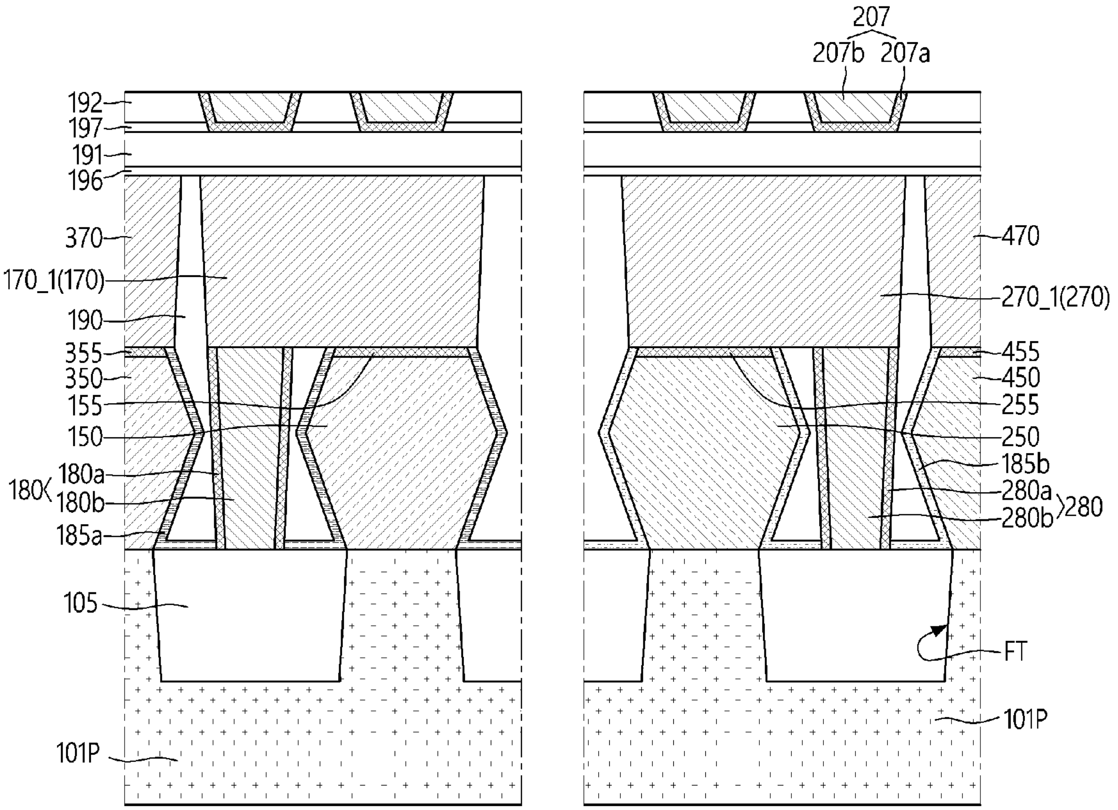
FIGS. 26 to 29 are views illustrating steps of an exemplary method for fabricating a semiconductor device according to some implementations.

FIGS. 26 to 29 are views illustrating steps of an exemplary method for fabricating a semiconductor device according to some implementations. For reference, FIG. 26 is a diagram for describing the steps after FIG. 20. For simplicity of description, the following description will focus on differences from the description with reference to FIGS. 19 to 25. In FIGS. 20 and 26, the first pre-back insulating pattern 101P is formed. For example, the first pre-back insulating pattern 101P may fill the first trench TR1 (see FIG. 20) and the second trench TR2 (see FIG. 20). The first pre-back insulating pattern 101P may be formed on the first source/drain pattern 150, the second source/drain pattern 250, the third source/drain pattern 350, and the fourth source/drain pattern 450.

Figure 27:
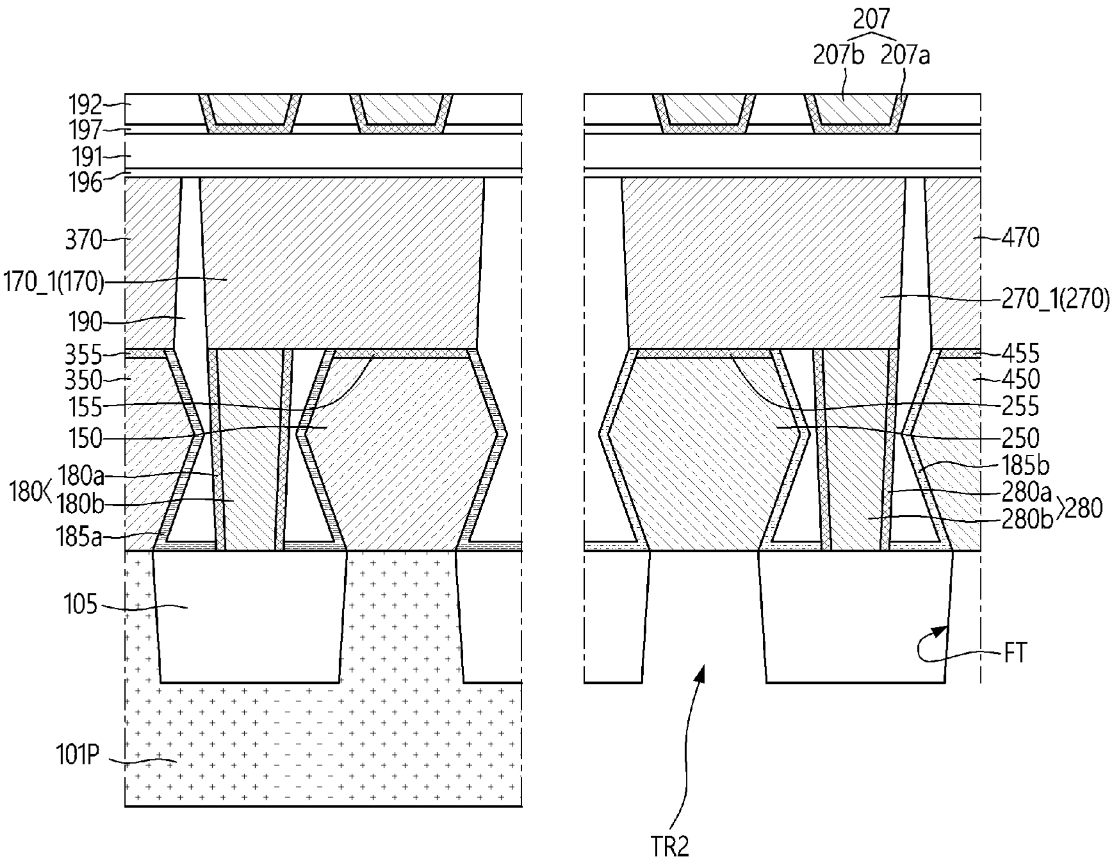

In FIG. 27, the first pre-back insulating pattern 101P formed on the third source/drain pattern 350 and the fourth source/drain pattern 450 is removed. The second trench TR2 may be formed again by the removal of the first pre-back insulating pattern 101P formed on the third source/drain pattern 350 and the fourth source/drain pattern 450. The lower surfaces of the third source/drain pattern 350 and the fourth source/drain pattern 450 may be exposed into the second trench TR2.

Figure 28:
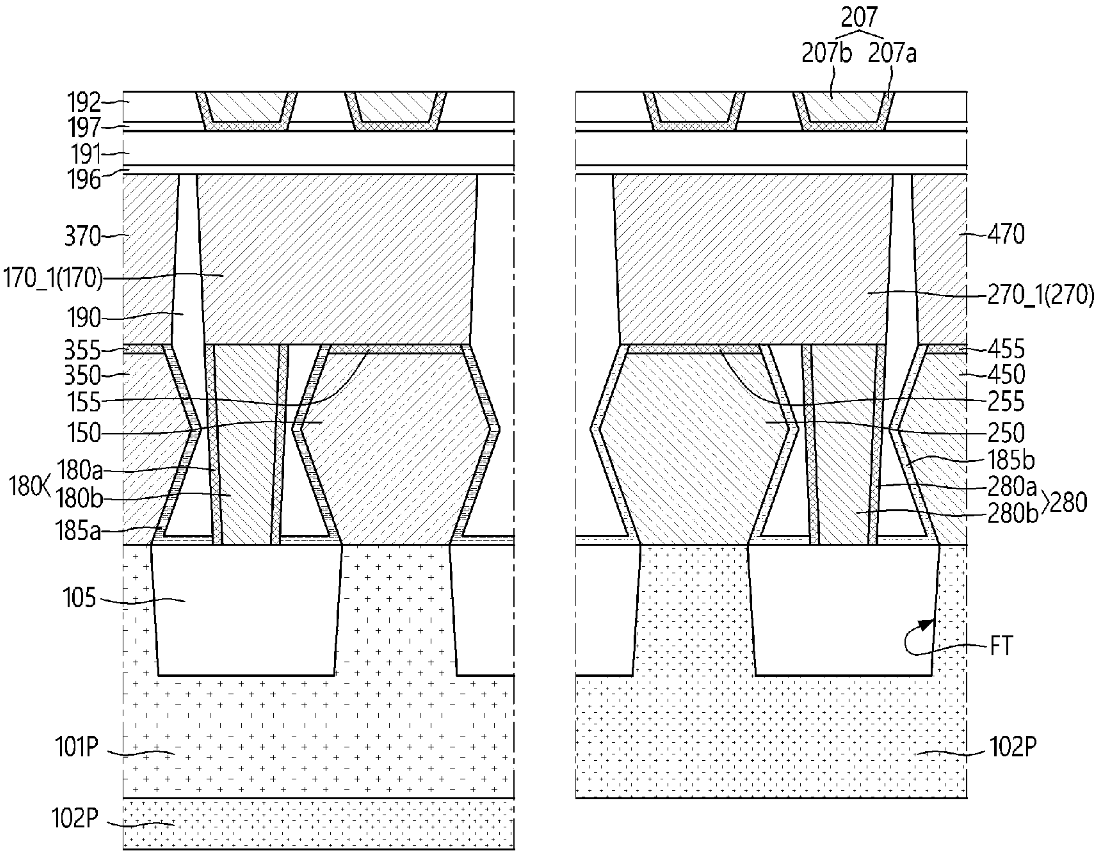

In FIG. 28, the second pre-back insulating pattern 102P is formed. The second pre-back insulating pattern 102P may fill the second trench TR2 and may cover the lower surface of the first pre-back insulating pattern 101P.

Figure 29:
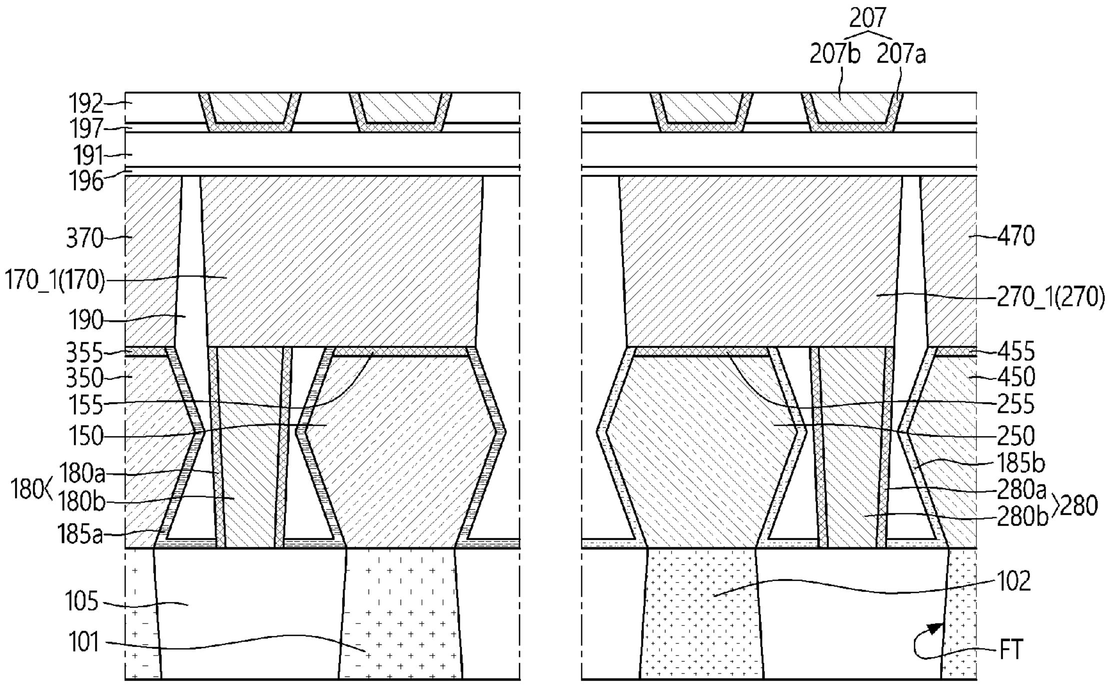

In FIG. 29, the first back insulating pattern 101 and the second back insulating pattern 102 may be formed by partially removing the first pre-back insulating pattern 101P and the second pre-back insulating pattern 102P. The first pre-back insulating pattern 101P and the second pre-back insulating pattern 102P may be removed from the lower surface of the second pre-back insulating pattern 102P until the lower surface of the field insulating layer 105 is exposed.

In some implementations, steps after FIG. 29 may be the same as those in FIGS. 24 and 25, so that the description thereof will be omitted.

FIGS. 30 to 39 are views illustrating steps of an exemplary method for fabricating a semiconductor device according to some implementations. For reference, FIGS. 30 to 39 are diagrams illustrating a method for fabricating the semiconductor device shown in FIG. 16. For simplicity of description, the following description will focus on differences from the descriptions above with reference to FIGS. 19 to 25.

Figure 30:
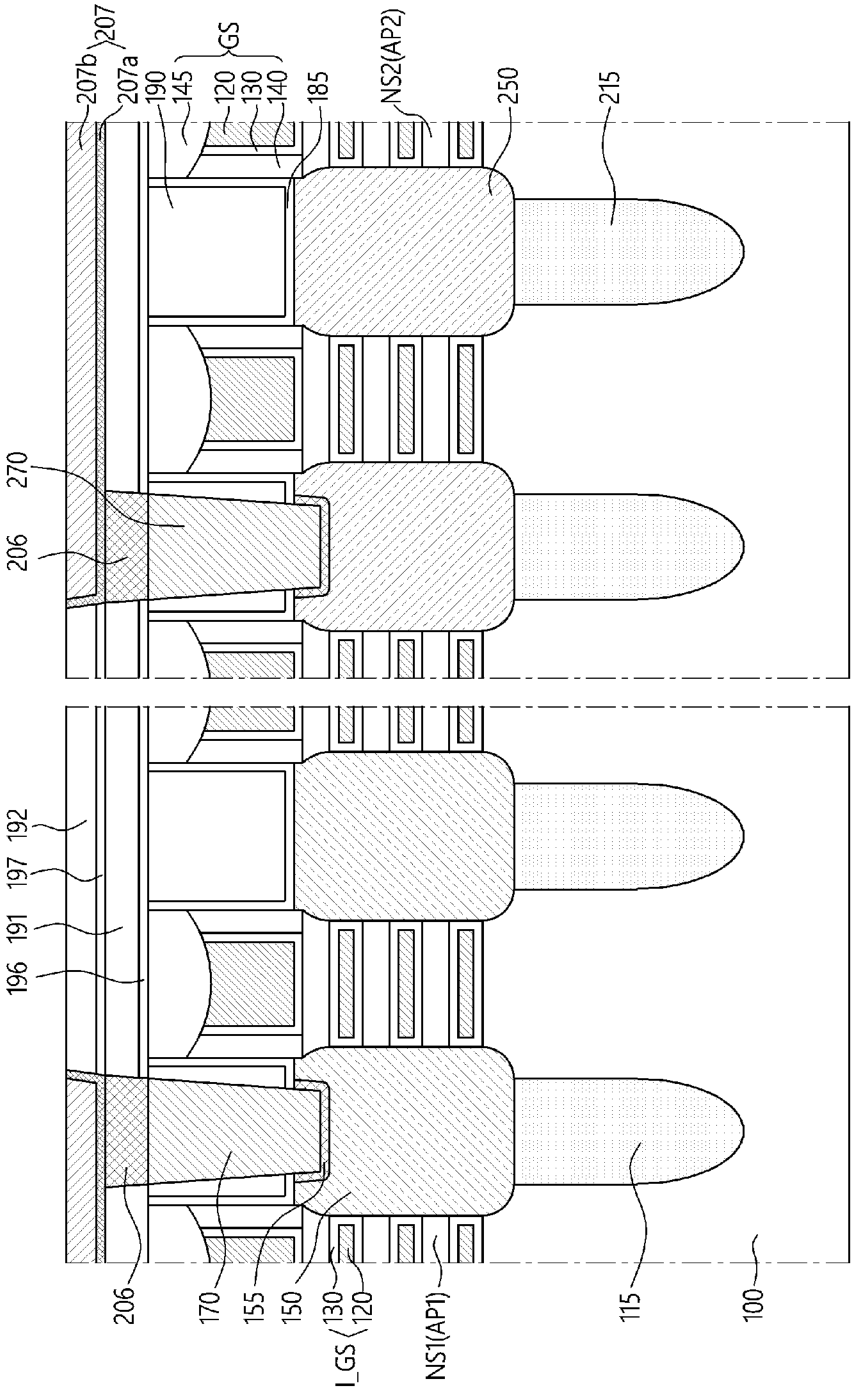
FIGS. 30 to 39 are views illustrating steps of an exemplary method for fabricating a semiconductor device according to some implementations.

In FIG. 30, the first supporter 115 and the second supporter 215 may be formed on the substrate 100. Alternatively, the first supporter 115 and the second supporter 215 may be disposed in the substrate 100.

Next, the first source/drain pattern 150 and the second source/drain pattern 250 are formed on the first supporter 115 and the second supporter 215. Then, the first sheet pattern NS1 and the second sheet pattern NS2 are formed on the substrate 100, and the gate electrode 120 and the gate insulating layer 130 surrounding the first sheet pattern NS1 and the second sheet pattern NS2 are formed. Next, the first front source/drain contact 170 and the second front source/drain contact 270 are formed on the first source/drain pattern 150 and the second source/drain pattern 250, respectively, and the first etch stop layer 196, the second upper interlayer insulating layer 191, the second etch stop layer 197, and the third upper interlayer insulating layer 192 are sequentially formed.

Figure 31:
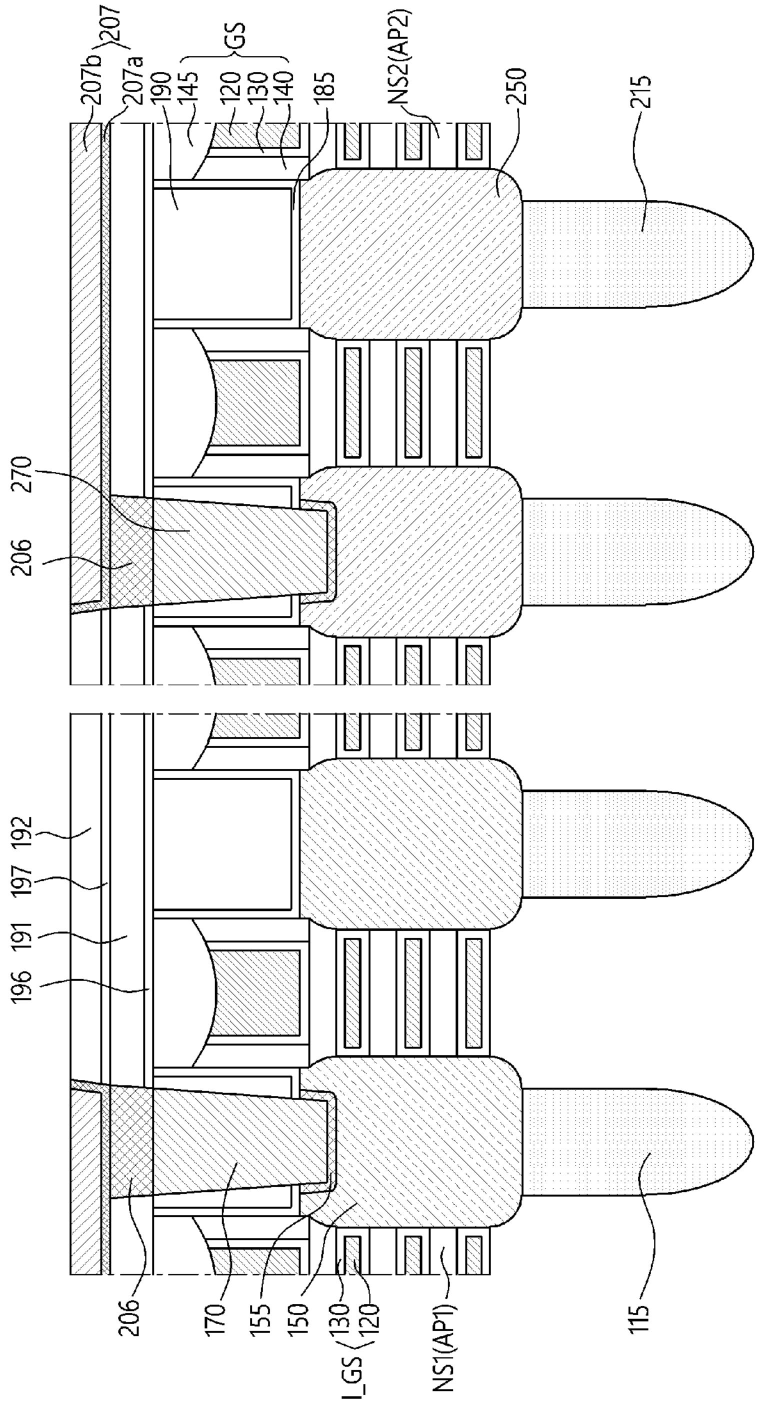

In FIG. 31, the substrate 100 (see FIG. 30) is removed. Due to the removal of the substrate 100 (see FIG. 30), the lower surface of the gate insulating layer 130, the first supporter 115, the second supporter 215, the first source/drain pattern 150, and the second source/drain pattern 250 may be exposed.

Figure 32:
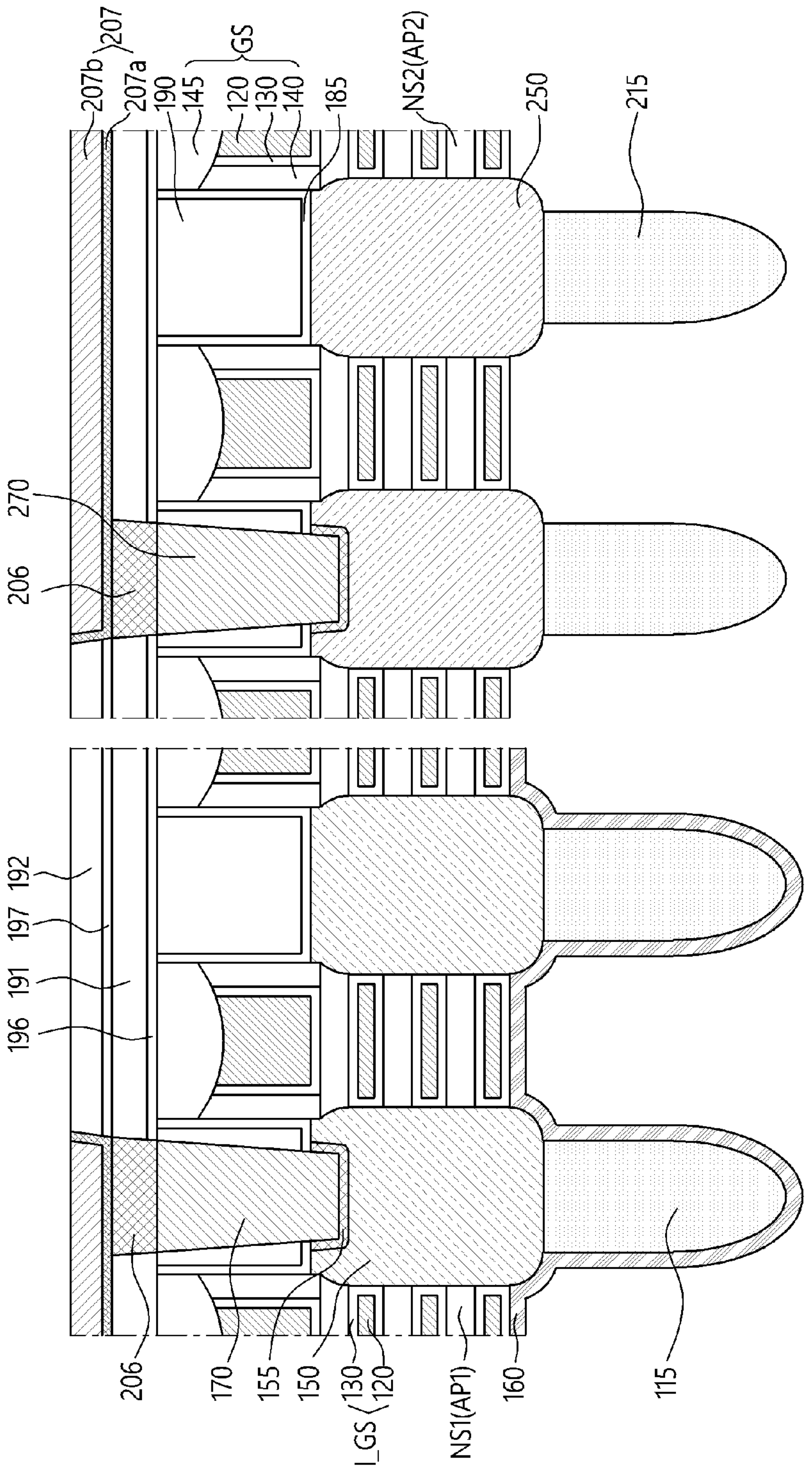

In FIG. 32, the first liner 160 is formed. The first liner 160 may be formed on the first source/drain pattern 150. The first liner 160 may extend along the first source/drain pattern 150, the lower surface of the gate insulating layer 130, and the profile of the first supporter 115. The first liner 160 may not be formed on the second source/drain pattern 250.

Figure 33:
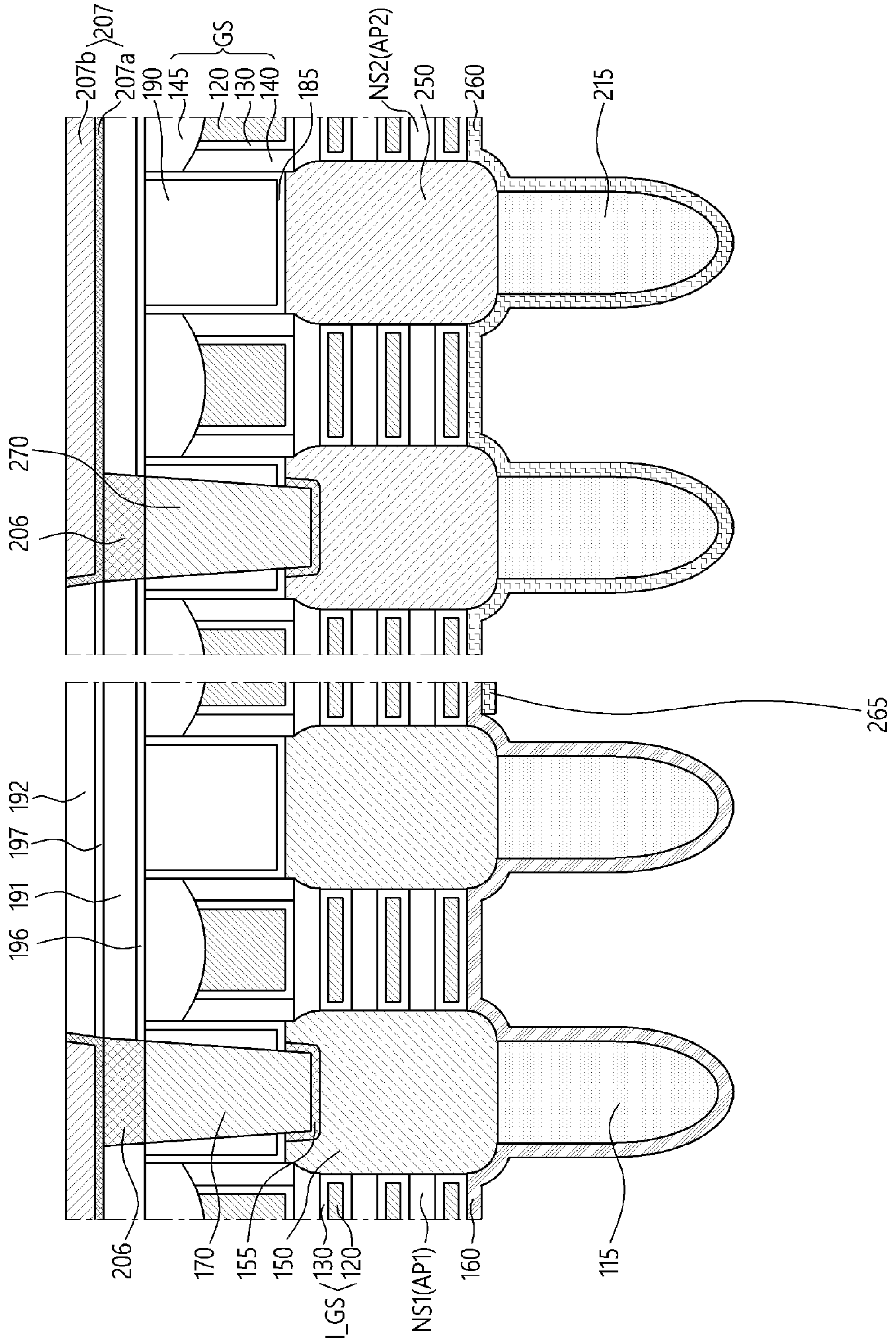

Referring to FIG. 33, the second liner 260 is formed.

The second liner 260 may be formed on the second source/drain pattern 250. The second liner 260 may extend along the second source/drain pattern 250, the lower surface of the gate insulating layer 130, and the profile of the second supporter 215. The second liner 260 may not be formed on the first source/drain pattern 150. The second liner 260 may partially overlap the terminal end of the first liner 160. Accordingly, the first overlapping portion 265 may be formed on the terminal end of the first liner 160. The first overlapping portion 265 may be substantially the same as the second liner 260.

In some implementations, the first liner 160 and the second liner 260 may have different magnitudes of the tensile stress and the compressive stress. For example, the first liner 160 may have a tensile stress higher than that of the second liner 260, and the second liner 260 may have a compressive stress higher than that of the first liner 160. Even if both the first liner 160 and the second liner 260 contain silicon nitride, the first liner 160 may contain silicon nitride having a tensile stress higher than that of the second liner 260, and the second liner 260 may contain silicon nitride having a compressive stress higher than that of the first liner 160.

In some implementations, the environments in which the first liner 160 and the second liner 260 are formed may be different from each other. For example, when the second liner 260 is formed, the LF power may further increase. The LF power level at which the first liner 160 is deposited on the first source/drain pattern 150 may be further higher than the LF power level at which the second liner 260 is deposited on the second source/drain pattern 250. For another example, the concentration of the processing gas provided when the first liner 160 is formed and the concentration of the processing gas provided when the second liner 260 is formed may be different from each other. The concentration of the processing gas containing hydrogen may be higher when the second liner 260 is formed than when the first liner 160 is formed.

Figure 34:
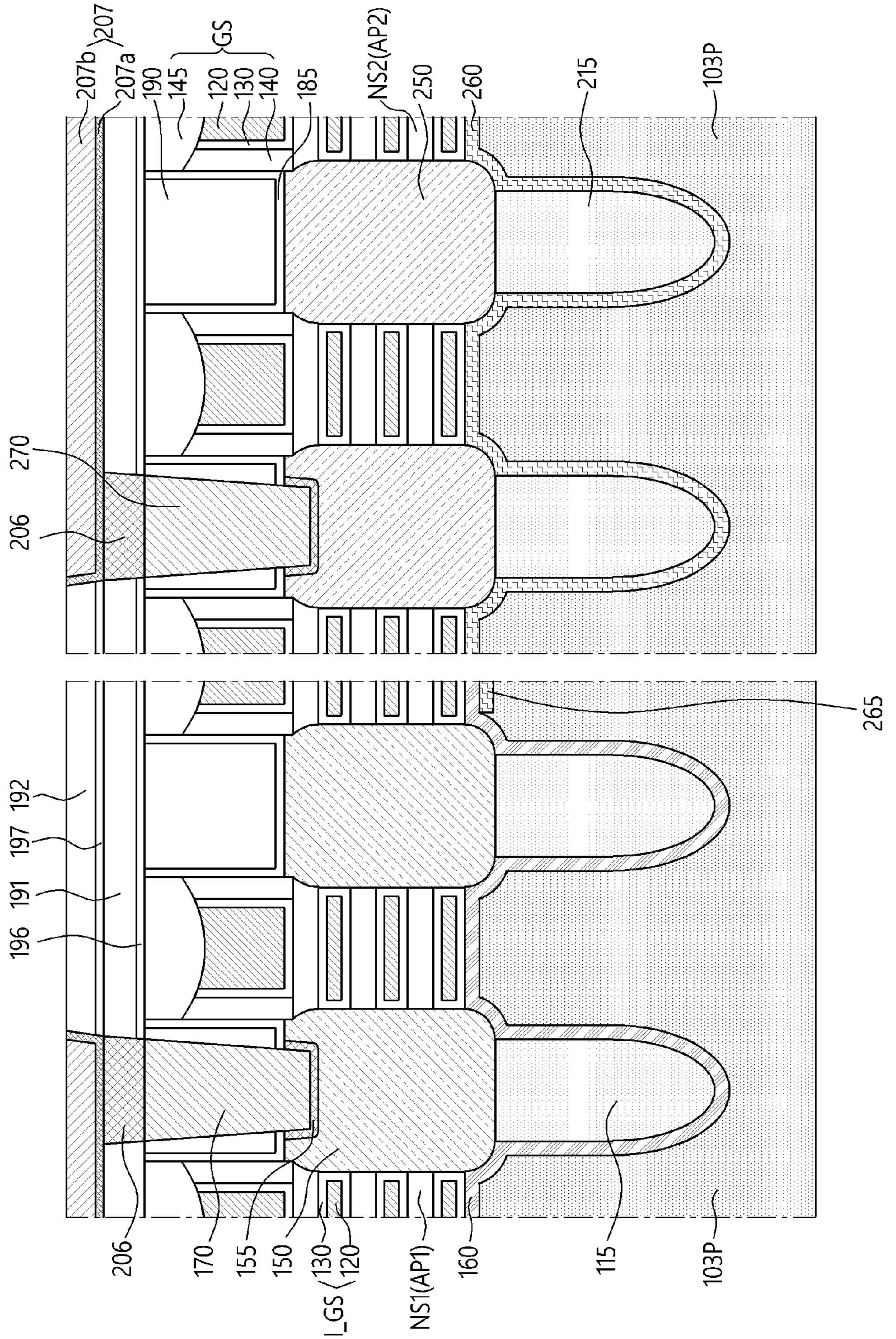

In FIG. 34, a third pre-back insulating pattern 103P is formed. For example, the third pre-back insulating pattern 103P may be formed under the first source/drain pattern 150 and the second source/drain pattern 250. The third pre-back insulating pattern 103P may cover the first liner 160 and the second liner 260, and may surround the first supporter 115 and the second supporter 215.

Figure 35:
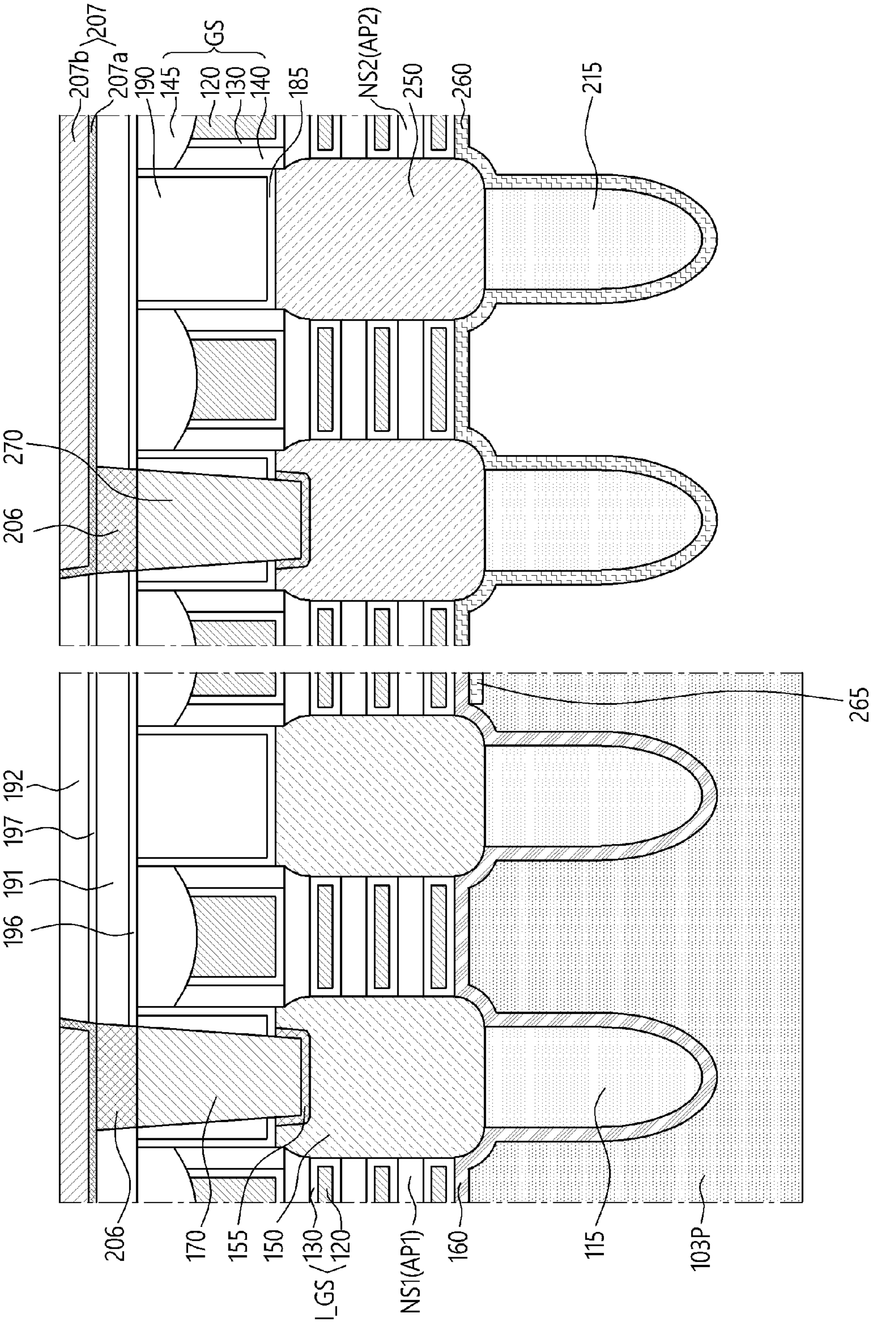

In FIG. 35, the third pre-back insulating pattern 103P formed under the second source/drain pattern 250 is removed. Accordingly, the second liner 260 may be exposed.

Figure 36:
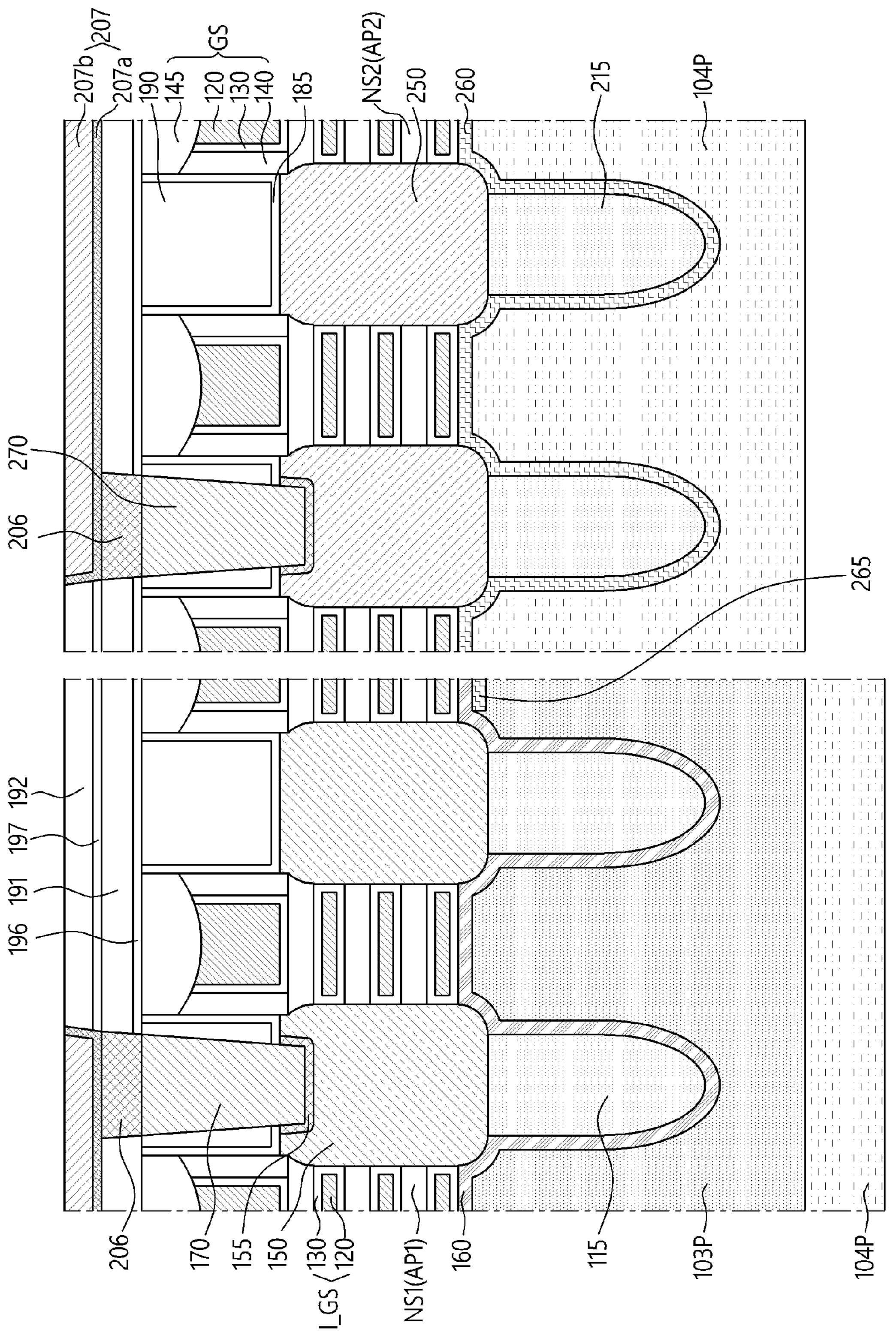

In FIG. 36, a fourth pre-back insulating pattern 104P is formed. For example, the fourth pre-back insulating pattern 104P may be formed under the second source/drain pattern 250 and may cover the lower surface of the third pre-back insulating pattern 103P. The fourth pre-back insulating pattern 104P may cover the second liner 260 and may surround the second supporter 215. The third pre-back insulating pattern 103P may contain silicon oxide having a tensile stress higher than that of the fourth pre-back insulating pattern 104P. The fourth pre-back insulating pattern 104P may contain silicon oxide having a compressive stress higher than that of the third pre-back insulating pattern 103P.

In some implementations, the environments in which the third pre-back insulating pattern 103P and the fourth pre-back insulating pattern 104P are formed may be different from each other. For example, the LF power level at which the third pre-back insulating pattern 103P is formed and the LF power level at which the fourth pre-back insulating pattern 104P is formed may be different from each other. The LF power level may be higher when the fourth pre-back insulating pattern 104P is formed than when the third pre-back insulating pattern 103P is formed.

For another example, the concentration of the processing gas provided when the third pre-back insulating pattern 103P is formed and the concentration of the processing gas provided when the fourth pre-back insulating pattern 104P is formed may be different from each other. The concentration of the processing gas containing hydrogen may be higher when the fourth pre-back insulating pattern 104P is formed than when the third pre-back insulating pattern 103P is formed.

Figure 37:
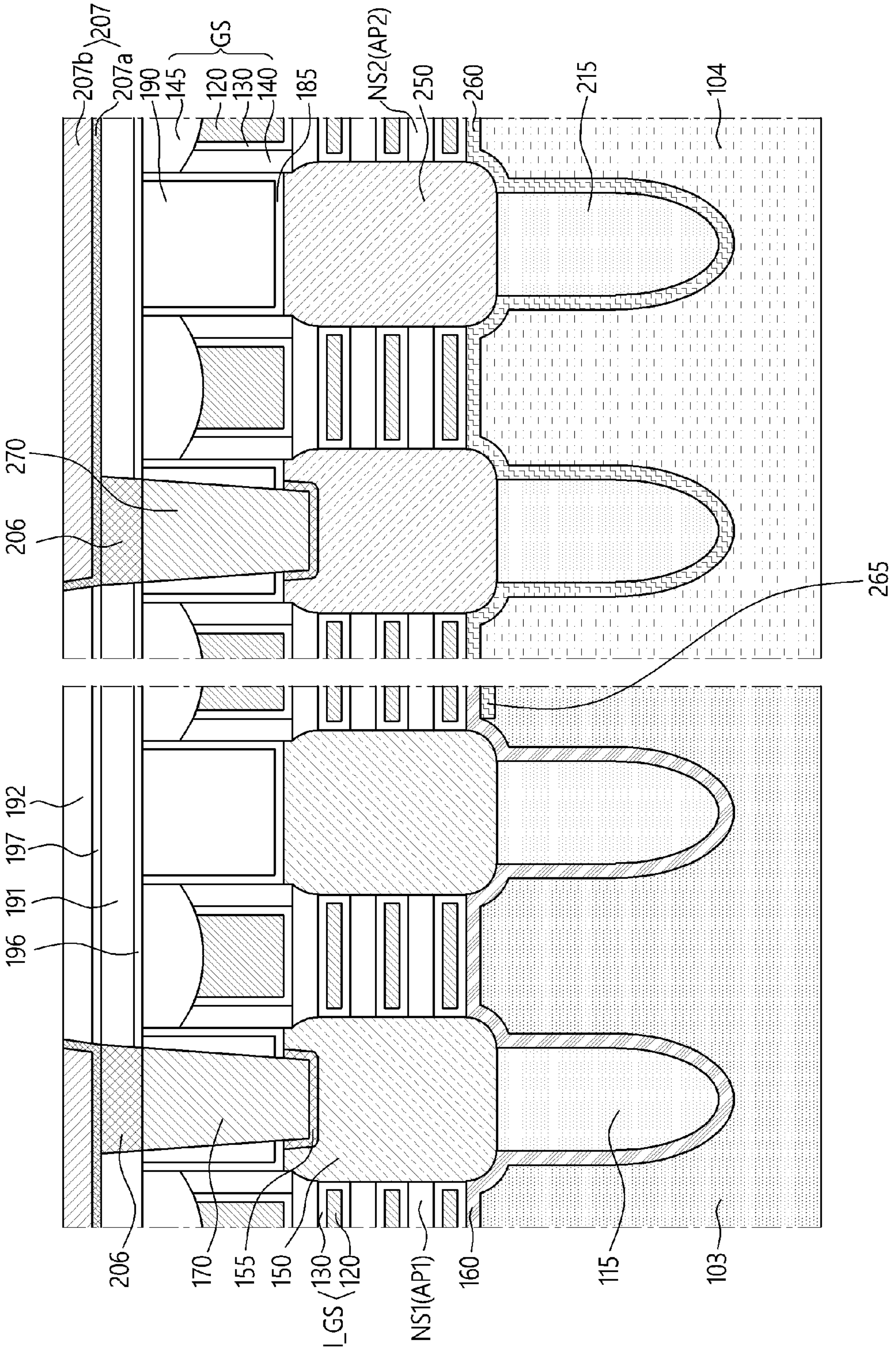

In FIG. 37, the third back insulating pattern 103 and the fourth back insulating pattern 104 are formed by partially removing the third pre-back insulating pattern 103P and the fourth pre-back insulating pattern 104P, respectively. The lower surface of the third back insulating pattern 103 and the lower surface of the fourth back insulating pattern 104 may be disposed on the same plane.

Figure 38:
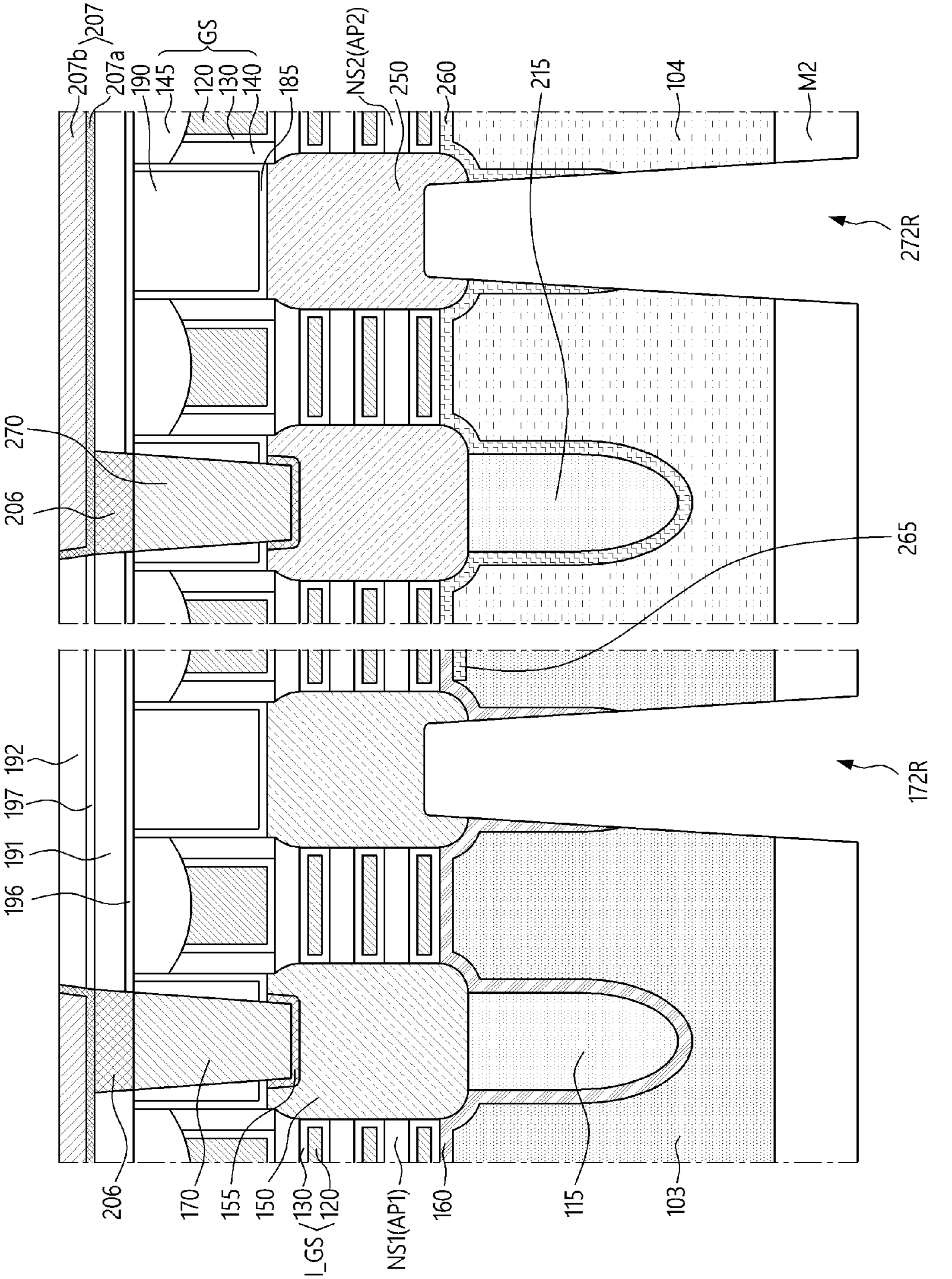

In FIG. 38, a first back source/drain contact recess 172R and a second back source/drain contact recess 272R are formed. The first back source/drain contact recess 172R and the second back source/drain contact recess 272R may be formed using a second mask M2 formed on the third back insulating pattern 103 and the fourth back insulating pattern 104.

The first back source/drain contact recess 172R may expose the first source/drain pattern 150. The first supporter 115 disposed under the first source/drain pattern 150 may be removed by the formation of the first back source/drain contact recess 172R. The first back source/drain contact recess 172R may penetrate the first liner 160. The second back source/drain contact recess 272R may expose the second source/drain pattern 250. The second supporter 215 disposed under the second source/drain pattern 250 may be removed by the formation of the second back source/drain contact recess 272R. The second back source/drain contact recess 272R may penetrate the second liner 260.

Figure 39:
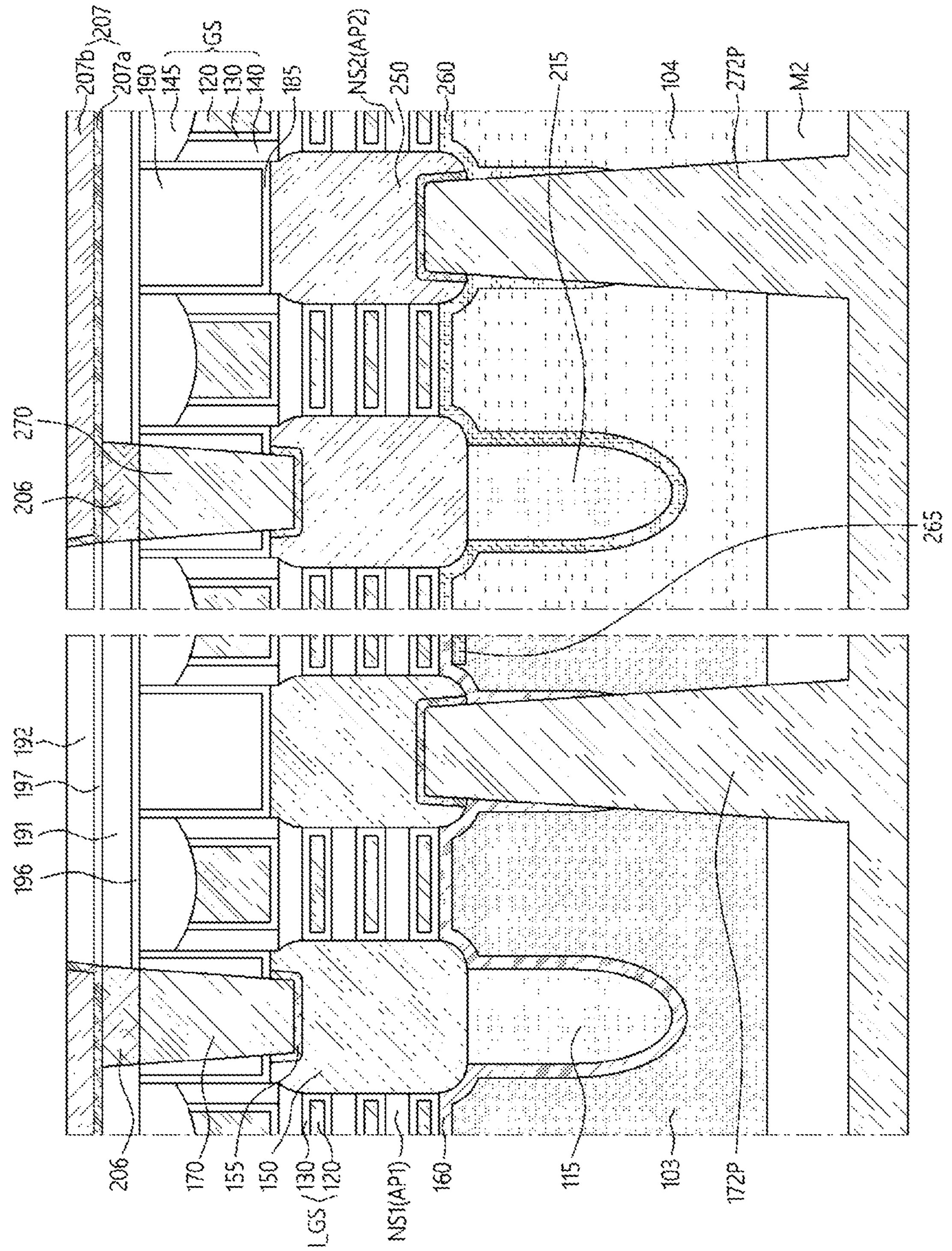

In FIG. 39, a first pre-back source/drain contact 172P and a second pre-back source/drain contact 272P are formed. The first pre-back source/drain contact 172P may fill the first back source/drain contact recess 172R (see FIG. 38). The second pre-back source/drain contact 272P may fill the second back source/drain contact recess 272R (see FIG. 38).

Next, referring to FIG. 16, the first back source/drain contact 172 and the second back source/drain contact 272 are formed by partially removing the first pre-back source/drain contact 172P and the second pre-back source/drain contact 272P until the third back insulating pattern 103 and the fourth back insulating pattern 104 are exposed. Then, the first back wiring line 50 connected to the first back source/drain contact 172 and the second back source/drain contact 272 is formed.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

What is claimed is:

1. A semiconductor device comprising:

a back insulating pattern comprising a first region and a second region, the back insulating pattern extending in a first direction;

a plurality of sheet patterns disposed on the back insulating pattern, the plurality of sheet patterns extending in the first direction;

a first source/drain pattern disposed on the first region of the back insulating pattern, the first source/drain pattern connected to the plurality of sheet patterns;

a second source/drain pattern disposed on the second region of the back insulating pattern, the second source/drain pattern connected to the plurality of sheet patterns;

a gate electrode extending in a second direction crossing the first direction, the gate electrode surrounding the plurality of sheet patterns;

a first back source/drain contact extending into the first region of the back insulating pattern, the first back source/drain contact connected to the first source/drain pattern; and a second back source/drain contact extending into the second region of the back insulating pattern, the second back source/drain contact connected to the second source/drain pattern, wherein the first source/drain pattern has N-type conductivity, wherein the second source/drain pattern has P-type conductivity, wherein the first region of the back insulating pattern contains oxide having a tensile stress higher than that of the second region, and wherein the second region of the back insulating pattern contains oxide having a compressive stress higher than that of the first region.

2. The semiconductor device of claim 1, wherein a lower surface of the first source/drain pattern is in contact with the back insulating pattern of the first region, and wherein a lower surface of the second source/drain pattern is in contact with the back insulating pattern of the second region.

3. The semiconductor device of claim 1, further comprising:

a first liner disposed on the back insulating pattern of the first region, the first liner disposed on a lower surface of the first source/drain pattern and extending in the first direction; and a second liner disposed on the back insulating pattern of the second region, the second liner disposed on a lower surface of the second source/drain pattern and extending in the first direction, wherein the first liner contains nitride having a tensile stress higher than a tensile stress of the second liner, and wherein the second liner contains nitride having a compressive stress higher than a compressive stress of the first liner.

4. The semiconductor device of claim 3, further comprising:

a first overlapping portion disposed on the first region of the back insulating pattern, the first overlapping portion covering a lower surface of a part of the first liner, wherein the first overlapping portion contains a same material as the second liner.

5. The semiconductor device of claim 3, further comprising:

a second overlapping portion disposed on the second region of the back insulating pattern, the second overlapping portion covering a lower surface of a part of the second liner, wherein the second overlapping portion contains a same material as the first liner.

6. The semiconductor device of claim 1, further comprising:

a third source/drain pattern disposed on the first region of the back insulating pattern, the third source/drain pattern connected to the plurality of sheet patterns;

a fourth source/drain pattern disposed on the second region of the back insulating pattern, the fourth source/drain pattern connected to the plurality of sheet patterns;

a first supporter disposed under the third source/drain pattern, the first supporter surrounded by the back insulating pattern; and a second supporter disposed under the fourth source/drain pattern, the second supporter surrounded by the back insulating pattern.

7. The semiconductor device of claim 6, wherein the first supporter and the second supporter contain silicon germanium.

8. The semiconductor device of claim 6, further comprising a first front source/drain contact disposed on the third source/drain pattern.

9. A semiconductor device comprising:

a first back insulating pattern extending in a first direction;

a second back insulating pattern spaced apart from the first back insulating pattern in a second direction crossing the first direction, the second back insulating pattern extending in the first direction;

a plurality of sheet patterns disposed on the first back insulating pattern and the second back insulating pattern, the plurality of sheet patterns extending in the first direction;

a first source/drain pattern disposed on the first back insulating pattern, the first source/drain pattern connected to the plurality of sheet patterns;

a second source/drain pattern disposed on the second back insulating pattern, the second source/drain pattern connected to the plurality of sheet patterns;

a first front source/drain contact disposed on the first source/drain pattern, the first front source/drain contact connected to the first source/drain pattern;

a second front source/drain contact disposed on the second source/drain pattern, the second front source/drain contact connected to the second source/drain pattern;

a first back interlayer insulating layer disposed under the first back insulating pattern and the second back insulating pattern;

a first buried conductive pattern extending into the first back interlayer insulating layer, the first buried conductive pattern connected to the first front source/drain contact;

a second buried conductive pattern extending into the first back interlayer insulating layer, the second buried conductive pattern connected to the second front source/drain contact;

a first contact connection via disposed between the first front source/drain contact and the first buried conductive pattern, the first contact connection via directly connected to the first front source/drain contact; and a second contact connection via disposed between the second front source/drain contact and the second buried conductive pattern, the second contact connection via directly connected to the second front source/drain contact, wherein the first source/drain pattern has N-type conductivity, wherein the second source/drain pattern has P-type conductivity, wherein the first back insulating pattern contains nitride having a tensile stress higher than a tensile stress of the second back insulating pattern, and wherein the second back insulating pattern contains nitride having a compressive stress higher than a compressive stress of the first back insulating pattern.

10. The semiconductor device of claim 9, wherein a lower surface of the first source/drain pattern is in contact with the first back insulating pattern, and wherein a lower surface of the second source/drain pattern is in contact with the second back insulating pattern.

11. The semiconductor device of claim 9, wherein an upper surface of the first buried conductive pattern is disposed on a same plane as the lower surface of the first source/drain pattern.

12. The semiconductor device of claim 9, wherein a lower surface of the first contact connection via is disposed on a same plane as the lower surface of the first source/drain pattern.

13. The semiconductor device of claim 9, further comprising:

a field insulating layer surrounding a side surface of the first back insulating pattern, wherein the first buried conductive pattern extends into the field insulating layer.

14. The semiconductor device of claim 9, further comprising:

a first etch stop layer extending along an upper surface of the first source/drain pattern; and a second etch stop layer extending along an upper surface of the second source/drain pattern, wherein the first etch stop layer contains nitride having a tensile stress higher than a tensile stress of the second etch stop layer, and wherein the second etch stop layer contains nitride having a compressive stress higher than a compressive stress of the first etch stop layer.

15. The semiconductor device of claim 9, comprising more than one of the first back insulating pattern as a plurality of first back insulating patterns, wherein the first buried conductive pattern is disposed between the plurality of first back insulating patterns.

16. The semiconductor device of claim 9, further comprising:

more than one of the first back insulating pattern as a plurality of first back insulating patterns, wherein the first buried conductive pattern comprises:

a first portion disposed between the first back insulating patterns, the first portion in contact with the first contact connection via; and a second portion disposed under the first portion, the second portion extending into the first back inter-layer insulating layer.

17. The semiconductor device of claim 9, further comprising:

a gate electrode extending in the second direction, the gate electrode surrounding the plurality of sheet patterns; and a gate insulating layer surrounding the gate electrode, wherein a lower surface of the gate insulating layer is in contact with the first back insulating pattern and the second back insulating pattern.

18. A semiconductor device comprising:

a first back insulating pattern extending in a first direction;

a plurality of first sheet patterns disposed on the first back insulating pattern, the plurality of first sheet patterns extending in the first direction;

a first source/drain pattern disposed on the first back insulating pattern, the first source/drain pattern connected to the plurality of first sheet patterns;

a second back insulating pattern extending in the first direction, the second back insulating pattern spaced apart from the first back insulating pattern;

a plurality of second sheet patterns disposed on the second back insulating pattern, the plurality of second sheet patterns extending in the first direction;

a second source/drain pattern disposed on the second back insulating pattern, the second source/drain pattern connected to the plurality of second sheet patterns;

a plurality of gate electrodes extending in a second direction crossing the first direction, the plurality of gate electrodes surrounding the plurality of first sheet patterns and the plurality of second sheet patterns;

a first power transmission pattern disposed under the first source/drain pattern, the first power transmission pattern electrically connected to the first source/drain pattern and increasing in width toward a bottom of the first power transmission pattern; and a second power transmission pattern disposed under the second source/drain pattern, the second power transmission pattern electrically connected to the second source/drain pattern and increasing in width toward a bottom of the second power transmission pattern, wherein the first source/drain pattern has N-type conductivity, wherein the second source/drain pattern has P-type conductivity, wherein the first back insulating pattern and the second back insulating pattern contain any one of silicon oxide and silicon nitride, wherein the first back insulating pattern contains oxide having a tensile stress higher than a tensile stress of the second back insulating pattern, and wherein the second back insulating pattern contains oxide having a compressive stress higher than a compressive stress of the first back insulating pattern.

19. The semiconductor device of claim 18, wherein the first power transmission pattern extends into the first back insulating pattern, wherein the first power transmission pattern is in direct contact with the first source/drain pattern, wherein the second power transmission pattern extends into the second back insulating pattern, and wherein the second power transmission pattern is in direct contact with the second source/drain pattern.

20. The semiconductor device of claim 18, further comprising:

a first front source/drain contact disposed on the first source/drain pattern, the first front source/drain contact connected to the first source/drain pattern;

a second front source/drain contact disposed on the second source/drain pattern, the second front source/drain contact connected to the second source/drain pattern;

a first contact connection via disposed between the first front source/drain contact and the first power transmission pattern, the first contact connection via directly connected to the first front source/drain contact;

a second contact connection via disposed between the second front source/drain contact and the second power transmission pattern, the second contact connection via directly connected to the second front source/drain contact; and a field insulating layer surrounding a side surface of the first back insulating pattern and a side surface of the second back insulating pattern, wherein the first power transmission pattern and the second power transmission pattern penetrate the field insulating layer.

* * * * *